US009196447B2

(12) United States Patent
Fomani et al.

(10) Patent No.: US 9,196,447 B2
(45) Date of Patent: Nov. 24, 2015

(54) SELF-ALIGNED GATED EMITTER TIP ARRAYS

(71) Applicant: Massachusetts Institutes of Technology, Cambridge, MA (US)

(72) Inventors: Arash Akhavan Fomani, Melrose, MA (US); Luis Fernando Velasquez-Garcia, Newton, MA (US); Akintunde Ibitayo Akinwande, Newton, MA (US)

(73) Assignee: Massachusetts Institutes of Technology, Cambridge, MA (US)

( * ) Notice: Subject to any disclaimer, the term of this patent is extended or adjusted under 35 U.S.C. 154(b) by 0 days.

(21) Appl. No.: 14/067,668

(22) Filed: Oct. 30, 2013

(65) Prior Publication Data

US 2014/0285084 A1    Sep. 25, 2014

Related U.S. Application Data

(60) Provisional application No. 61/733,180, filed on Dec. 4, 2012, provisional application No. 61/843,784, filed on Jul. 8, 2013, provisional application No. 61/843,805, filed on Jul. 8, 2013, provisional application No. 61/845,522, filed on Jul. 12, 2013.

(51) Int. Cl.
*H01J 9/02* (2006.01)
*H01J 1/304* (2006.01)
*H01L 21/00* (2006.01)

(52) U.S. Cl.
CPC ............. *H01J 9/025* (2013.01); *H01J 1/304* (2013.01); *H01L 21/00* (2013.01)

(58) Field of Classification Search
CPC ....... H01J 9/025; H01J 2329/00; H01J 1/304; H01J 2201/30426; H01J 2201/30446; H01J 2237/06341; B82Y 10/00; H01L 21/28273; Y10S 438/978

USPC ..................................................... 313/346 R
See application file for complete search history.

(56) References Cited

U.S. PATENT DOCUMENTS

| 4,008,412 A | 2/1977 | Yuito et al. |
| 5,199,917 A | 4/1993 | MacDonald et al. |
| 5,266,530 A | 11/1993 | Bagley et al. |
| 5,527,200 A | 6/1996 | Lee et al. |
| 5,627,427 A | 5/1997 | Das et al. |
| 5,647,785 A | 7/1997 | Jones et al. |

(Continued)

OTHER PUBLICATIONS

Guillorn, M.A. et al., "Self-aligned gated field emission devices using single carbon nanofiber cathodes", Applied Physics Letters, vol. 81, No. 19, Nov. 4, 2002, pp. 3660-3662.

(Continued)

*Primary Examiner* — Tracie Y Green
(74) *Attorney, Agent, or Firm* — McCarter & English, LLP

(57) ABSTRACT

Methods for fabrication of self-aligned gated tip arrays are described. The methods are performed on a multilayer structure that includes a substrate, an intermediate layer that includes a dielectric material disposed over at least a portion of the substrate, and at least one gate electrode layer disposed over at least a portion of the intermediate layer. The method includes forming a via through at least a portion of the at least one gate electrode layer. The via through the at least one gate electrode layer defines a gate aperture. The method also includes etching at least a portion of the intermediate layer proximate to the gate aperture such that an emitter structure at least partially surrounded by a trench is formed in the multilayer structure.

27 Claims, 46 Drawing Sheets

(56) References Cited

U.S. PATENT DOCUMENTS

| | | | |
|---|---|---|---|
| 5,653,619 | A | 8/1997 | Cloud et al. |
| 5,688,707 | A | 11/1997 | Lee et al. |
| 5,857,885 | A | 1/1999 | Laou et al. |
| 5,966,588 | A | 10/1999 | Ju et al. |
| 5,989,931 | A | 11/1999 | Ghodsian et al. |
| 6,069,018 | A | 5/2000 | Song et al. |
| 6,165,808 | A | 12/2000 | Zhang |
| 6,312,966 | B1 | 11/2001 | Tseng |
| 6,387,717 | B1 | 5/2002 | Blalock et al. |
| 6,394,871 | B2 | 5/2002 | Lee |
| 6,417,016 | B1 | 7/2002 | Gilton et al. |
| 6,444,401 | B1 | 9/2002 | Lee |
| 6,448,701 | B1 | 9/2002 | Hsu |
| 6,963,160 | B2 | 11/2005 | Schueller et al. |
| 7,259,051 | B2 | 8/2007 | Chen et al. |
| 8,198,106 | B2 | 6/2012 | Akinwande et al. |
| 9,053,890 | B2 * | 6/2015 | Sun et al. ............................ 1/1 |
| 2012/0156453 | A1 * | 6/2012 | Gonzalez et al. ............. 428/212 |

OTHER PUBLICATIONS

Ding, M. et al., "Highly Uniform and Low Turn-On Voltage Si Field Emitter Arrays Fabricated Using Chemical Mechanical Polishing," IEEE Electron Device Letters, vol. 21, No. 2, Feb. 2000, pp. 66-69.

Ding, M. et al., "Silicon Field Emission Arrays With Atomically Sharp Tips: Turn-On Voltage and the Effect of Tip Radius Distribution," IEEE Transactions on Electron Devices, vol. 49, No. 12, Dec. 2002, pp. 2333-2342.

Hong, Chin-Yin, et al., "Silicon metal-oxide-semiconductor field effect transistor/field emission array fabricated using chemical mechanical polishing," Journal of Vacuum Science & Technology B: Microelectronics and Nanometer Structures, vol. 21, No. 1, Jan./Feb. 2003, pp. 500-505.

International Search Report and Written Opinion, mailed Feb. 24, 2014 for PCT/US2013/067559, filed Oct. 30, 2013.

Pirio et al., "Fabrication and electrical characteristics of carbon nanotube field emission microcathodes with an integrated gate electrode", Nanotechnology vol. 13, p. 1-4 (2002).

Guillorn et al., "Fabrication of gated cathode structures using an in situ grown vertically aligned carbon nanofiber as a field emission element", J. Vac. Sci. Technol. vol. B 19, p. 573 (2001).

Guillorn et al., "Operation of a gated field emitter using an individual carbon nanofiber cathode", Appl. Phys. Lett. vol. 79, p. 3506 (2001).

Guillorn et al., "Microfabricated field emission devices using carbon nanofibers as cathode elements", J. Vac. Sci. Technol. vol. B 19, p. 2598 (2001).

* cited by examiner

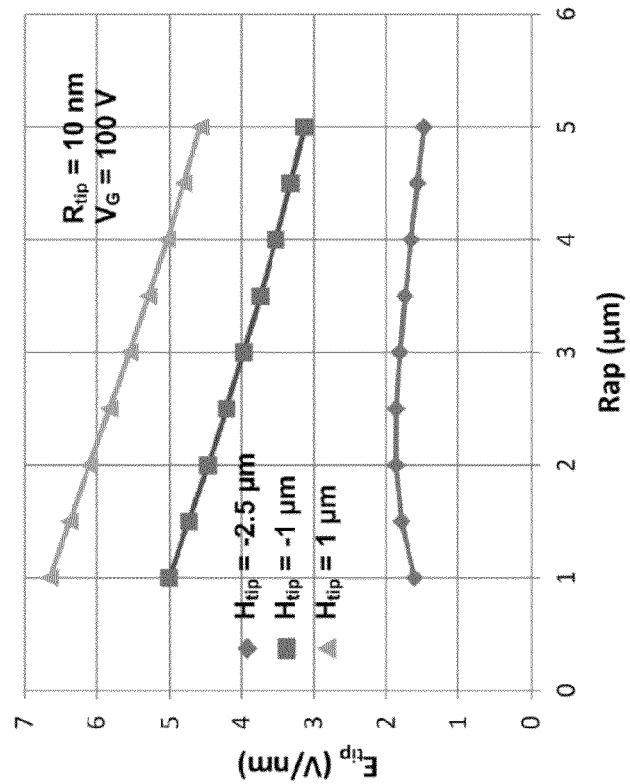
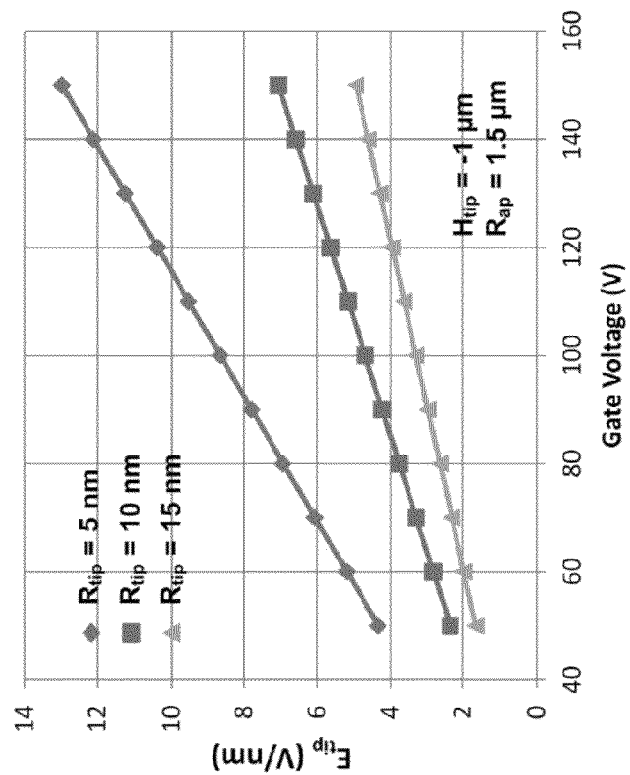
FIG. 4B
FIG. 4A

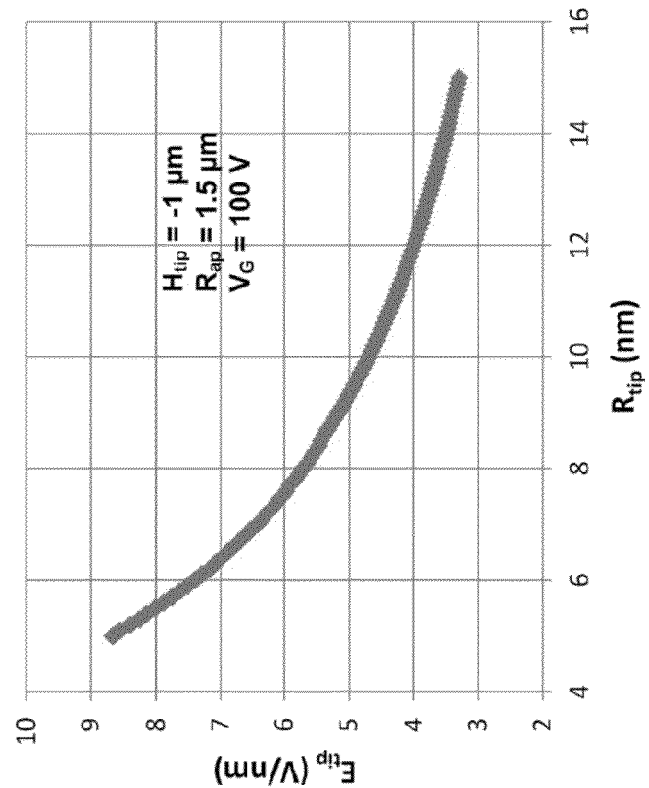
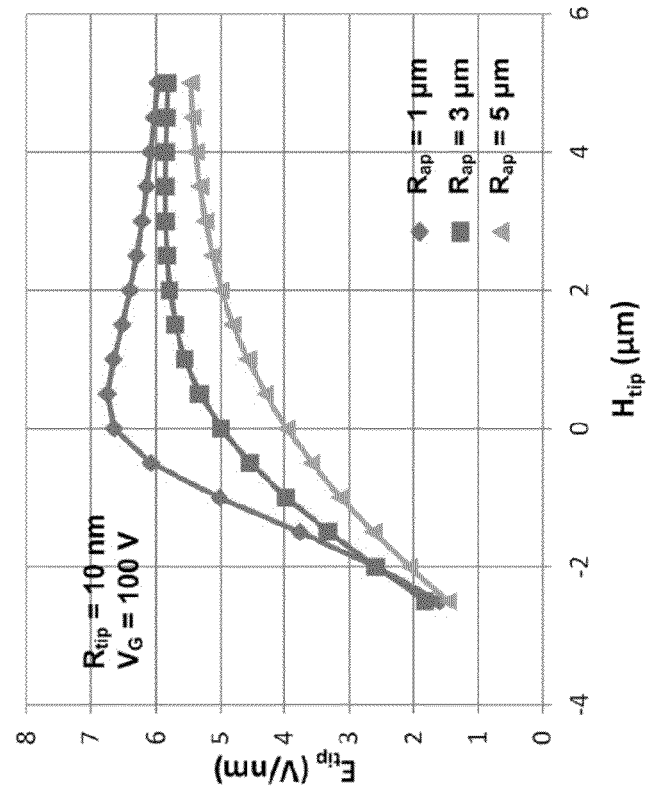
FIG. 4D
FIG. 4C

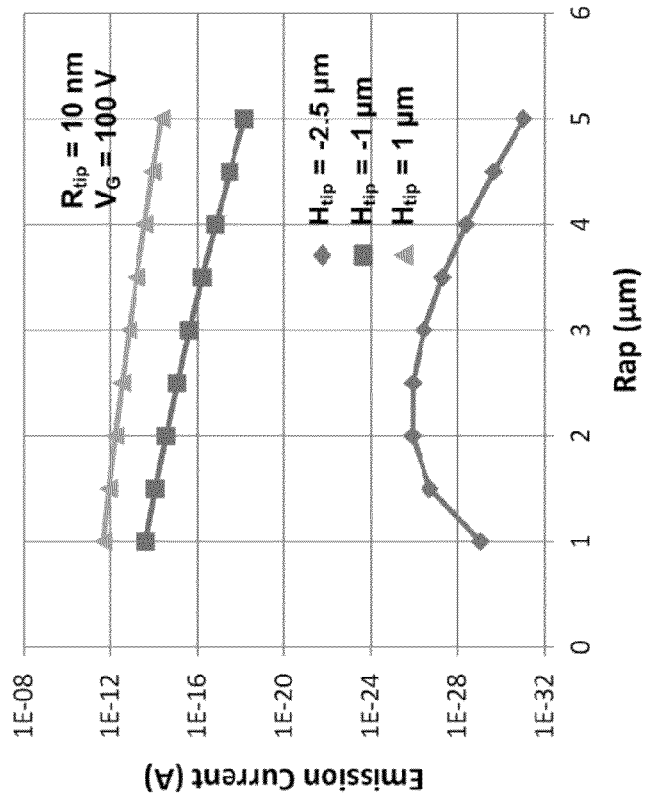
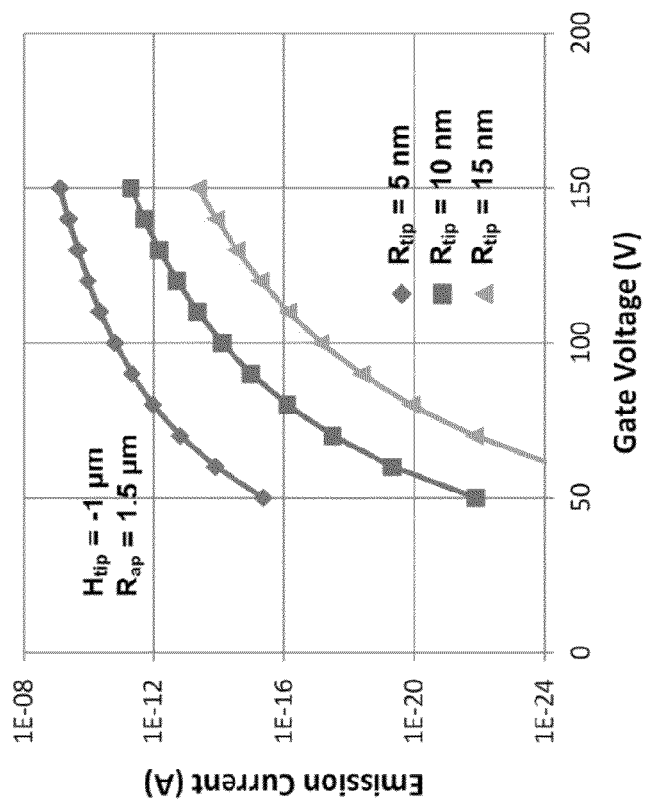
FIG. 5A
FIG. 5B

SELF-ALIGNED GATED EMITTER TIP ARRAYS

CROSS-REFERENCE TO RELATED APPLICATION

The present application claims a priority benefit to U.S. provisional application Ser. No. 61/733,180, filed Dec. 4, 2012, entitled "Self-Aligned Grated Tip Arrays for Efficient Ionization of Gasses and Electron Emission," U.S. provisional application Ser. No. 61/843,784, filed Jul. 8, 2013, entitled "Self-Aligned Gated Emitters Tips and Arrays Including Such Emitter Tips," U.S. provisional application Ser. No. 61/843,805, filed Jul. 8, 2013, entitled "Low-Voltage High-Pressure Field Ionizer for Portable Analytical Instruments," and U.S. provisional application Ser. No. 61/845,522, filed Jul. 12, 2013, entitled "Low-Voltage High-Pressure Field Ionizer for Portable Analytical Instruments," each of which is hereby incorporated by reference in its entirety, including drawings.

GOVERNMENT SUPPORT

This invention was made with government support under Grant No. W31P4Q-10-1-0005 awarded by the Army Aviation and Missile Command. The government has certain rights in the invention.

BACKGROUND

Gas ionizers are used in various analytical instruments such as mass spectrometers and ion beam microscopes. Additionally, field ion sources are employed in portable neutron generators for oil well logging and detection of shielded nuclear materials. Traditionally, gas ionizers generate ions by electron impact ionization, where high-energy electrons collide with neutral molecules to create ions by fragmentation. Currently, state-of-the-art gas ionizers utilize either thermionic cathodes or field emission cathodes as electron source for electron impact ionization. In thermionic emission, electrons are excited to vacuum level using thermal energy, and in field emission, electrons are extracted from the emitter in a field-assisted tunneling process. Therefore, thermionic cathodes may consume more power and have slower response times than field emission cathodes, although field emission cathodes may require higher voltages to operate than thermionic electron sources.

SUMMARY

The Inventors have recognized and appreciated that a method of producing self-aligned emitter tip arrays would be beneficial. The Inventors have also recognized that such a method can be implemented to provide electron impact ionizers and devices for generating ions by harnessing a field ionization phenomenon. In view of the foregoing, various embodiments are directed generally to methods for fabricating self-aligned emitter tip arrays, and apparatus and systems that include arrays of self-aligned emitter tips that are configured for such non-limiting implementations as electron impact ionizers and for generating ions based on a field ionization phenomenon.

In an example aspect, an example method is provided for forming an example self-aligned gated emitter cell using an example multilayer structure. The multilayer structure includes a substrate, an intermediate layer includes a dielectric material disposed over at least a portion of the substrate, and at least one gate electrode layer disposed over at least a portion of the intermediate layer. The example method includes forming a via through at least a portion of the at least one gate electrode layer, where the via through the at least one gate electrode layer defines a gate aperture, and etching at least a portion of the intermediate layer proximate to the gate aperture such that an emitter structure at least partially surrounded by a trench is formed in the multilayer structure.

In an example, the substrate includes a semiconductor, a III-V compound, a metal, or a dielectric material.

In various examples, the substrate includes silicon, germanium, gallium arsenide, gallium nitride, silicon carbide, an oxide of silicon, or a transition metal oxide.

In an example, the intermediate layer includes at least one post structure, where the at least one post structure is at least partially surrounded by the dielectric material.

In an example, the etching of the at least a portion of the intermediate layer can includes etching at least a portion of the at least one post structure, where each etched post structure forms the emitter structure. The intermediate layer may further include an etching barrier disposed over the post structure proximate the gate electrode layer, where the etching the at least the portion of the at least one post structure forms the emitter structure having a tip proximate to the etching barrier.

In an example, the at least one post structure and the substrate can be formed from the same material.

In another example, the method may further include, prior to etching the at least the portion of the intermediate layer proximate to the gate aperture, disposing a mask proximate to the gate electrode layer. The mask can be maintained in position during the etching of the at least the portion of the intermediate layer.

In an example, the intermediate layer can include at least one post structure at least partially surrounded by the dielectric material, where the at least one post structure has a principal dimension in a plane of the gate electrode layer, and where the mask includes an opening of a size larger than the principal dimension of the at least one post structure.

In an example, the gate electrode layer can include at least one layer of an electrically conductive material, where the electrically conductive material includes carbon, aluminum, silicon, germanium, gallium, indium, tin, a transition metal, a conductive metal oxide, or any combination thereof.

In an example, the transition metal can be gold, platinum copper, tantalum, tungsten, titanium, cobalt, chromium, silver, or nickel, or a binary or ternary combination thereof.

In an example, the gate electrode layer can further include at least one dielectric layer disposed between the at least one layer of the electrically conductive material and the intermediate layer.

In an example, the at least one dielectric layer can include silicon nitride.

In an example, the dielectric material can include an oxide or a nitride of aluminum, silicon, germanium, gallium, indium, tin, antimony, tellurium, bismuth, titanium, vanadium, chromium, manganese, cobalt, nickel, copper, zinc, zirconium, niobium, molybdenum, palladium, cadmium, hafnium, tantalum, or tungsten, or any combination thereof.

In an example, the method can further include depositing an electrically conductive coating over portions of the gate electrode layer and/or over portions of the emitter structure.

In another example aspect, at least one example self-aligned gated emitter cell is provided that is fabricated according to any of the methods described herein.

In another example aspect, an example self-aligned gated emitter array is provided that includes a plurality of the self-aligned gated emitter cells fabricated according to any of the methods described herein.

In another example aspect, an example method is provided for forming a self-aligned gated emitter cell using an example multilayer structure. The example multilayer structure includes a substrate, an intermediate layer, and at least one gate electrode layer disposed over at least a portion of the intermediate layer. The intermediate layer includes a dielectric material disposed over at least a portion of the substrate, and at least one post structure at least partially surrounded by the dielectric material. The example method includes forming a via through at least a portion of the at least one gate electrode layer, where the via through the at least one gate electrode layer defines a gate aperture, and etching at least a portion of the intermediate layer proximate to the gate aperture such that an emitter structure at least partially surrounded by a trench is formed in the multilayer structure.

In an example, the intermediate layer includes a plurality of post structures.

In an example, the etching the at least a portion of the intermediate layer includes etching at least a portion of the each of post structure of the plurality of post structures, where each etched post structure forms the emitter structure.

In another example aspect, an example self-aligned gated emitter cell is provided. The example self-aligned gated emitter cell includes a substrate, and an intermediate layer disposed over the substrate. The intermediate layer includes a dielectric material. The intermediate layer also includes a cavity, where an emitter having a tip is disposed in the cavity. At least one gate electrode layer is disposed over at least a portion of the intermediate layer, the least one gate electrode layer including a via formed therethrough and defining a gate aperture. At least a portion of the tip of the emitter extends into the gate aperture.

In an example, the substrate includes a semiconductor, a III-V compound, a metal, or a dielectric material.

In an example, the dielectric material includes an oxide or a nitride of aluminum, silicon, germanium, gallium, indium, tin, antimony, tellurium, bismuth, titanium, vanadium, chromium, manganese, cobalt, nickel, copper, zinc, zirconium, niobium, molybdenum, palladium, cadmium, hafnium, tantalum, or tungsten, or any combination thereof.

In an example, the emitter and the substrate are formed from the same material.

In an example, the gate electrode layer includes at least one layer of an electrically conductive material, where the electrically conductive material includes carbon, aluminum, silicon, germanium, gallium, indium, tin, a transition metal, a conductive metal oxide, or any combination thereof.

In an example, the gate electrode layer further includes at least one dielectric layer disposed between the at least one layer of the electrically conductive material and the intermediate layer.

In an example, the self-aligned gated emitter cell further includes an electrically conductive coating disposed over portions of the gate electrode layer and/or over portions of the emitter structure.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIGS. 4A-4D show example simulated electric field at the tip of the example self-aligned gated tip of FIG. 3A, as a function of (A) gate voltage, (B) radius of gate aperture, (C) height of the tip from gate plane, and (D) tip radius of curvature, according to principles of the present disclosure.

FIGS. 5A-5D show example computations of emission current versus (A) gate voltage, (B) radius of gate aperture, (C) height of the tip from gate plane, and (D) radius of curvature at the tip, according to principles of the present disclosure.

DETAILED DESCRIPTION

Figure 1A:
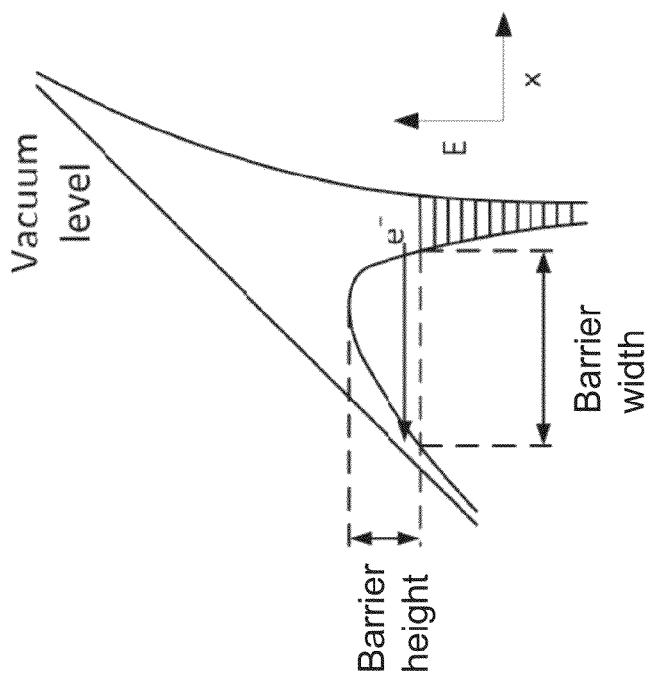
FIGS. 1A-1B show example potential-energy diagrams of a molecule when subjected to an intense electric field (A) in vacuum and (B) close to the surface of a metal, according to principles of the present disclosure.

Following below are more detailed descriptions of various concepts related to, and embodiments of, inventive methods, apparatus, and systems including self-aligned gated tip arrays and fabrication processes for producing large arrays of the gated tips. It should be appreciated that various concepts introduced above and discussed in greater detail below may be implemented in any of numerous ways, as the disclosed concepts are not limited to any particular manner of implementation. Examples of specific implementations and applications are provided primarily for illustrative purposes.

As used herein, the term "includes" means includes but is not limited to, the term "including" means including but not limited to. The term "based on" means based at least in part on.

With respect to substrates or other surfaces described herein in connection with various examples of the principles herein, any references to "top" surface and "bottom" surface are used primarily to indicate relative position, alignment and/or orientation of various elements/components with respect to the substrate and each other, and these terms do not necessarily indicate any particular frame of reference (e.g., a gravitational frame of reference). Thus, reference to a "bottom" of a substrate or a layer does not necessarily require that the indicated surface or layer be facing a ground surface. Similarly, terms such as "over," "under," "above," "beneath" and the like do not necessarily indicate any particular frame of reference, such as a gravitational frame of reference, but rather are used primarily to indicate relative position, alignment and/or orientation of various elements/components with respect to the substrate (or other surface) and each other. The terms "disposed on" and "disposed over" encompass the meaning of "embedded in," including "partially embedded in." In addition, reference to feature A being "disposed on," "disposed between," or "disposed over" feature B encompasses examples where feature A is in contact with feature B, as well as examples where other layers and/or other components are positioned between feature A and feature B.

Operation at mTorr-range pressures or higher generally may not be possible for many existing thermionic cathodes and field emission cathodes. In the case of thermionic cathodes, the hot surface that emits electrons can degrade due to reaction with surrounding gas molecules, including oxygen. In field emission cathodes, the field emitters can be damaged quickly due to collision with back-streaming positive ions. The inability of these cathode technologies to operate at high pressures can make them less desirable for implementing electron impact ionization-based portable analytical instrumentation, since the size and capacity of the pump required to create a suitable vacuum level for operation generally increases the volume and weight of the system and consumes large amounts of power. In an electron impact ionization-based gas ionizer, the neutral molecules, including complex long-chain structures, e.g., organic compounds, can be fragmented due to collision with high energy ions. As a result, two analytes could have very similar electron impact ionization spectra despite having very different chemical composition and structure.

Systems, methods and apparatus according to the principles described herein can be implemented as electron impact ionizers. Systems, methods and apparatus according to the principles described herein also can be implemented to generate ions by harnessing the field ionization phenomenon. In field ionization, electrons directly tunnel from the gas molecules due to the high electric field surrounding the positively biased tip. As a result, fragmentation of gas molecules can be minimized and soft ionization of large molecules and organic compounds becomes more feasible. The systems, methods and apparatus according to the principles described herein provide additional capabilities, as they can be implemented to provide devices configured for ionization of gases using several orthogonal methods, including electron impact ionization and field ionization.

In addition, field ionizers based on the self-aligned gated tip arrays described herein can be configured to operate at high pressures. The produced ions are repelled by the tips of the field ionizer, which are biased at a positive voltage for field ionization of the gas molecules. Since the tips are positively biased, the generated electric field surrounding the tips applies a repulsive force to the positively charged ions. This can prevent the positively charged ions from colliding with the tips. Despite the improved reliability at higher pressures, the electric field required for field ionization generally can be higher than the field required for electron emission. Consequently, larger voltages may be needed for operation. This can adversely impact the reliability and long-term stability of the field ionizers, e.g., because of the faster degradation rates of dielectrics at higher fields.

Systems, methods and apparatus according to the principles described herein can be implemented large arrays of gated emitter tips. As a non-limiting example, the arrays can include an many as about 320,000 tips in an area of about 0.32 cm². Furthermore, systems, methods and apparatus according to the principles described herein can be configured for operation at higher pressures. As a non-limiting example, a system, method or apparatus can be configured for operation at 10-Torr levels for field ionization of gases.

A non-limiting example system, method and apparatus herein can be implemented to provide new device architectures with a self-aligned gated structure, nanometer scale tips, and a thick gate dielectric stack. The new device architectures exhibit improved device reliability based on reduced ionization voltages and electric field strength in the gate dielectric.

A non-limiting example system, method and apparatus herein provides a high-yield method for fabrication of large arrays of self-aligned gated emitter tips that is robust to processing variations. The arrays of gated emitter tips can be configured as field ionizers. The example arrays of gated emitter tips produce stable field ionization currents in the nano-ampere-range at bias voltages below about 200 V. The field ionizers based on the example arrays of gated emitter tips also can be configured for ionizing helium, which is the analyte with the highest ionization potential.

Systems, methods and apparatus according to the principles described herein can be also used as reliable high-current electron sources in many products, including electronic microscopes, microwave power amplifiers, electron-beam lithography systems, and x-ray generators. In most applications, high emission current is required to enhance the signal-to noise ratio or to increase the output power. Low-voltage operation is also highly desirable to ensure long lifetime. Field emitters can produce a modest amount of current before burn-out. Hence, for higher emission current at a constant emission voltage, large array sizes are needed. Existing methods for fabricating large arrays of field emitters can require tight control of the processing conditions and high-quality dielectric layers free of defects to prevent failure or severe sub-utilization of the entire array. An example fabrication method according to the principles described herein is suitable for large-area production, offers high yield of fabrication, and has a lower sensitivity to processing conditions. For example, the arrays of self-aligned gated emitter tips that are fabricated according to the principles described herein demonstrate electron emission at voltages as low as about 40V, with field intensity lower than 15 V/μm inside the gate dielectric, very high transmission through the gate, and a high degree of reliability due to the self-aligned gated structure of the device, nanometer scale tips, and the thick dielectric stack for the gate insulator.

Field ionization refers to a physical phenomenon in which an electron tunnels out of a molecule due to application of a high electric field. When a gas molecule is exposed to a large electric field, the potential barrier seen by electrons is deformed. This decreases the width and height of the potential barrier to vacuum level when the ionization occurs in free space or to the Fermi level of an adjacent electrode when ionization happens in close vicinity to a metal or semiconductor surface. If the field intensity is sufficiently high, the height and width of the potential barrier is decreased to the extent that an electron can tunnel out of the molecule, leaving behind a positively charged ion.

Figure 1B:
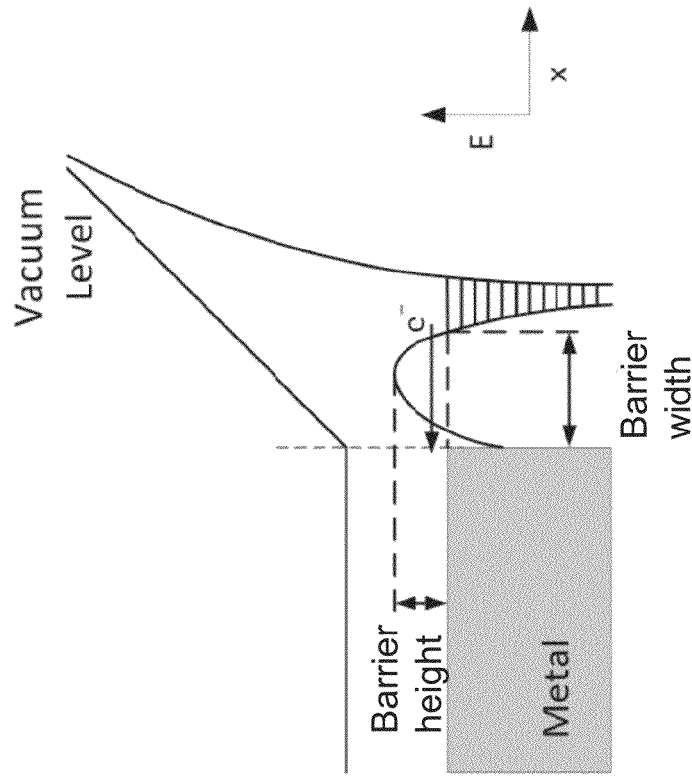

FIGS. 1A and 1B illustrate an example simplified potential-energy diagram of a molecule subjected to an intense electric field, when the field ionization occurs in vacuum or adjacent to a metal surface. FIG. 1A shows the potential-energy diagram of a molecule in vacuum, including the barrier height, barrier width, and vacuum level. FIG. 1B shows the results close to the surface of a metal, including the barrier height, barrier width, and vacuum level. Field ionization can occur by the tunneling of an electron out of the molecule to the vacuum or into the metal.

Figure 2:
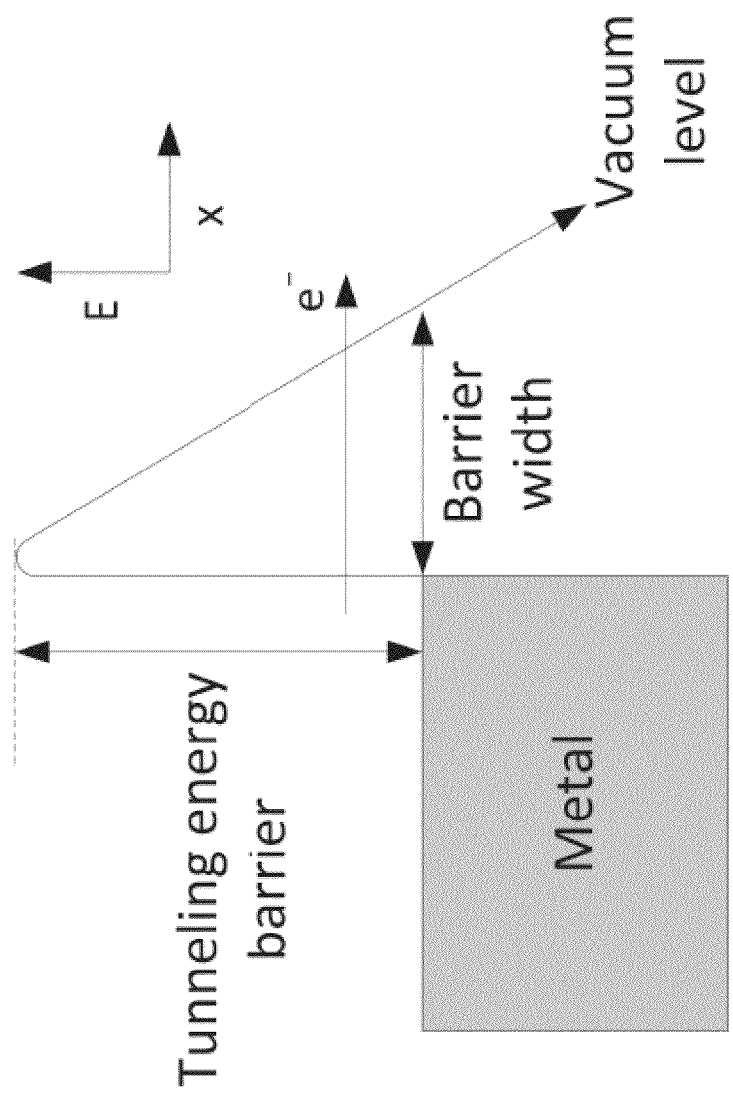
FIG. 2 shows an example band diagram at the tip of an example field emitter, according to principles of the present disclosure.

In field emission, electrons tunnel out of the surface of a material due to application of a high electric field that bends the vacuum level and decreases the width of the energy barrier. FIG. 2 illustrates a simplified energy band diagram in the region of the tip of an emitter, including the tunneling energy barrier, barrier width and vacuum level. As shown in FIG. 2, the direction of the field in field emission is opposite to the field during field ionization (FIGS. 1A and 1B), since the tunneling direction of the electron is reversed.

Figure 3A:
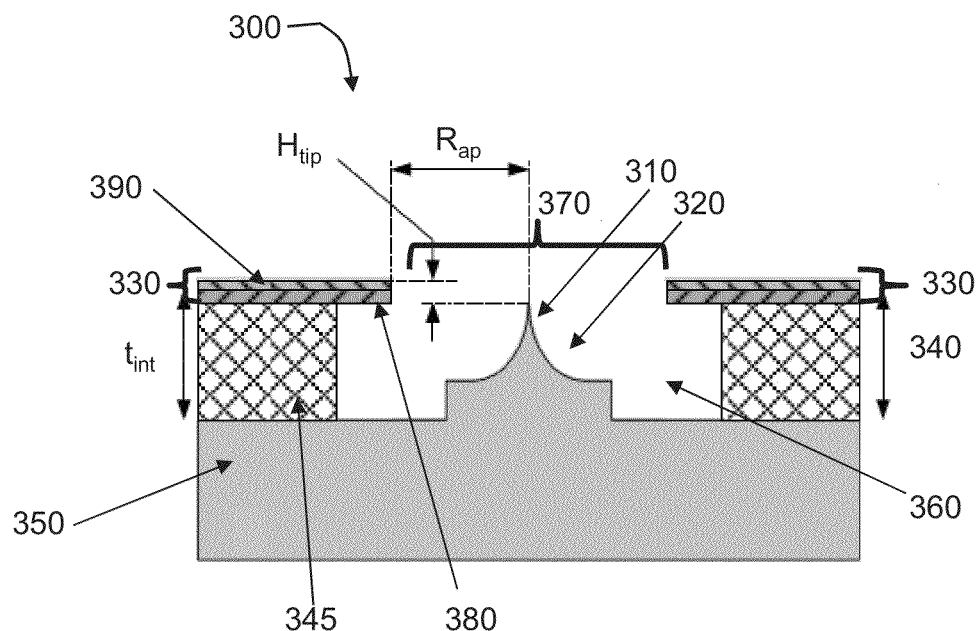
FIG. 3A shows a schematic of an example self-aligned gated tip, according to principles of the present disclosure.

FIG. 3A illustrates an example field emission/field ionization diode 300 according to the principles described herein. The example field emission/field ionization diode 300 is configured as a tip 310 of an emitter 320 surrounded by a gate electrode layer 330. In operation for electron emission, the tip 310 is negatively biased with respect to the gate electrode layer 330. In operation for field ionization, the tip 310 is at a higher potential with respect to the gate electrode layer 330. The example field emission/field ionization diode 300 is formed with an intermediate layer 340 disposed over a substrate 350. The intermediate layer 340 includes a dielectric material layer 355 and a cavity 360 formed in the intermediate layer 340. The gate electrode layer 330 is disposed over at least a portion of the intermediate layer 340. A via 370 formed through the gate electrode layer 330 defines a gate aperture.

The gate aperture is shown in FIG. 3A as having lateral dimension $R_{ap}$. As non-limiting examples, lateral dimension $R_{ap}$ can have dimensions on the order of about 0.75 µm, about 1.00 µm, about 1.25 µm, about 1.50 µm, about 1.75 µm, or about 2.00 µm or more. As shown in FIG. 3A, the tip 310 can be disposed at a tip distance $H_{tip}$ below the top plane of the gate electrode layer 330 (indicated herein using a negative value of distance). In other examples, the tip 310 can be disposed at a tip distance $H_{tip}$ about the top plane of the gate electrode layer 330 (indicated herein using a positive value of distance). As non-limiting examples, distance $H_{tip}$ can be disposed above (+ values) or below (− values) the gate electrode at dimensions on the order of about ±0.20 µm, about ±0.35 µm, about ±0.50 µm, about ±0.70 µm, about ±0.85 µm, or about ±1.00 µm or more. As non-limiting examples, the tip 310 can be disposed at a tip distance $H_{tip}$ below the top plane of the gate electrode layer 330. As non-limiting examples, intermediate layer 340 can have a thickness $t_{int}$ on the order of about 0.25 µm, about 0.50 µm, about 0.75 µm, about 1.00 µm, about 1.25 µm, about 1.50 µm, about 1.75 µm, or about 2.00 µm or more. In an example, the intermediate layer 340 can be configured to have a thickness of about 0.50 µm or greater, to improve reliability of the resultant example device including the self-aligned gated tip arrays.

In various example aspects, the tip 310 and/or emitter 320 can be formed from a conductive material, a dielectric material, or a semiconductor material. For example, the emitter 320 can be based on a metal, such as but not limited to, gold, platinum copper, tantalum, tin, tungsten, titanium, tungsten, cobalt, chromium, silver, nickel or aluminum, or a binary or ternary system of any of these materials. In another example, emitter 320 can be based on a semiconductor material, such as but not limited to silicon, germanium, carbon, a III-IV semiconductor system, or other semiconductor alloy system, or any combination of these semiconductor materials. conductive metal, a conductive metal oxide, or a doped semiconductor material. Non-limiting examples of III-IV semiconductor systems or semiconductor alloy systems include but are not limited to GaAs, InP, InAs, InSb, InGaAs, AlGaAs, InGaP, AlInAs, GaAsSb, AlGaP, CdZnTe, AlGaN, or any combination thereof. In various examples, the tip 310 and/or emitter 320 can be formed from molybdenum, tungsten, Si (including amorphous silicon or polycrystalline silicon), tantalum, GaAs, GaN, or diamond.

As shown in the example of FIG. 3A, the gate electrode layer 330 can include at least two layers, a dielectric layer 380 disposed over the intermediate layer 340 and a conductive layer 390 disposed over the dielectric layer 380. Conductive layer 390 can be formed from, as non-limiting examples, a conductive metal, a conductive metal oxide, or a doped semiconductor material. In some examples, conductive layer 390 can be formed as a singly layer, a multi-layer, or a composite of any combination of the conductive metal, the conductive metal oxide, and/or the doped semiconductor material. For example, the conductive layer 390 can be based on gold, platinum copper, tantalum, tin, tungsten, titanium, tungsten, cobalt, chromium, silver, nickel or aluminum, or a binary or ternary system of any of these conductive materials. In another example, conductive layer 390 can be based on a doped semiconductor material, such as but not limited to doped forms of amorphous silicon, poly-crystalline silicon, germanium, a carbon-based conductor, a III-IV semiconductor system, or other semiconductor alloy system, or any combination of these doped semiconductor materials. Non-limiting examples of III-IV semiconductor systems or semiconductor alloy systems include but are not limited to GaAs, InP, InAs, InSb, InGaAs, AlGaAs, InGaP, AlInAs, GaAsSb, AlGaP, CdZnTe, AlGaN, or any combination thereof. For example, the conductive layer 390 can be formed from a heavily n-doped poly-crystalline silicon.

In various example aspects, the dielectric layer 380 can include an oxide or a nitride of aluminum, silicon, germanium, gallium, indium, tin, antimony, tellurium, bismuth, titanium, vanadium, chromium, manganese, cobalt, nickel, copper, zinc, zirconium, niobium, molybdenum, palladium, cadmium, hafnium, tantalum, or tungsten, or any combination thereof. For example, the dielectric layer 380 can be formed from silicon nitride. In some examples, dielectric layer 380 can be formed as a singly layer, a multi-layer, or a composite of any combination of these materials.

In an example, a portion 345 of the intermediate layer 340 can be formed from a dielectric material. As non-limiting examples, the dielectric material can include an oxide or a nitride of aluminum, silicon, germanium, gallium, indium, tin, antimony, tellurium, bismuth, titanium, vanadium, chromium, manganese, cobalt, nickel, copper, zinc, zirconium, niobium, molybdenum, palladium, cadmium, hafnium, tantalum, or tungsten, or any combination thereof. For example, the dielectric material can be formed from a silicon nitride dielectric and/or a silicon oxide dielectric.

Substrate 350 can be formed from, as non-limiting examples, a conductive material, a dielectric material, or a semiconductor material. For example, the substrate 350 can be based on a conductive material formed from a metal, such as but not limited to, gold, platinum copper, tantalum, tin, tungsten, titanium, tungsten, cobalt, chromium, silver, nickel or aluminum, or a binary or ternary system of any of these materials. In another example, substrate 350 can be based on a semiconductor material, such as but not limited to silicon, germanium, carbon, a III-IV semiconductor system, or other semiconductor alloy system, or any combination of these semiconductor materials. In an example, the substrate 350 can be based on any of the dielectric materials described herein.

In any example according to the principle described herein, the emitter 320 can be formed from the same material as the substrate 350. In an example where the substrate 350 is formed from a dielectric material or a semiconductor material that is poorly electrically conducting, the emitter 320 may be coated with an electrically conductive material to provide the tip 310 (such as by evaporation, deposition, sputtering, or any other applicable technique in the art). Such an electrically conductive coating material can be formed from any of the conductive materials described herein or any other conductive material in the art, including a metal, a conductive metal oxide, quantum dots, a semiconductor (including a doped semiconductor material), diamond, or other conductive carbon-based material (including carbon fibers, nanofibers, nanotubes, nanohorns, and nanoribbons).

In other examples according to the principle described herein, the emitter 320 can be formed from a different material than that of the substrate 350.

A sharp emitter tip and a gate electrode disposed at close proximity to the emitter tip can provide devices that achieve field ionization or field emission at low voltages. This can be advantageous for field ionization, because the ionization potential of most gases (10 eV-25 eV) is significantly higher than the work function of metals and semiconductors (<6 eV). The self-aligned gated tips according to the principles described herein are formed from gate electrodes located symmetrically around the emitter, to avoid off-axis electron emission or field ionization. It also can ensure that the generated ions or emitted electrons are not intercepted by the gate, i.e., the field lines at the center of the tip, where the field and tunneling probability is maximum, do not terminate at the gate electrode. This can have a greater effect on electron emission due to lighter mass of electrons with respect to ions.

Figure 3B:
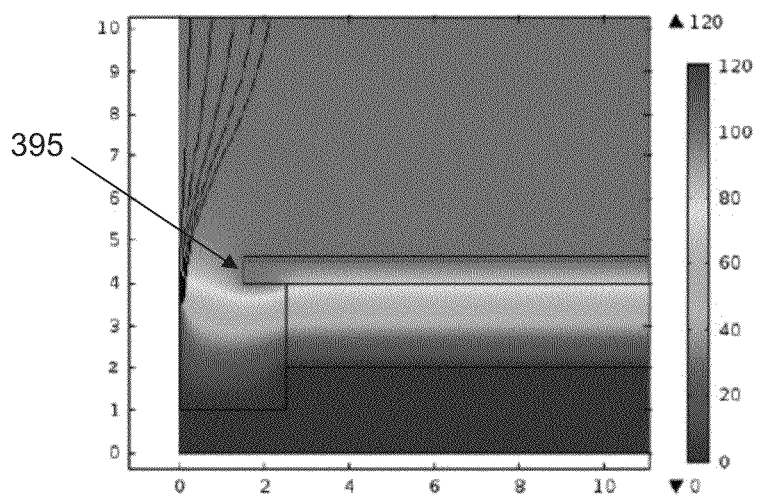
FIG. 3B shows an example simulated electric potential and field lines for the example self-aligned gated tip of FIG. 3A, according to principles of the present disclosure.
Figure 5D:
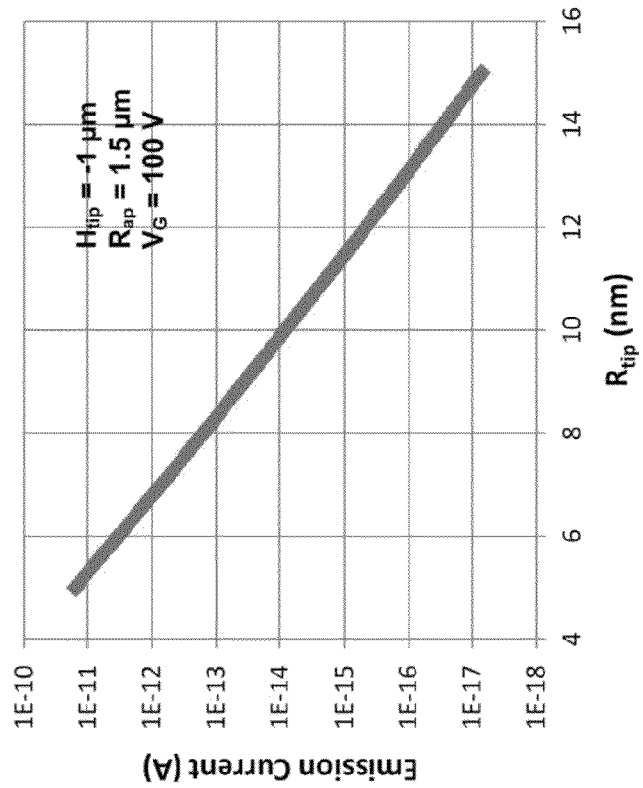
Figure 5C:
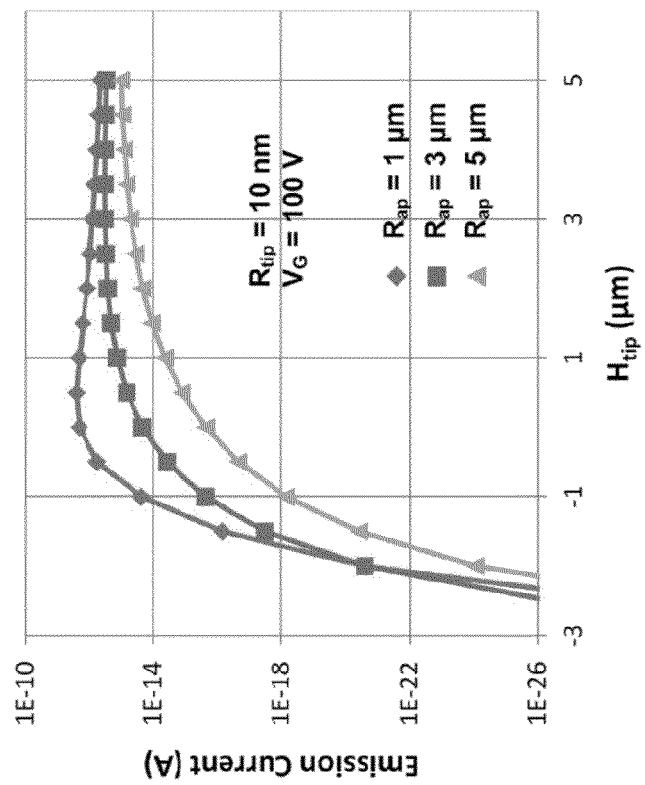
Figure 5F:
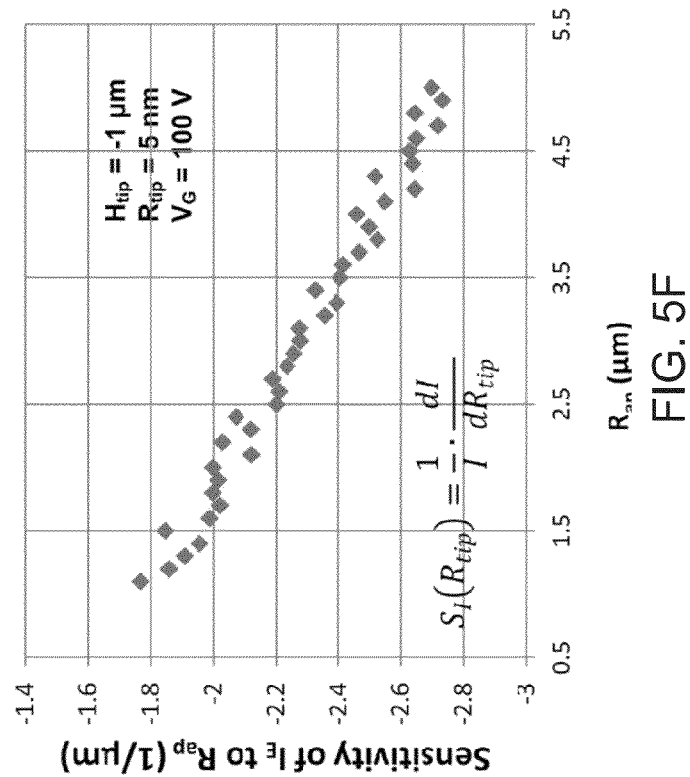
FIGS. 5E-5H show example computations of the emission current sensitivity to changes in (E) gate voltage, (F) radius of gate aperture, (G) height of the tip from gate plane and (H) radius of tip curvature, according to principles of the present disclosure.
Figure 5E:
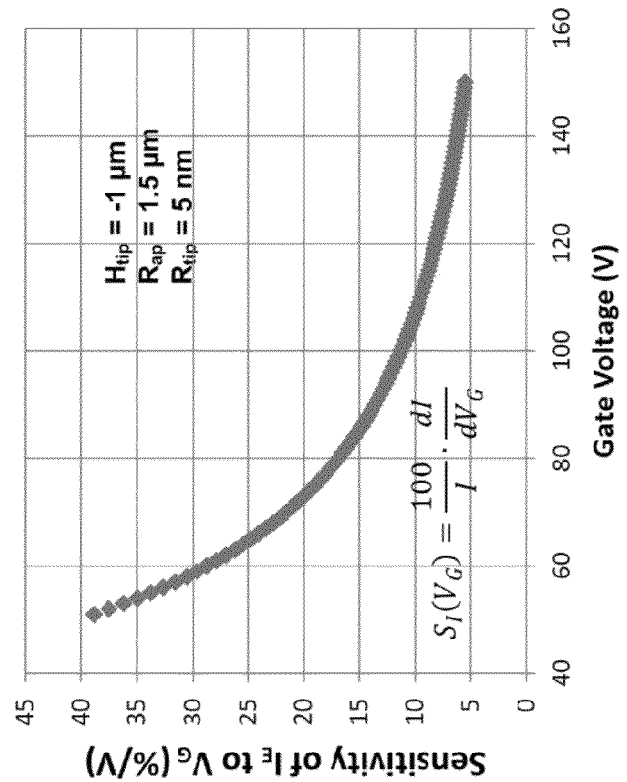
Figure 5H:
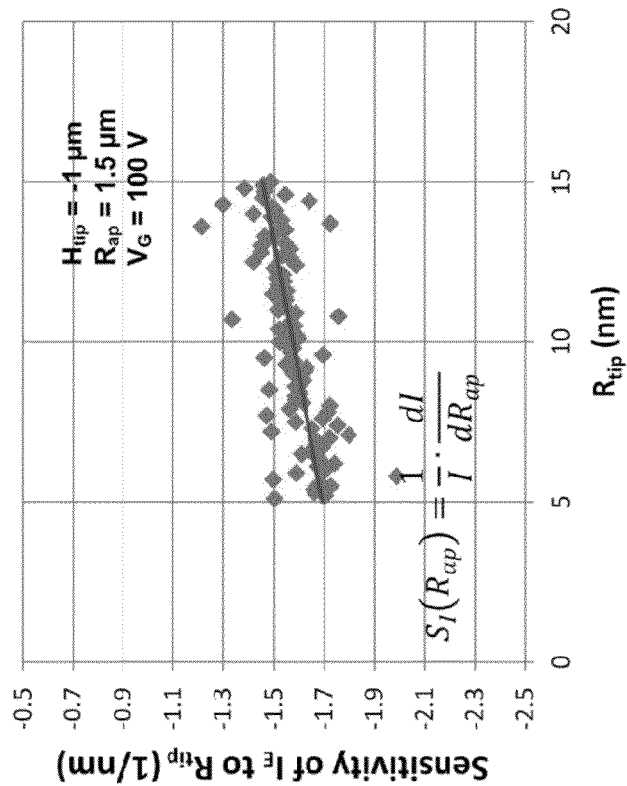
Figure 5G:
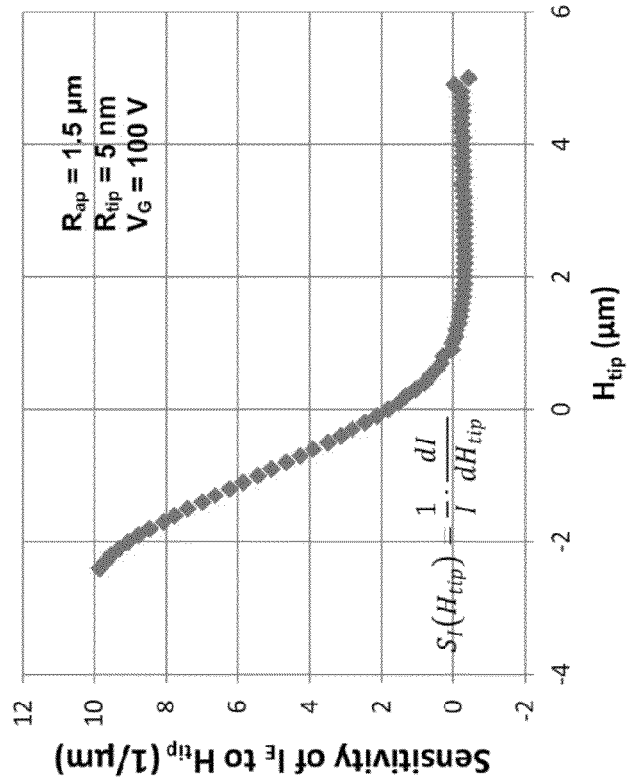

FIG. 3B shows simulation results of the simulation of electric potential and electric field lines in the region of a gate electrode 395 for the non-limiting example device having a structure as shown in FIG. 3B.

FIGS. 4A-4D show plots of computations of values of the electric field at the tip ($E_{tip}$) of the emitter for simulations of devices. In FIG. 4A, the values of $E_{tip}$ are plotted as a function of gate voltage (V) for various values of emitter tip radius ($R_{tip}$) for an example device with aperture lateral dimension ($R_{ap}$) of about 1.5 microns and a tip distance ($H_{tip}$) of about −1.0 microns (i.e., about 1.0 microns below the gate plane). In various examples according to the principles described herein, the emitter tip can have a radius ($R_{tip}$) of about 1.5 nm, about 2.5 nm, about 3.5 nm, about 5.0 nm, about 7.5 nm, about 10.0 nm, about 12.5 nm, about 15.0 nm. In the example devices of FIG. 4A, the emitters have emitter tip radii ($R_{tip}$) of about 5.0 nm, about 10.0 nm, or about 15.0 nm. As shown in FIG. 4A, the sharper tips (e.g., the tip having $R_{tip}$ about 5 nm) generate higher $E_{tip}$ for a given gate voltage. In FIG. 4B, the values of $E_{tip}$ are plotted as a function of aperture lateral dimension ($R_{ap}$) for various values of tip distance ($H_{tip}$) of about −2.5 μm, about −1.0 μm, or about 1.0 μm, for an example device with tip radius ($R_{tip}$) of about 10.0 nm and a gate voltage (V) of about 100 V. In various examples according to the principles described herein, the emitter tip can be disposed at a tip distance ($H_{tip}$) above (+) or below (−) the gate electrode at about ±0.5 μm, about ±1.0 μm, about ±1.5 μm, about ±2.5 μm, about ±7.5 about ±10.0 μm or more. In the example devices of FIG. 4B, the emitter tips disposed at a tip distance ($H_{tip}$) of about −2.5 μm generate lower $E_{tip}$ for a given aperture lateral dimension ($R_{ap}$). In FIG. 4C, the values of $E_{tip}$ are plotted as a function of tip distance ($H_{tip}$) for various values of aperture lateral dimension ($R_{ap}$) of about 1.0 μm, about 3.0 μm, or about 5.0 μm, for an example device with tip radius ($R_{tip}$) of about 10.0 nm and a gate voltage (V) of about 100 V. In various examples according to the principles described herein, the gate aperture can be fabricated with an aperture lateral dimension ($R_{ap}$) of about 0.5 μm, about 1.0 μm, about 1.5 μm, about 2.0 μm, about 3.0 μm, about 5.0 μm, about 7.5 μm, or about 10.0 μm, or more. In the example devices of FIG. 4C, the emitter tips disposed at a tip distance ($H_{tip}$) of about 1.0 μm generate higher $E_{tip}$ as compared to tip distance ($H_{tip}$) of about 3.0 μm or 5.0 μm. FIG. 4D shows values of $E_{tip}$ plotted as a function of tip radius $R_{tip}$ for an example device with aperture lateral dimension ($R_{ap}$) of about 1.5 μm, tip distance ($H_{tip}$) of about −1.0 μm, and a gate voltage (V) of about 100 V.

For the simulations of FIGS. 4A-4D, an anode terminal is considered biased at 100 V higher than the gate and positioned about 1.0 cm above the gate plane. The simulation results of FIGS. 4A-4D indicate that, to enhance the field at the tip ($E_{tip}$) in an example device, the gate aperture ($R_{ap}$) can be fabricated as small as possible and the emitter tip can be slightly raised above the gate plane ($H_{tip}$). For the emitter tips disposed at a distance ($H_{tip}$) below the gate plane, the aperture lateral dimension ($R_{ap}$) has an optimum value that depends on the height of the tip ($H_{tip}$) and reducing the gate aperture lateral dimension ($R_{ap}$) below that value can reduce the field intensity ($E_{tip}$).

FIGS. 5A-5H show plots of computations of the current density (emission current) for point, i.e., each device configuration described in connection with FIGS. 4A-4D. The simulated electric field can be coupled to the Fowler-Nordheim (FN) equation to calculate the current density. Integration of the current density over the surface of the emitter tip provides the total emission current. The computed emission current as a function of the various device configuration parameters is shown in FIGS. 5A-5D (for each device configuration described in connection with FIGS. 4A-4D). The sensitivity of the emission current to the gate voltage, gate aperture lateral dimension ($R_{ap}$), height of the tip ($H_{tip}$), and radius of the tip curvature ($R_{tip}$) are depicted in FIGS. 5E-5H. Sensitivity of emission current to each parameter is defined as the derivative of current (change of current) with respect to that parameter, normalized to the current at each point (i.e., each device configuration described in connection with FIGS. 4A-4D).

There are existing processes for fabrication of arrays of tips for field emission and field ionization applications. An approach based on the Spindt process has been used for making molybdenum and tungsten tips. An approach based on isotropic etching has been used for making Si, amorphous silicon (a-Si), polycrystalline silicon (poly-Si), and tantalum (Ta) tips. Other existing processes include epitaxial growth (used for making GaAs and GaN tips) and molding process (used for making Mo and diamond tips).

Figure 6A:
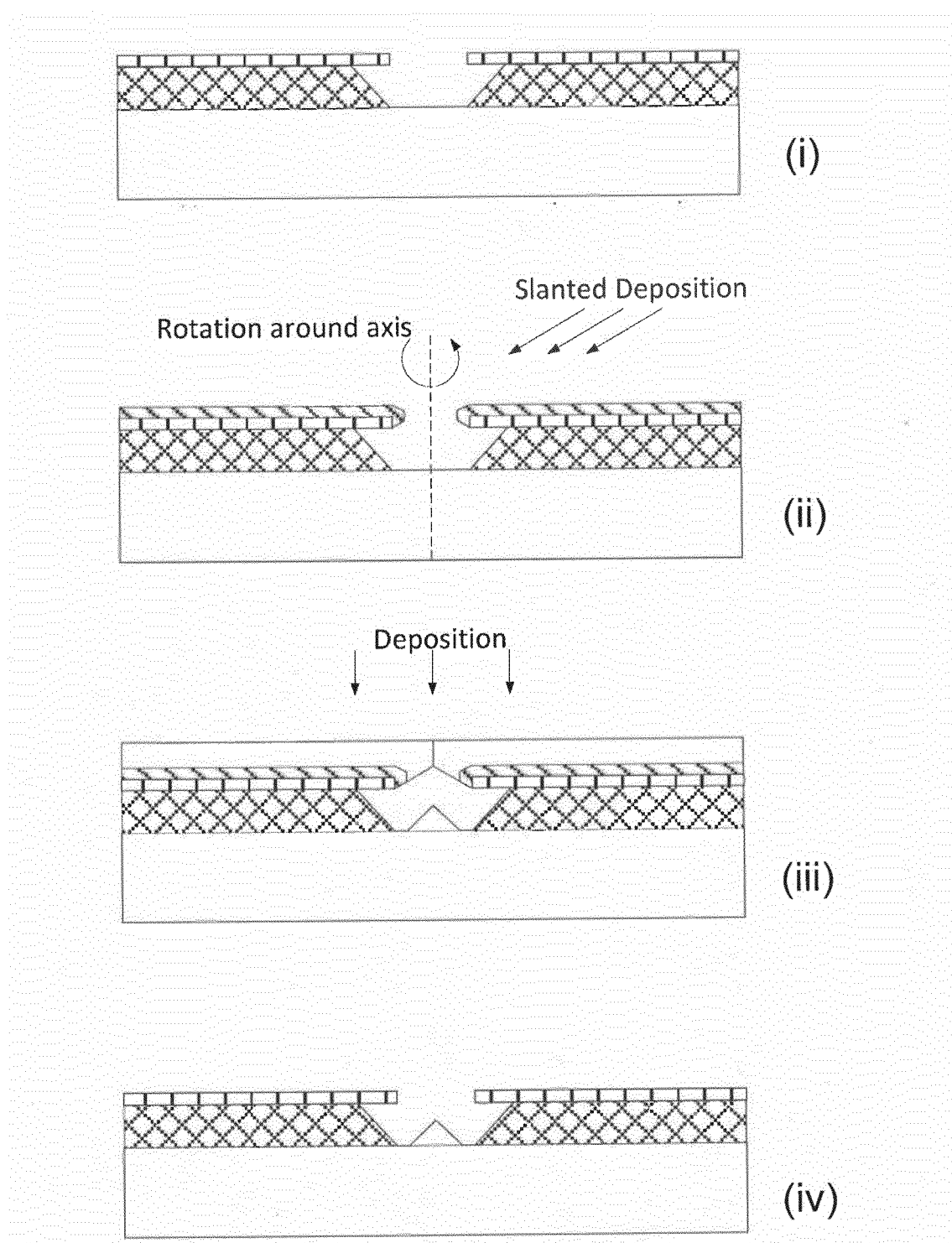
FIGS. 6A-6C show example process sequences for (A) a Spindt fabrication process, (B) a chemical mechanical polishing-based fabrication process, and (C) a molding fabrication process, according to principles of the present disclosure.

FIGS. 6A(i)-6A(iv) illustrate the Spindt process, which typically involves etching a hole in a conductor/dielectric/conductor sandwich (see FIG. 6A(i)) to define a gate aperture and a cavity. A lift-off layer is deposited over the conductor/dielectric/conductor sandwich (see FIG. 6A(ii)). The emitter tip is deposited in the cavity by directional deposition of a metal (see FIG. 6A(iii)). The lift-off layer is removed (see FIG. 6A(iv)).

Figure 6B:
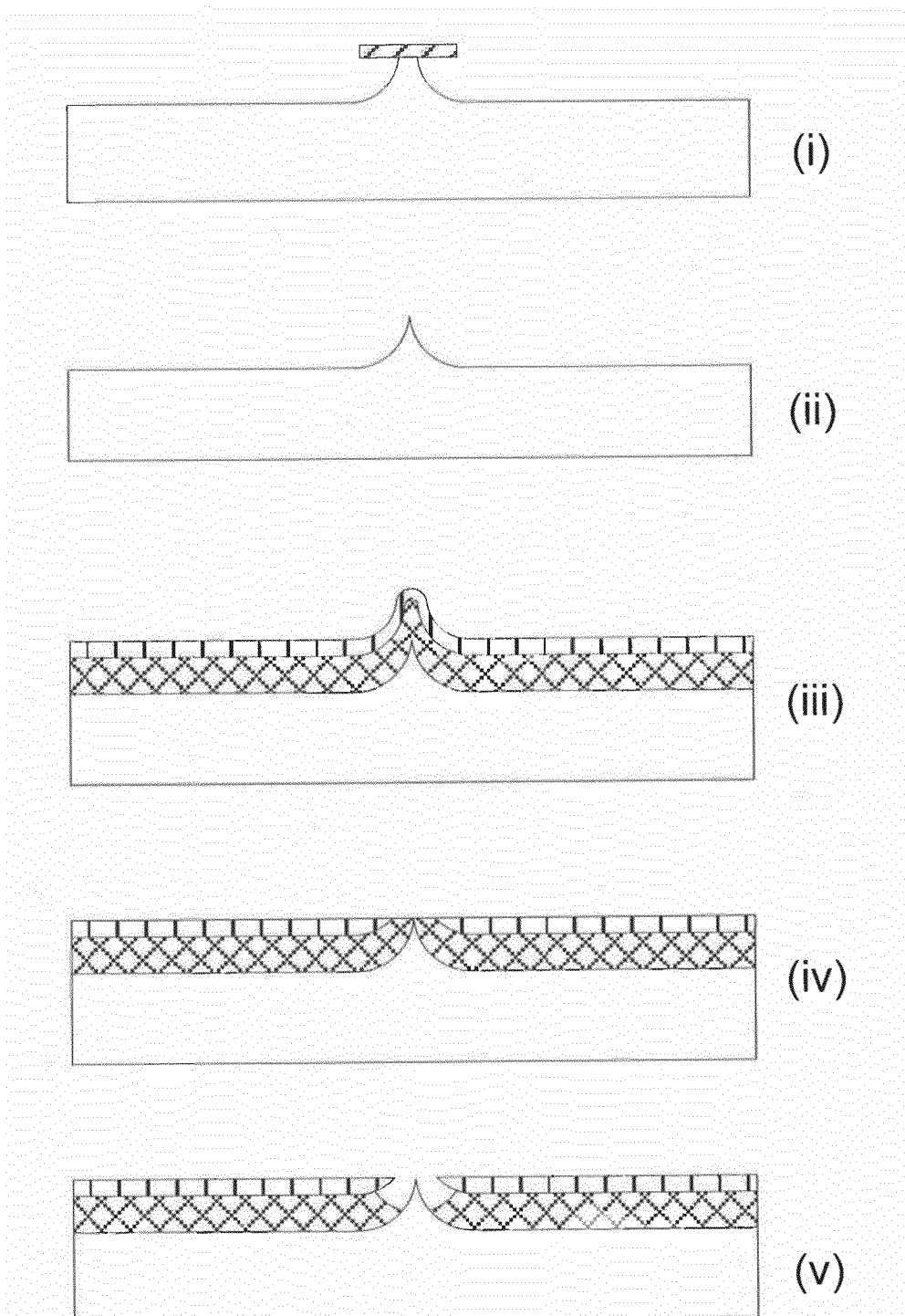

FIGS. 6B(i)-6B(iv) illustrate an isotropic etching-based method. A Si substrate is isotropically etched under a disk-shape mask to form a tip (see FIG. 6B(i)). The tip is sharpened by oxidation (see FIG. 6A(ii)). The gate dielectric and gate conductor layers are deposited or grown (see FIG. 6B(iii)). A chemical mechanical polishing (CMP) is performed to remove the conductor layer over the tip and define the gate aperture (see FIG. 6B(iv)) and the gate opening is made by etching (see FIG. 6B(v)).

Figure 6C:
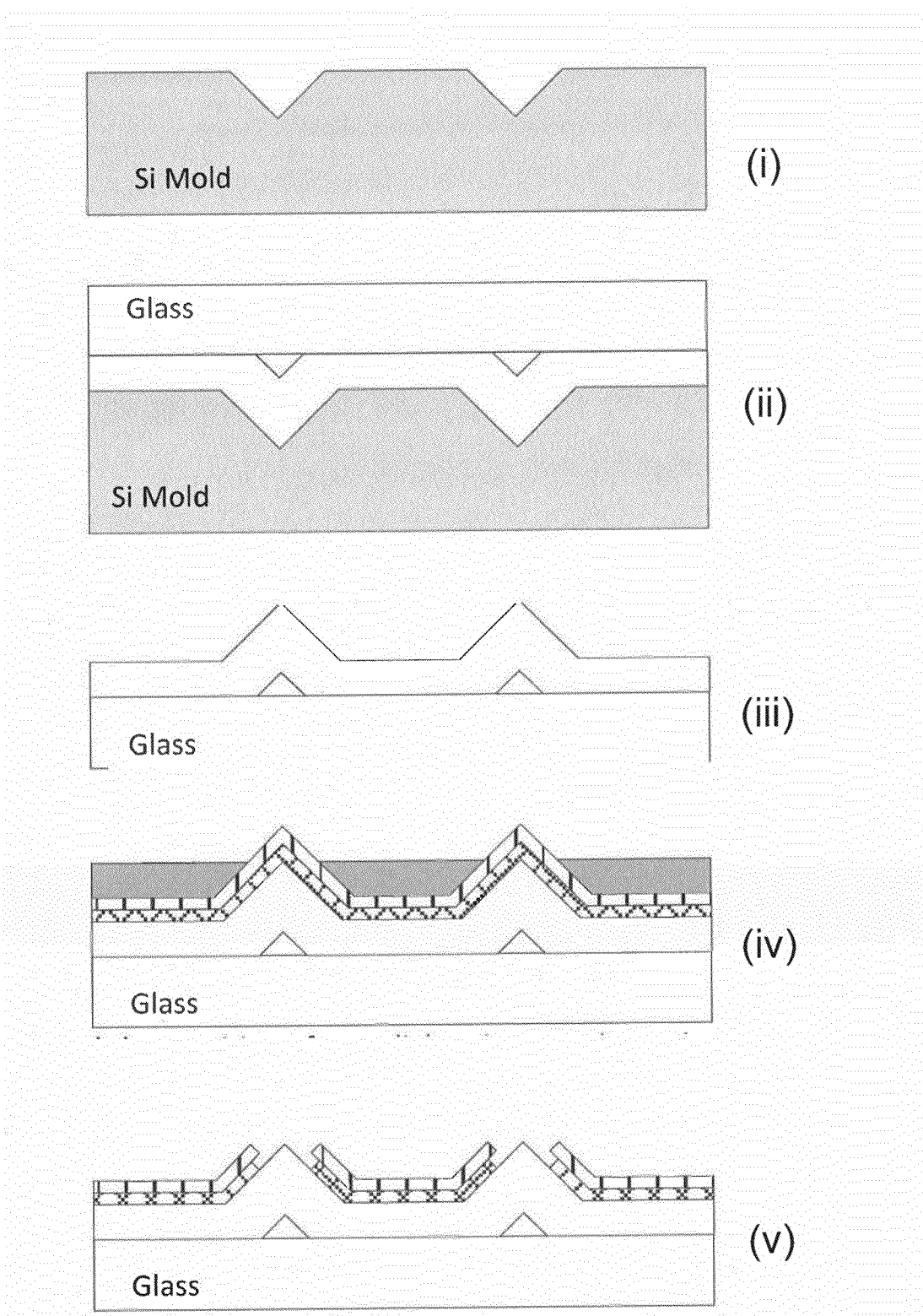

FIGS. 6C(i)-6C(iv) illustrate a molding process. Inverted pyramids are etched in Si to form a mold (see FIG. 6C(i)) and filled by emitter material such as Mo or diamond in a deposition step to form the emitter tips (see FIG. 6C(ii)). In FIG. 6C(iii), a substrate such as glass is bonded to the deposited emitters (see FIG. 6C(ii)), and the Si mold is dissolved to release the emitter tips (see FIG. 6C(iii)). In FIG. 6C(iv), the gate dielectric and gate electrode are deposited, and a non-conformal mask layer is deposited over the gate dielectric/conductor stack that is either not covering the stack or thinner in the tip region. In FIG. 6C(v), the gate aperture is defined by isotropic etching of the mask layer followed by etching of the gate conductor.

To provide a device with increased thickness of the gate dielectric, additional fabrication steps are required over the Spindt process and CMP-based approach. For instance, in Spindt method the deposition of sacrificial layer and emitter can be done several times or a metal post can be electroplated to raise the tip position inside the cavity. For example, in a CMP-based method, the gate dielectric thickness can be defined by introducing an additional etching and CMP process. These additional fabrication steps increase the cost and complexity of the CMP-based device fabrication process.

Figure 7:
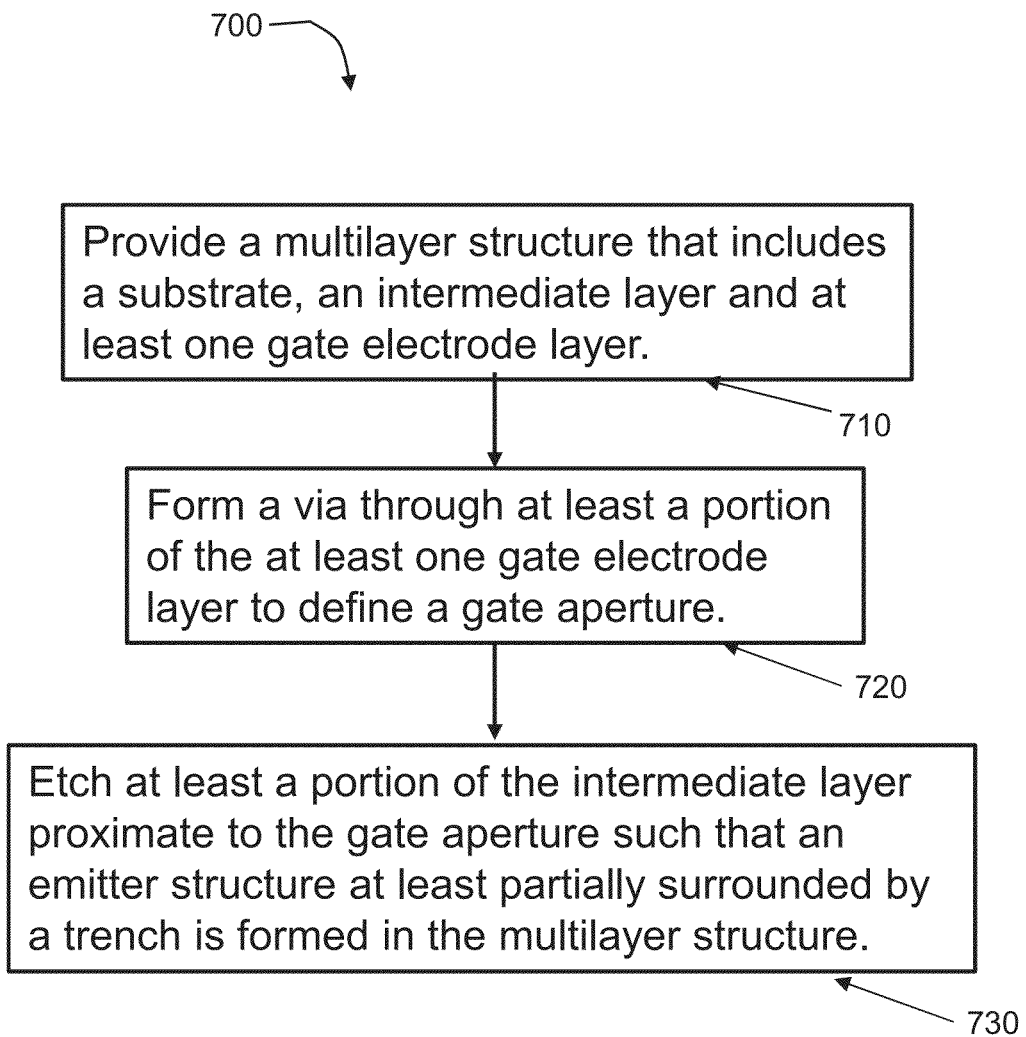
FIG. 7 shows a flow-chart of an example method for fabrication of an example self-aligned gated tip array, according to principles of the present disclosure.

Systems, methods and apparatus are described herein that provide a high-yield, low-cost fabrication approach for fabrication of self-aligned gated tip arrays. A non-limiting example fabrication process 700 according to the principles described herein is described in connection with FIG. 7. In block 710, a multilayer structure is provided. The multilayer structure includes a substrate, an intermediate layer and at least one gate electrode layer. In an example, the intermediate layer includes a dielectric material disposed over at least a portion of the substrate. The at least one gate electrode layer is disposed over at least a portion of the intermediate layer. In block 720, a via is formed through at least a portion of the at least one gate electrode layer to define a gate aperture. In block 730, at least a portion of the intermediate layer proximate to the gate aperture is etched such that an emitter structure at least partially surrounded by a trench is formed in the multilayer structure.

In a non-limiting example, the fabrication process can further include depositing an electrically conductive coating over portions of the gate electrode layer and/or over portions of the emitter structure.

In a non-limiting example, the substrate can include any of the semiconductor materials, III-V materials, metals, or dielectric materials described herein. As non-limiting example, the substrate comprises silicon, germanium, gallium arsenide, gallium nitride, silicon carbide, an oxide of silicon, or a transition metal oxide.

In a non-limiting example, the intermediate layer can include at least one post structure that is at least partially surrounded by the dielectric material. In an example, the post structure may have a cylindrical shape, a cuboid shape, or other polygonal shape. In various examples, the intermediate layer can include a plurality of the post structures, such as but not limited to, in the form of a matrix of post structures (e.g., a matrix of post structures at least partially embedded in a dielectric medium). The fabrication process flow can include a process of planarizing the intermediate layer, for example, where the intermediate layer is desired to be planar prior to performance of other process steps. Example methods for planarizing the intermediate layer include chemical mechanical polishing (CMP) or lapping. In an example, the post structure may extend through the intermediate layer from the substrate to the gate electrode layer. In various examples, the post structure and the substrate may be formed from the same material or from different materials. In an example, the etching performed in block 730 includes etching at least a portion of the post structure, where the etched post structure forms the emitter structure. In this non-limiting example, the intermediate layer may further include an etching barrier disposed over the post structure proximate the gate electrode layer, where the etching the post structure forms the emitter structure having a tip proximate to the etching barrier.

In a non-limiting example, a mask can be disposed proximate to the gate electrode layer prior to etching at least a portion of the intermediate layer proximate to the gate aperture. The mask can be maintained in position during the etching of the intermediate layer. In an example where the intermediate layer includes a post structure at least partially surrounded by the dielectric material, the post structure can be configured such that it has a principal dimension in a plane of the gate electrode layer. For example, where the post structure has a cylindrical cross-section, the principal dimension in the plane of the gate electrode layer can be the diameter of the post structure. In an example where the post structure has a cuboid shape or other polygonal shape, the principal dimension can be the lateral dimension across the post structure in the plane of the gate electrode layer. The mask can include an opening of a size that is larger than the principal dimension of the post structure.

The gate electrode layer of the multilayer structure in block 710 can include at least one layer of an electrically conductive material. For example, the electrically conductive material can include carbon, aluminum, silicon, germanium, gallium, indium, tin, a transition metal, a conductive metal oxide, or any combination of these materials. Examples of transition metals that are applicable include gold, platinum copper, tantalum, tungsten, titanium, cobalt, chromium, silver, or nickel, or a binary or ternary combination of these transition metals. In an example, the gate electrode layer can further include at least one dielectric layer disposed between the at least one layer of the electrically conductive material and the intermediate layer. For example, the at least one dielectric layer can include silicon nitride.

The dielectric material can include an oxide or a nitride of aluminum, silicon, germanium, gallium, indium, tin, antimony, tellurium, bismuth, titanium, vanadium, chromium, manganese, cobalt, nickel, copper, zinc, zirconium, niobium, molybdenum, palladium, cadmium, hafnium, tantalum, or tungsten, or any combination of these materials.

Figure 8:
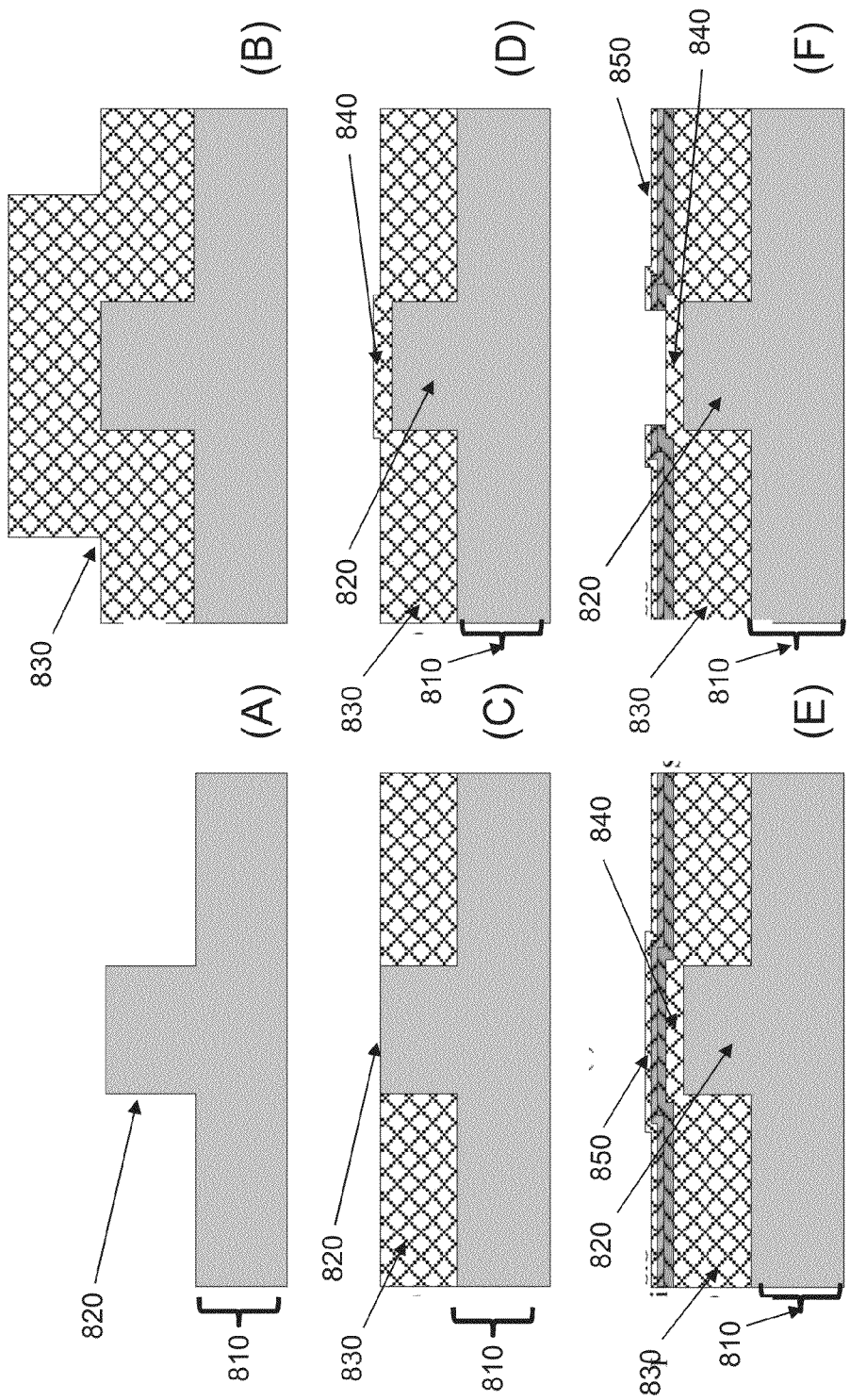
FIGS. 8A-8J show an example fabrication sequence of self-aligned gated tips, where the tip is below the gate plane, according to principles of the present disclosure.
Figure 8:
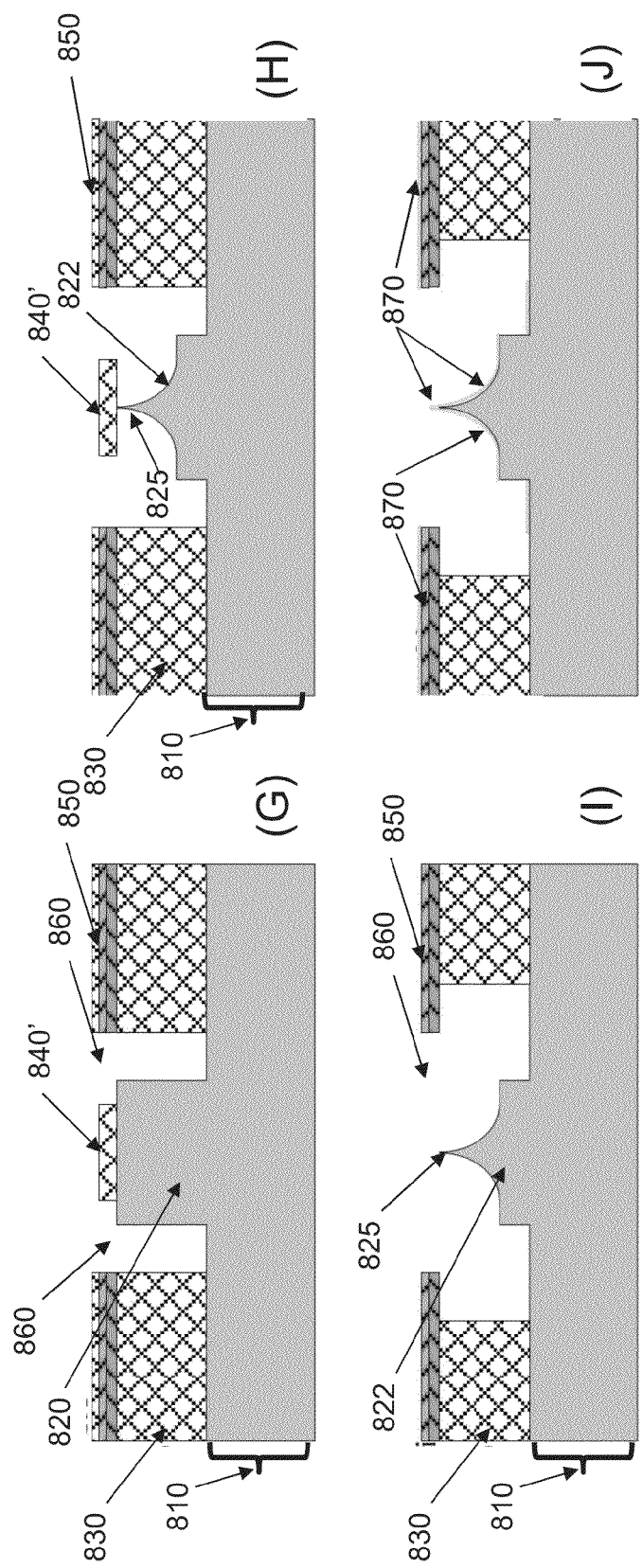

A non-limiting example implementation of a fabrication process according to the principles described herein is illustrated in FIGS. 8A-8F. In this example, the process performed using a Si substrate. However, as described hereinabove, the process can be performed using many other types of semiconductor, dielectric or conductive materials. In this example, the dielectric layer 830 is formed from SiO. However, in other examples, the dielectric layer can be formed from other types of dielectric materials. The fabrication process of FIGS. 8A-8F is shown for a single gate electrode. However, the device can be fabricated with multiple self-aligned gates. In the example of FIG. 8A, the fabrication process begins with a Si substrate 810, with a portion that is etched to form a Si pillar 820 (an example of a post structure). Formation of the pillar 820 allows for deposition of a thick gate dielectric stack while the gate aperture is defined independently in a later step. As shown in FIG. 8B, the gate dielectric 830 is deposited and the system can be planarized (see FIG. 8C) to expose the Si pillars 820 using a planarization process, such as but not limited to a chemical mechanical polishing (CMP) process or lapping. In FIG. 8D, a thin layer of a dielectric material 840 (such as but not limited to an oxide of Si) is grown or deposited over the exposed Si pillars 820. This dielectric material layer 840 serves as the etching barrier during the anisotropic etching of Si carried out to form the tips. In FIG. 8E, a stack layer 850 of SiN\n-Poly-Si\SiO$_2$ is deposited. The SiN of stack layer 850 is disposed over the dielectric material 840 and the dielectric layer 830. The n-Poly-Si is a poly-crystalline silicon that is n-doped and is therefore conductive. The n-Poly-Si serves as the gate electrode of the device. As shown in FIG. 8F, the SiO$_2$ and n-poly-Si layers over the region of the Si pillars 820 are etched. For example, using a lithography step, an oxide cap (serving as an etch barrier) can be defined over the Si pillar 820 and the stack layer of SiO$_2$/SiN/n-Poly/SiO$_2$ can be simultaneously etched. In this example, the stack layer 850 is described as a SiN\n-Poly-Si\SiO$_2$ layer. In another example, the conductor layer (n-Poly-Si) and dielectric layers (SiN and SiO$_2$) can be formed from other materials with similar electrical properties.

In the example of FIG. 8G, a mask is disposed over the structure and it is etched to define a gate opening (gate aperture 860). The gate opening in the third mask used for etching the stack layer 850 in FIG. 8G can be configured to have a larger opening than the opening etched in the SiO/n-Poly/SiN stack layer during the second lithography step (in FIG. 8F). As a result, the oxide cap 840' that defines the tip is placed exactly at the center of the gate aperture 860. This ensures a self-aligned structure for the field ionizers/emitter devices. In FIG. 8H, an isotropic dry etching process is performed to generate the emitter 822 and an oxidation sharpening process is performed to form the emitter tips 825. In FIG. 8I, the oxide cap 840' is etched through the gate aperture 860 to release the emitter tips 825. As shown in FIG. 8J, a thin layer of a conductive material 870 (such as but not limited to platinum (Pt), can be deposited over the gate dielectric 850, the emitter tip 825, and portions of the emitter 822 to improve the gate conduction and also protect the emitter tip 825.

Figure 9:
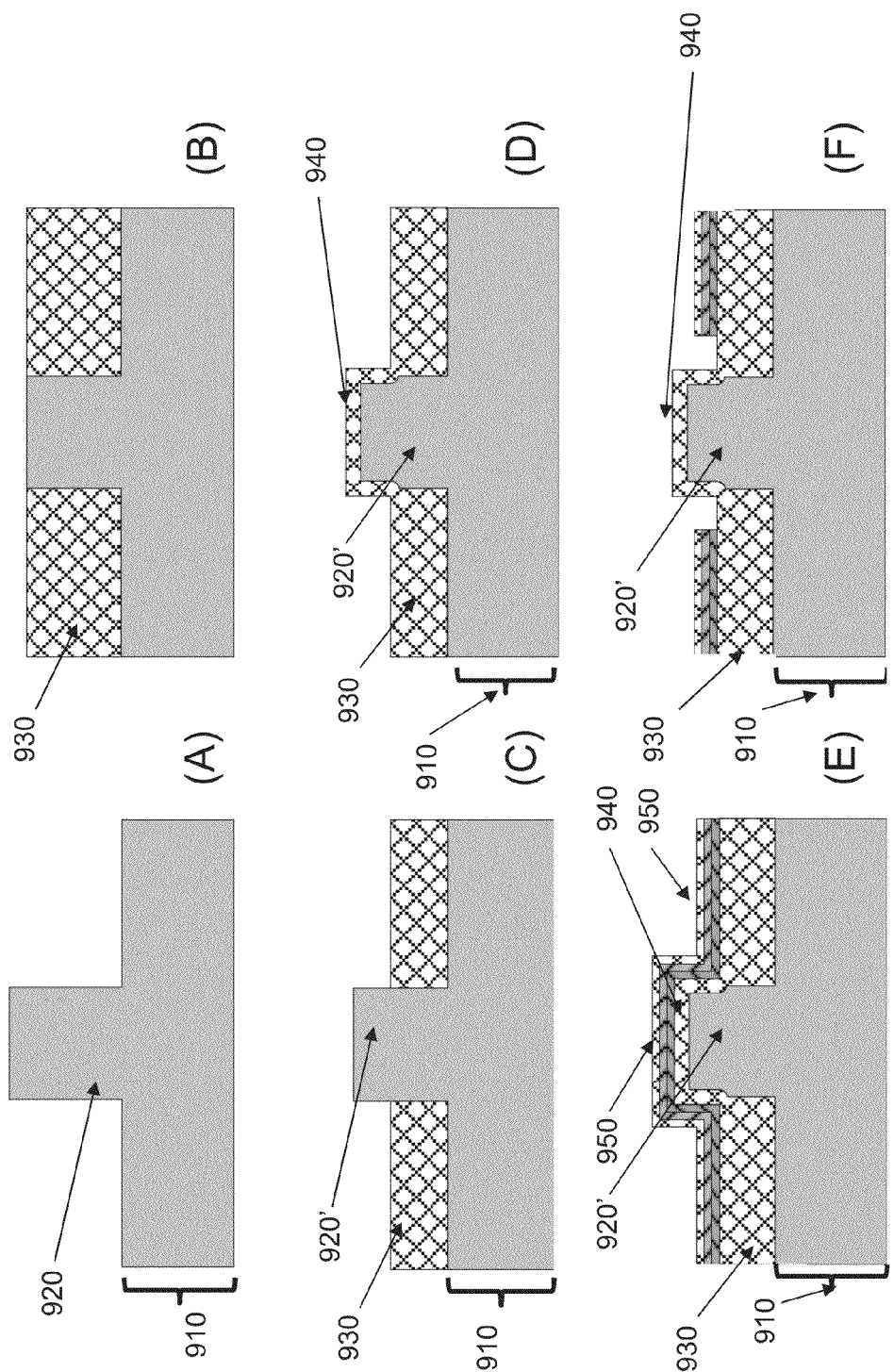
FIGS. 9A-9J show an example fabrication sequence of self-aligned gated tips, where the tip is above the gate plane, according to principles of the present disclosure.
Figure 9:
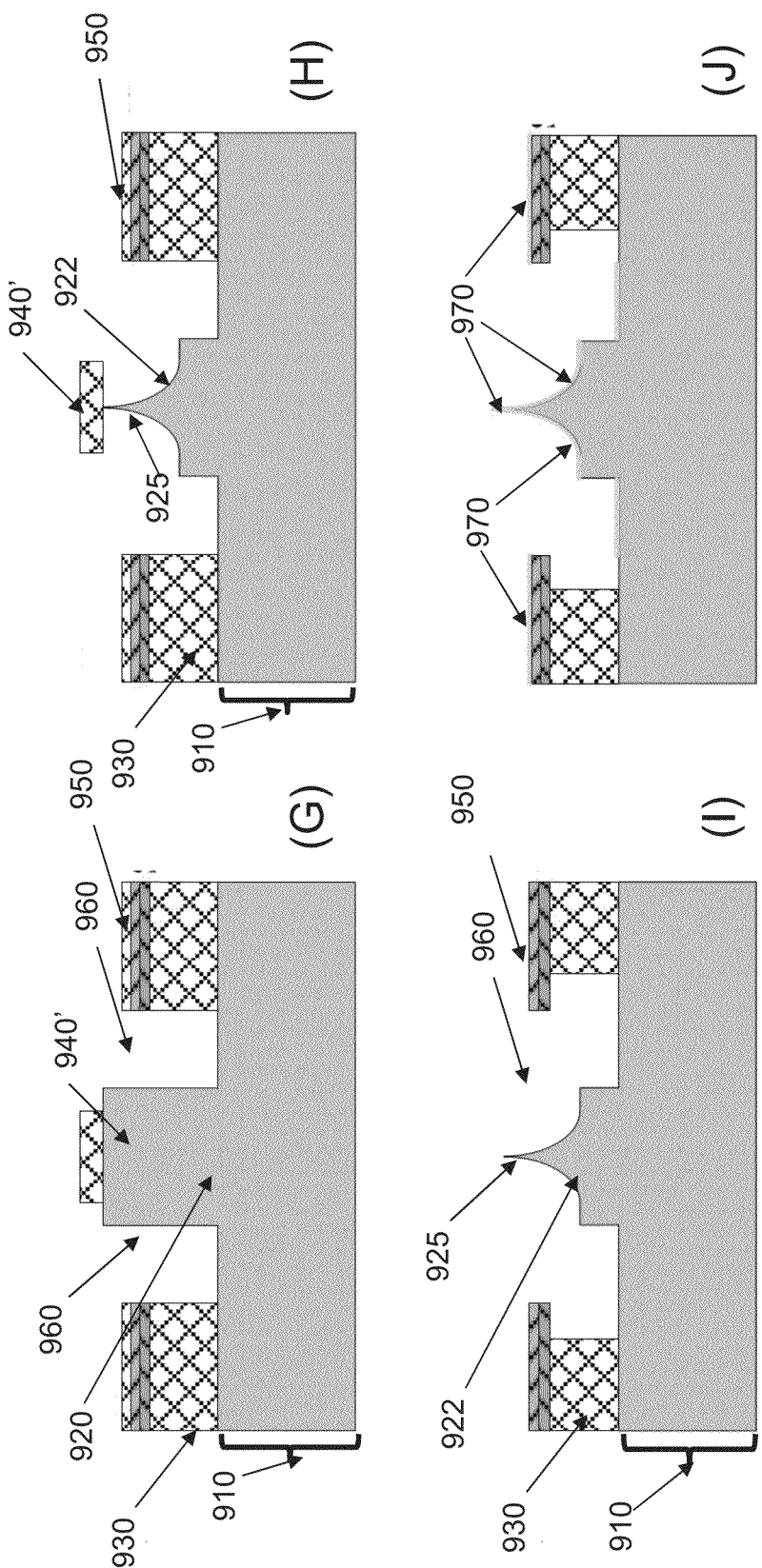

FIGS. 9A-9J shows another non-limiting example implementation of a fabrication process according to the principles described herein. The fabrication process of example FIGS. 9A-9J is modified over the fabrication method of FIGS. 8A-8J in order to raise the tip height of the device with respect to the gate plane. In FIG. 9A, the fabrication process begins with a Si substrate 910, with a portion that is etched to form a Si pillar 920 (an example of a post structure). As shown in FIG. 9B, a gate dielectric 930 is deposited. The system can be planarized to expose the Si pillars 920 using a chemical mechanical polishing (CMP) process. The post structure can be raised by adding an additional oxide-etching step selective to the Si pillars (post structure) after the planarization step to provide a raised post structure 920'. In FIG. 9D, a thin layer of a dielectric material 940 (such as but not limited to an oxide of Si) is grown or deposited over the exposed and raised Si pillars 920'. This dielectric material layer 940 serves as the etching barrier during the anisotropic etching of Si carried out to form the tips. In FIG. 9E, a stack layer 950 of SiN\n-Poly-Si\SiO$_2$ is deposited. The SiN of stack layer 950 is disposed over the dielectric material 940 and the dielectric layer 930. The n-Poly-Si is a poly-crystalline silicon that is n-doped and is therefore conductive. The n-Poly-Si serves as the gate electrode of the device. As shown in FIG. 9F, the SiO$_2$ and n-poly-Si layers over the region of the raised Si pillars 920' are etched. As shown in FIG. 9G, using a lithography step, an oxide cap (serving as an etch barrier) can be defined over the raised Si pillar 920' and the stack layer of SiO2/SiN/n-Poly/SiO$_2$ can be simultaneously etched. In the example of FIG. 9G, the stack layer 950 is formed as a SiN\n-Poly-Si\SiO$_2$ multi-layer, where the n-Poly-Si is an electrically conductive layer and the SiN and SiO$_2$ are dielectric layers. In other examples, the stack layer 950 can be formed from any other electrically conductive materials and other dielectric materials described herein. In FIG. 9G, a mask is disposed over the structure and it is etched to define a gate opening (gate aperture 960). The gate opening in the third mask used for etching the stack layer 950 in FIG. 9G can be configured to have a larger opening than the opening etched in the SiO/n-Poly/SiN stack layer during the second lithography step (in FIG. 9F). As a result, the oxide cap 940' that defines the tip is placed exactly at the center of the gate aperture 960. This ensures a self-aligned structure for the field ionizers/emitter devices. In FIG. 9H, an isotropic dry etching process is performed to generate the emitter 922 and an oxidation sharpening process is performed to form the emitter tips 925. In FIG. 9I, the oxide cap 940' is etched through the gate aperture 960 to release the emitter tips 925. As shown in FIG. 9J, a portion of the emitter 922 extends into the gate aperture 960. As shown in FIG. 9J, a thin layer of a conductive material 970 (such as but not limited to platinum (Pt), can be deposited over the gate dielectric 950, the emitter tip 925, and portions of the emitter 922 to improve the gate conduction and also protect the emitter tip 925.

An example fabrication process according to the example systems, methods and apparatus described herein can tolerate a wide variation in the CMP step. On the other hand, in the existing CMP-based processes, the gate aperture is defined by the CMP step. Therefore, if there are non-uniformities in the thicknesses of the films that make up the film stack or in the removal rate across the surface, the gate aperture is defined uniformly across the array. In some examples, some of the apertures may not be opened, or some of the ionizer/emitter tips may be chopped off. However, in the example systems, methods and apparatus described herein, the CMP step can be continued until a planar surface is achieved over the entire wafer and Si posts surfaces. Moreover, according to the example systems, methods and apparatus described herein, it is not necessary to perform more than a single CMP step for defining a gate insulator with a thickness independent of the gate aperture size. By comparison to the Spindt process, there is no need for a directional deposition step with a grazing angle of incidence to implement the example systems, methods and apparatus described herein.

In any example implementation according to FIGS. 9A-9J, a thick gate dielectric can be employed without forming a post in the cavity or multiple deposition of the sacrificial and emitter material necessary for raising the tip position.

Figure 10:
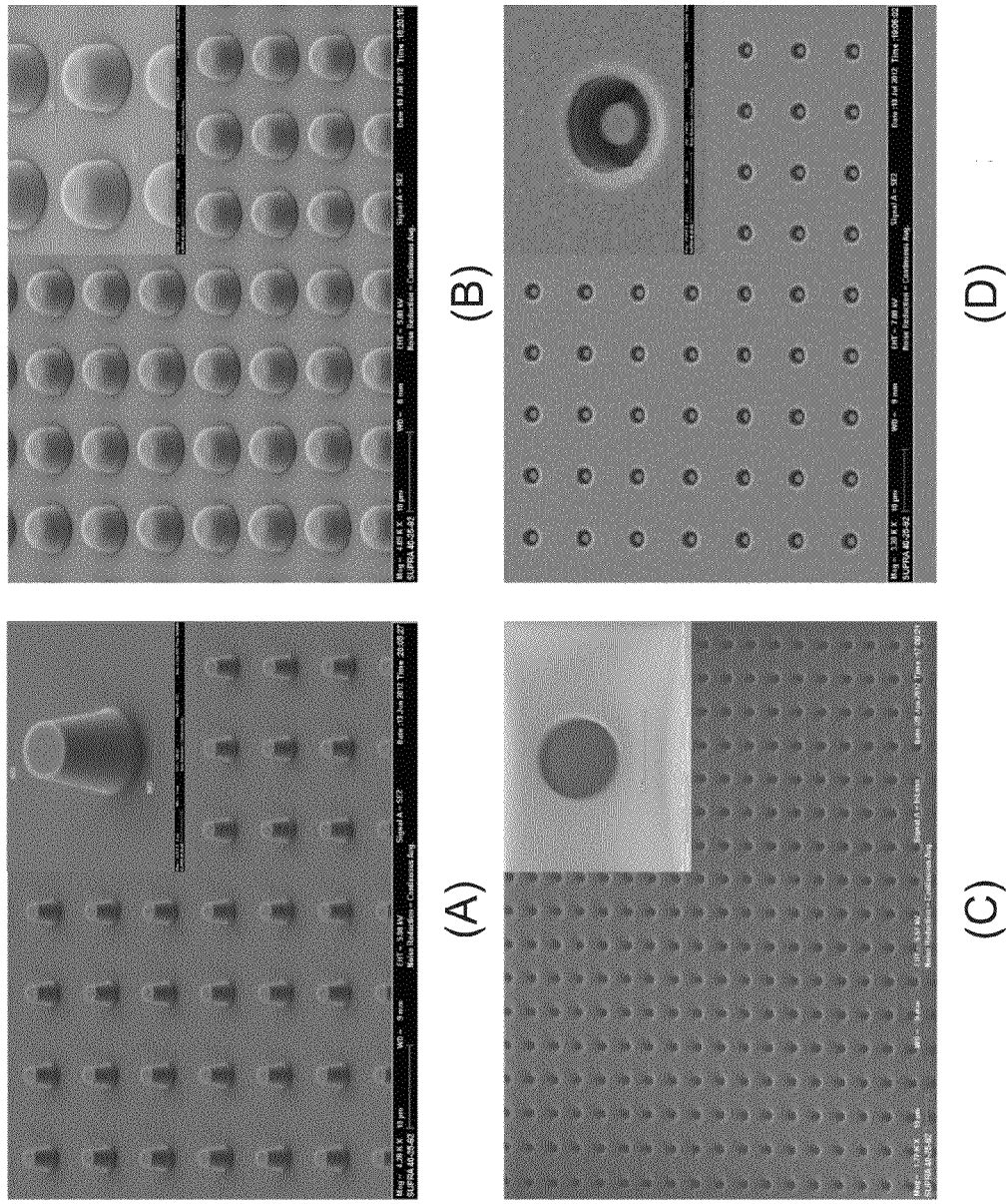
FIGS. 10A-10H show scanning electron microscopy images of different stages in the fabrication of an example device including arrays of self-aligned gated tips, according to principles of the present disclosure.
Figure 10:
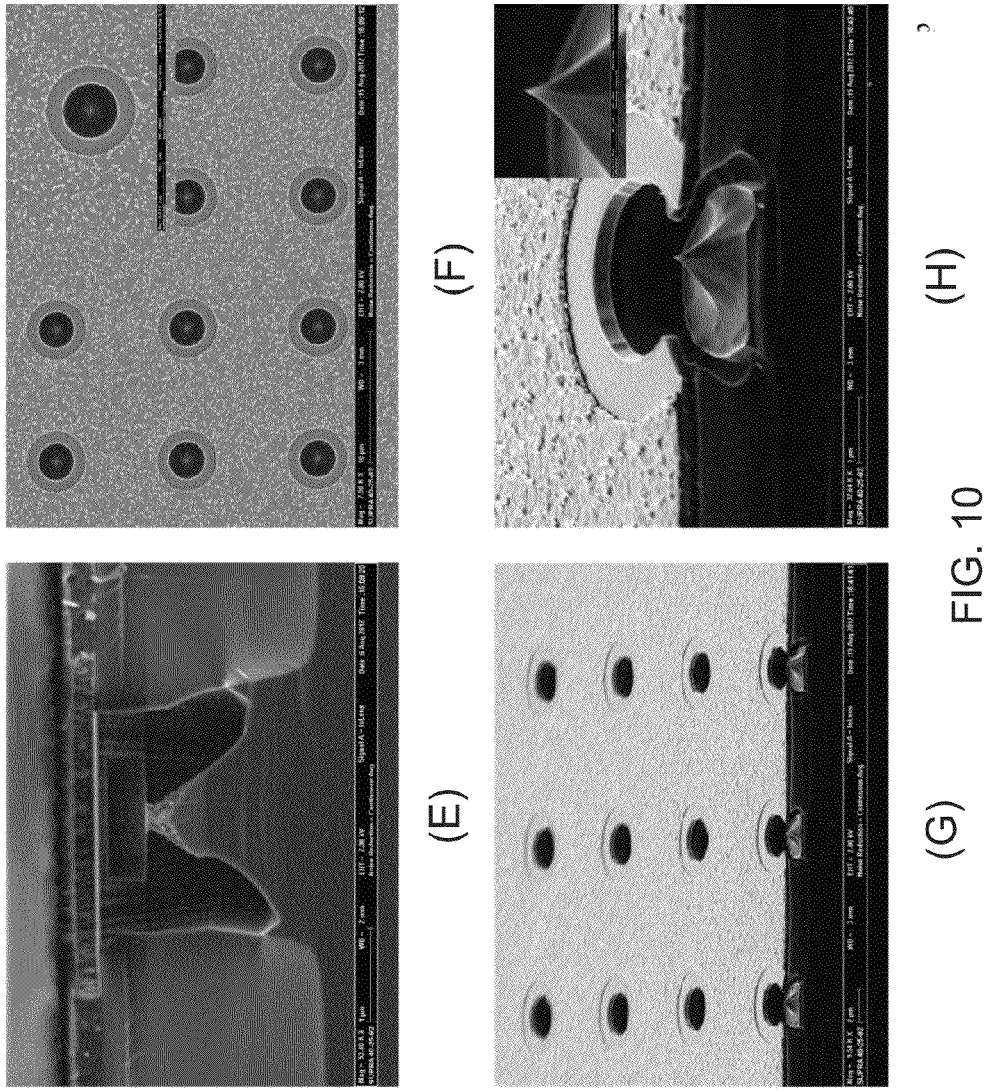

FIGS. 10A-10H show images of an example implementation at different stages of the fabrication process. FIG. 10A shows an array of pillars (post structures) formed using an etching process. FIG. 10B shows the result of deposition of the gate dielectric on the pillars. FIG. 10C shows the result of planarization of the system. In FIG. 10D, the result of gate stack etching is shown. FIG. 10E shows a cross-section of a structure with the emitter formed from an isotropic etch of a pillar (post structure). FIG. 10F shows the results of an etch and tip sharpening process. In FIG. 10G, a conductive material (such as but not limited to platinum (Pt)) is deposited over the gate structure and portions of the tip and emitter. From FIG. 10F, it is apparent that the tip is located in the middle of the gate aperture. The radius of gate aperture in the example implementation is about 1.5 µm and the gate dielectric stack has thickness of about 2.5 µm. The radius of curvature at the tip of the ionizers, shown in the inset of FIG. 10H, is less than about 10 nm.

Figure 11A:
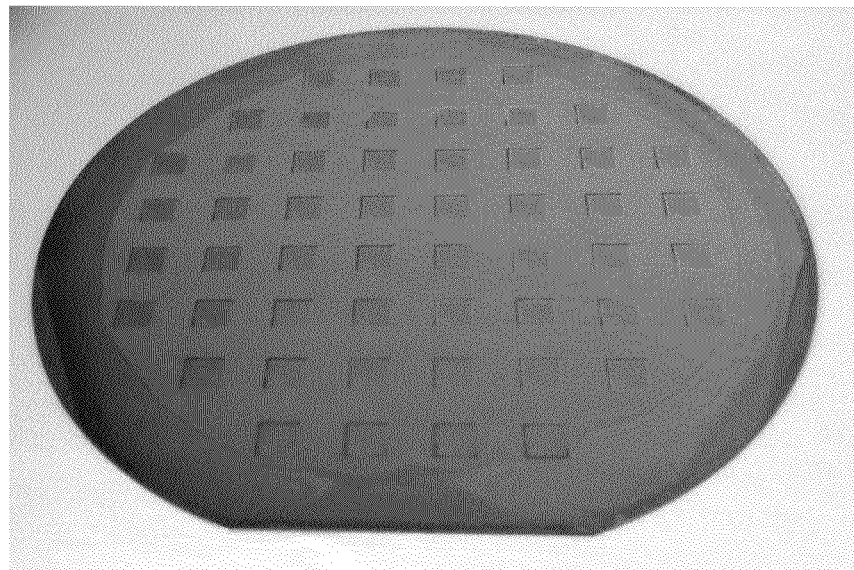
FIGS. 11A-11B show (A) an optical image of an example fabricated arrays on a 6-inch Si wafer and (B) a magnified image of an example array of self-aligned gated tips, according to principles of the present disclosure.
Figure 11B:
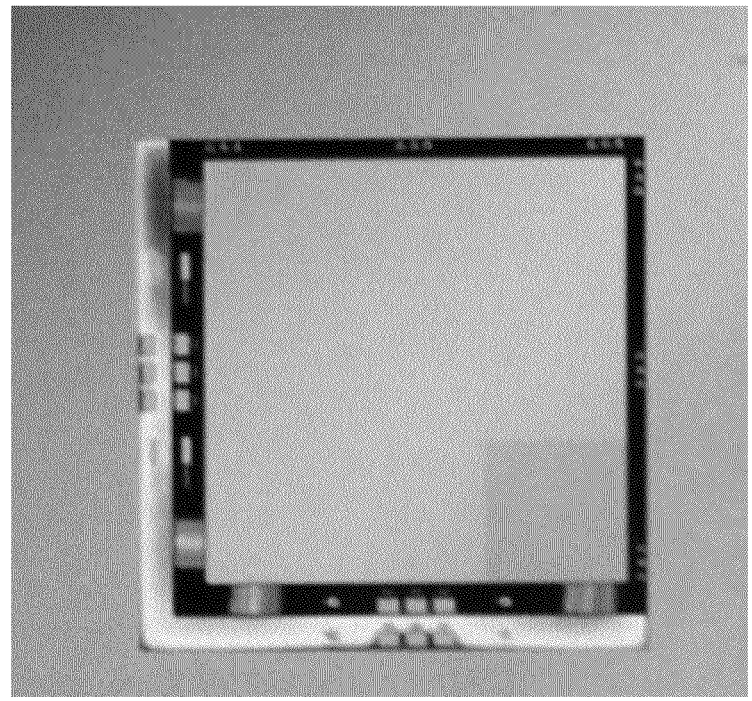

The optical image of field ionization/emission arrays fabricated on a 6-inch silicon wafer according to the principles described herein are shown in FIG. 11A. FIG. 11B shows an image of an array. The array has an area of about 6 mm×6 mm, and includes about 320,000 gated tips with about 10 µm center-to-center spacing.

Figure 12:
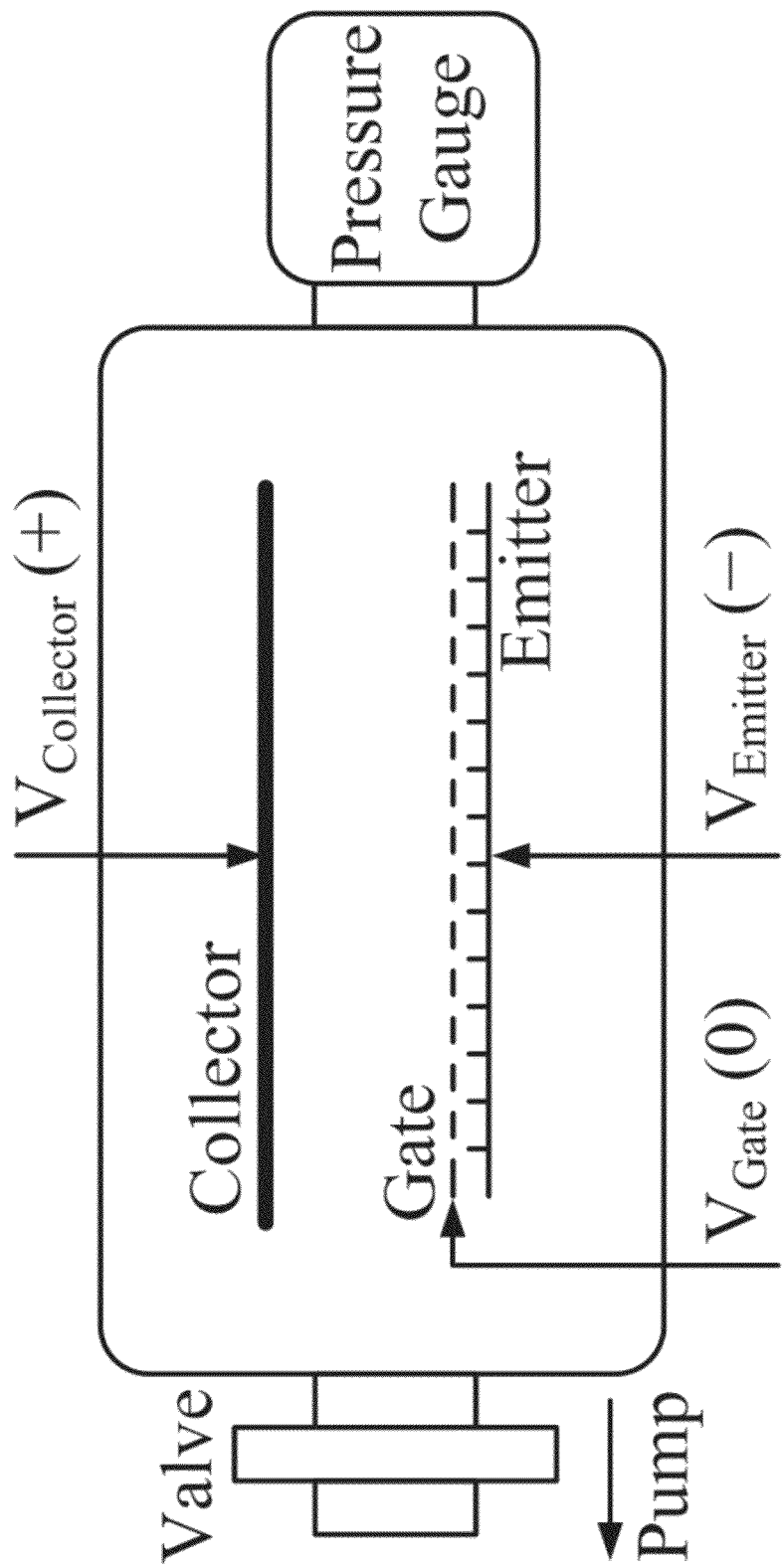
FIG. 12 shows an example setup for performing field ionization measurements, according to principles of the present disclosure.
Figure 13:
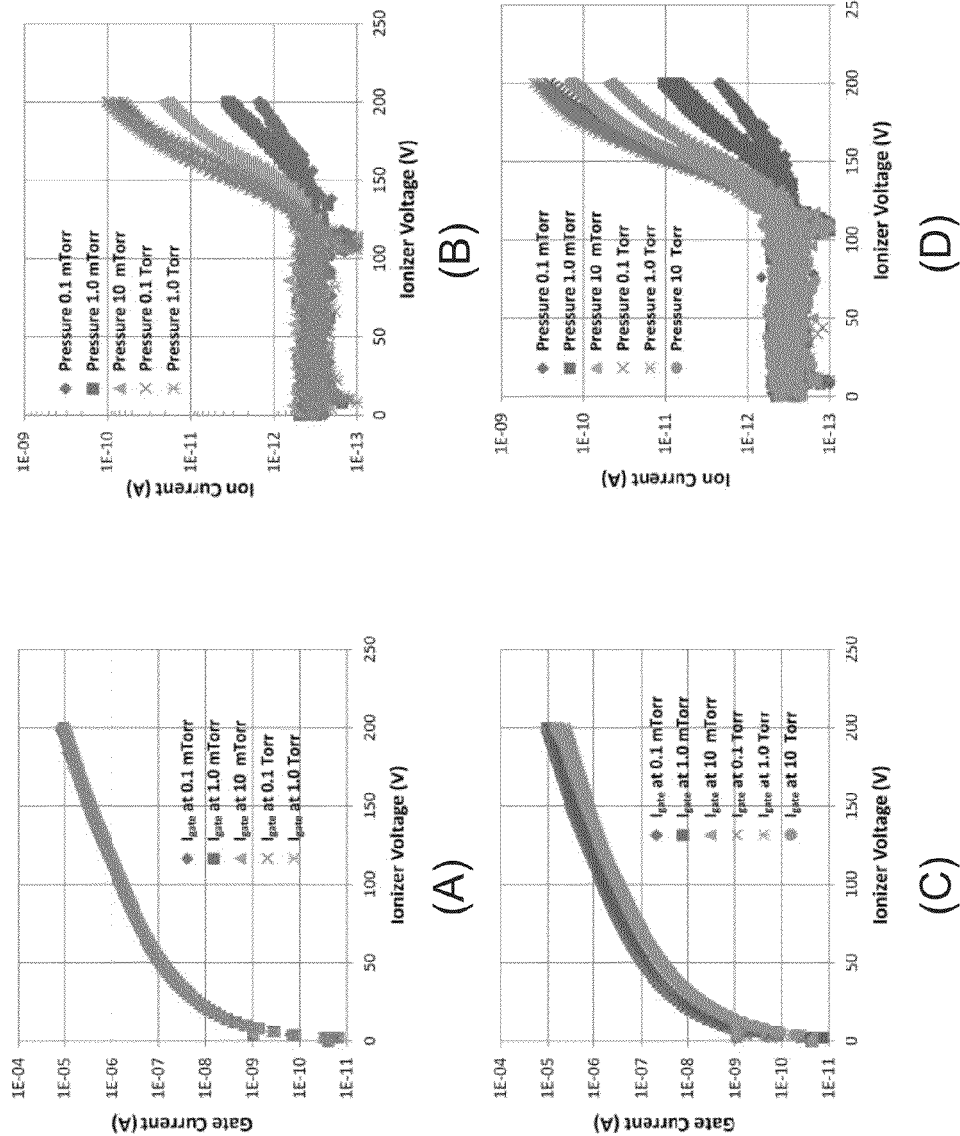
FIGS. 13A-13H show example plots of high pressure ionization characteristics of example devices at positive tip voltages, according to principles of the present disclosure.
Figure 13:
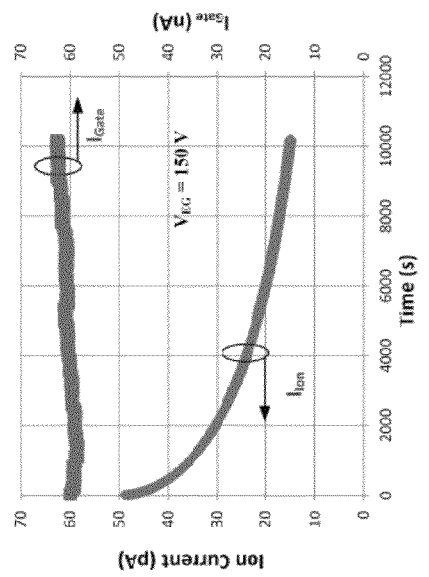
Figure 13:
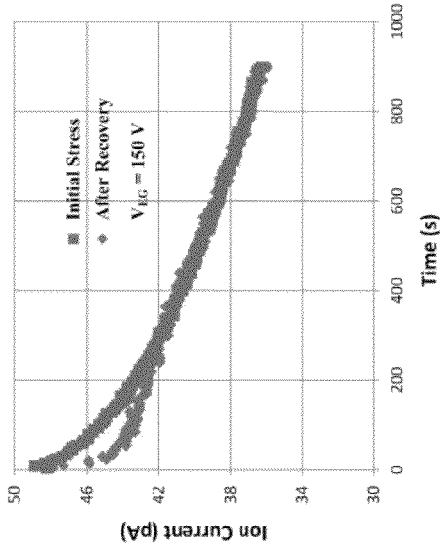
Figure 13:
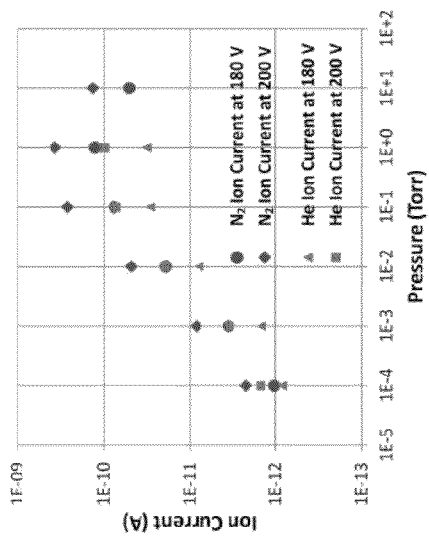
Figure 13:
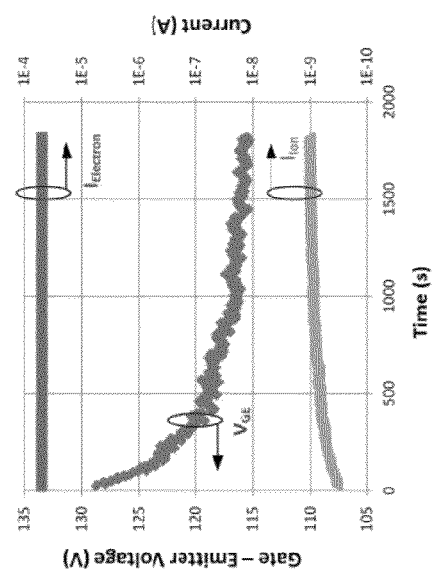

The field ionization characteristics of example devices fabricated according to the systems, methods and apparatus described herein are measured using the measurement setup shown in FIG. 12. A positive voltage is applied to the ionizer tips while the gate is connected to ground and the collector terminal is biased at a negative voltage to collect the generated ions. An array of self-aligned gated tip, fabricated according to the systems, methods and apparatus described herein, can field ionize even the noble gas helium, which has the highest ionization potential among molecules, at voltages as low as about 150 V and pressures as high as about 10 Torr. The ionization measurements are carried out in nitrogen and helium gases. The gate and ion currents are measured in the pressure range of about 0.1 mTorr to about 10 Torr. Measurement results are shown in FIGS. 13A-13D. Ion currents as high as 0.1 nA can be generated with emitter-gate voltages of less than 200 V at about 1 to about 10 Torr pressures. The ion current as a function of pressure at $V_{IG}$ of about 180 V and about 200 V is depicted in FIG. 13E for ionization of He and $N^2$ gases. The characteristics of the device are stable at low ion currents (about 50 pA at about 150 V) even at about 10 Torr pressure as confirmed by ionization experiment at about 10 Torr for $10^4$ s (see FIG. 13F). The device characteristics slowly degrade over time but can be recovered by electron emission, where the tip is biased negatively with respect to the gate, at low pressures as confirmed by the measurement results depicted in FIGS. 13G and 13H.

Field emission and electron impact ionization characteristics are described. The example self-aligned gated tip arrays fabricated according to the systems, methods and apparatus described herein are capable of efficient electron emission and electron impact ionization at low voltage. The thick gate dielectric stack and Pt-coating over the example device facilitate long-term and reliable operation of the proposed arrays for application as a gas ionizer or an electron source. The setup used for measurement of the electron emission characteristics is similar to the setup used for field ionization. For electron emission the tips (Emitters) are biased at a negative voltage with respect to the grounded gate electrode and the collector is biased at a positive voltage to collect the emitted electrons.

Figure 14:
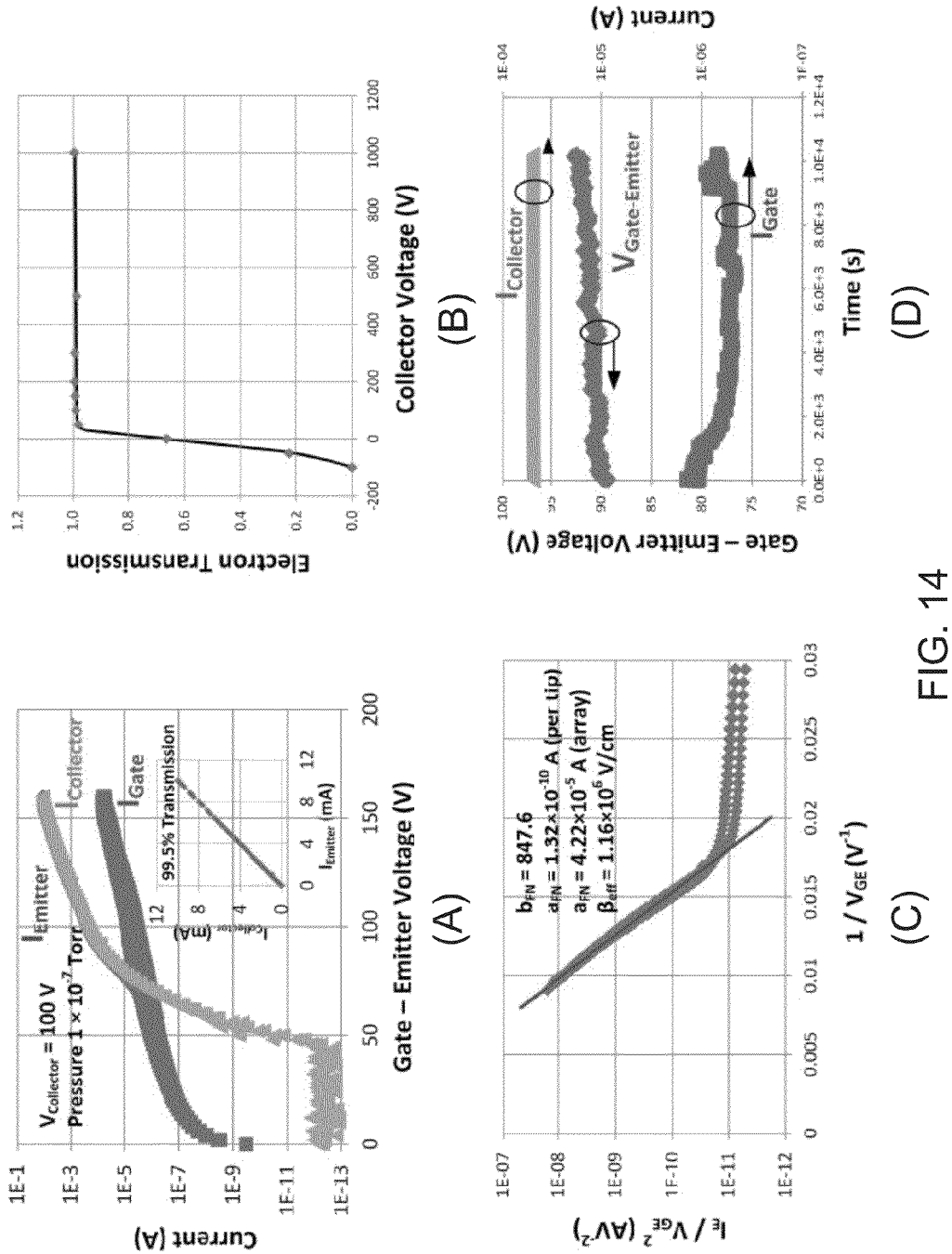
FIGS. 14A-14F show example plots of the emission characteristics of example fabricated self-aligned gated tip arrays, according to principles of the present disclosure.
Figure 14:
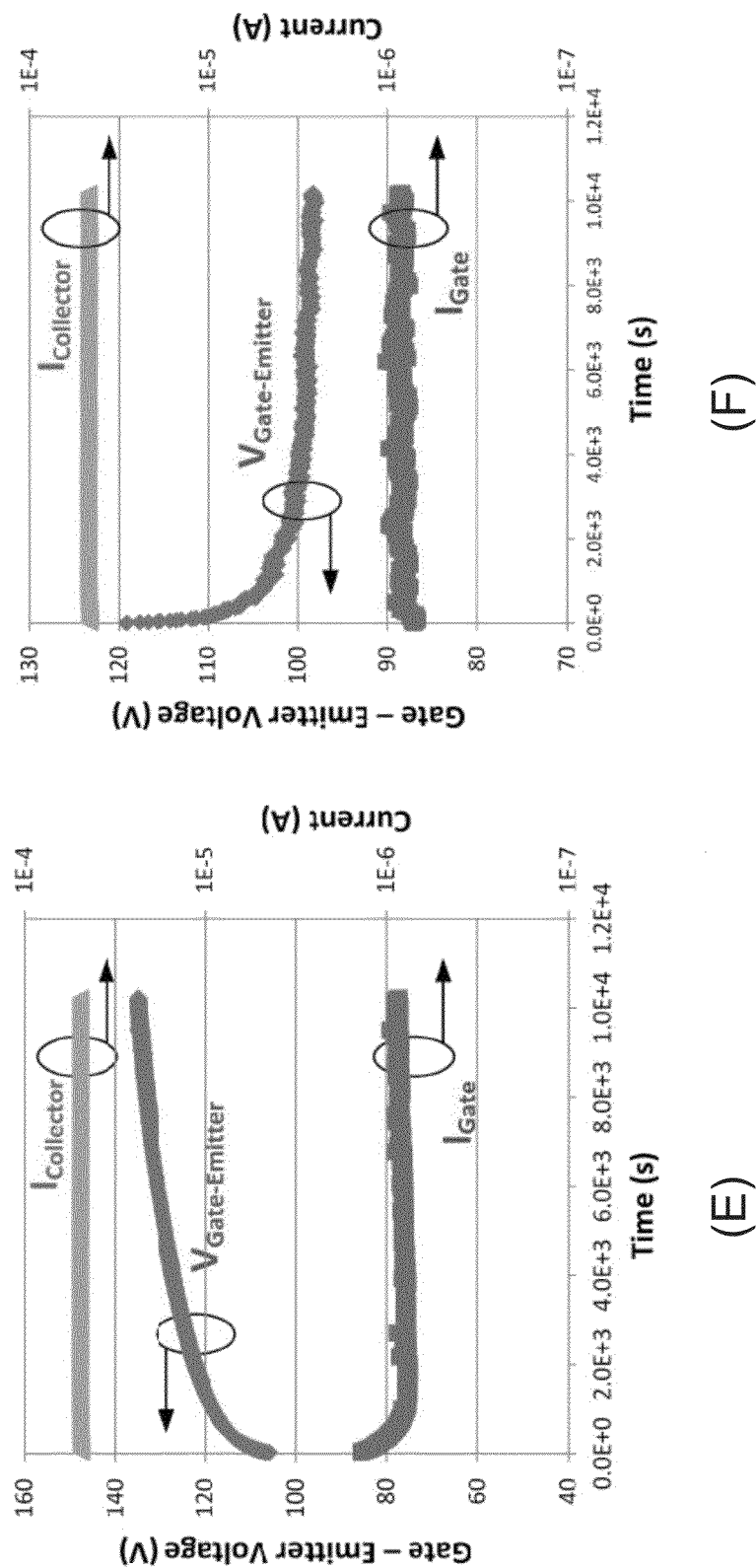

The example self-aligned gated tip arrays can produce more than about 10 mA of emission current at gate-to-emitter bias of about 150 V while the intercepted current by the gate is less than about 20 μA to at maximum emission current. Therefore, the electron transmission through the gate can be better than 99.5% (see FIG. 14A). Such high emission current and gate transmission can be due to the uniformly self-aligned electrode structure of the example devices and nanometer scale tip radius. It is observed that the gate transmission is increased at higher collector voltages, $V_{Collector}$, since electrons that are emitted off-axis have a higher field pulling them towards the collector (FIG. 14B). The Fowler-Nordheim (FN) plot of the emitter current is shown in FIG. 14C. The curve follows classical FN behavior at voltages above 50 V, where the gate leakage through the dielectric is negligible compared to emitted current. The extracted value for the field factor at the tip of the emitters is bigger than about $1 \times 10^6$ cm$^{-1}$. The average radius of curvature at the tip of the emitters is estimated to be less than about 5 nm in good agreement with scanning electron microscopy (SEM) results and extracted field factor.

The long-term behavior of the device is tested at pressures below about $10^{-7}$ Torr by applying a constant emitter current (50 μA) at a constant collector-gate voltage (100 V). The example self-aligned gated tip arrays exhibit excellent characteristics stability with less than about a 4V-increase in the gate-emitter voltage to maintain the current level constant for $10^4$ s (about 3 hrs), as shown in FIG. 14D. The gate current also remains less than 1 μA to for the duration of the measurement. Long-term emission at pressures as high as $10^{-5}$ Torr is demonstrated. The device characteristics are very stable (FIG. 14E) and the emission voltage increases less than about 30 V for a constant emitter current of about 50 μA to for $10^4$ s. The emission characteristics of the device can be recovered by electron emission at pressures in $10^{-7}$-Torr range (FIG. 14F). Stable operation is due to utilizing Pt as the coating of the emitter and also employing a thick gate dielectric (2.5 μm). In these example devices, the electric field intensity in the gate dielectric is limited to 60 V/μm for emission currents as high as 10 mA. This is only a fraction of the breakdown-field for the gate dielectric (>800 V/μm for oxide). Consequently, the dielectric degradation is very slow. The conductive coating of the emitter tips (a Pt coating in this example device) also improves the resistance of the tip against corrosion and sputtering due to corrosive gases and back-streaming ions.

Figure 15:
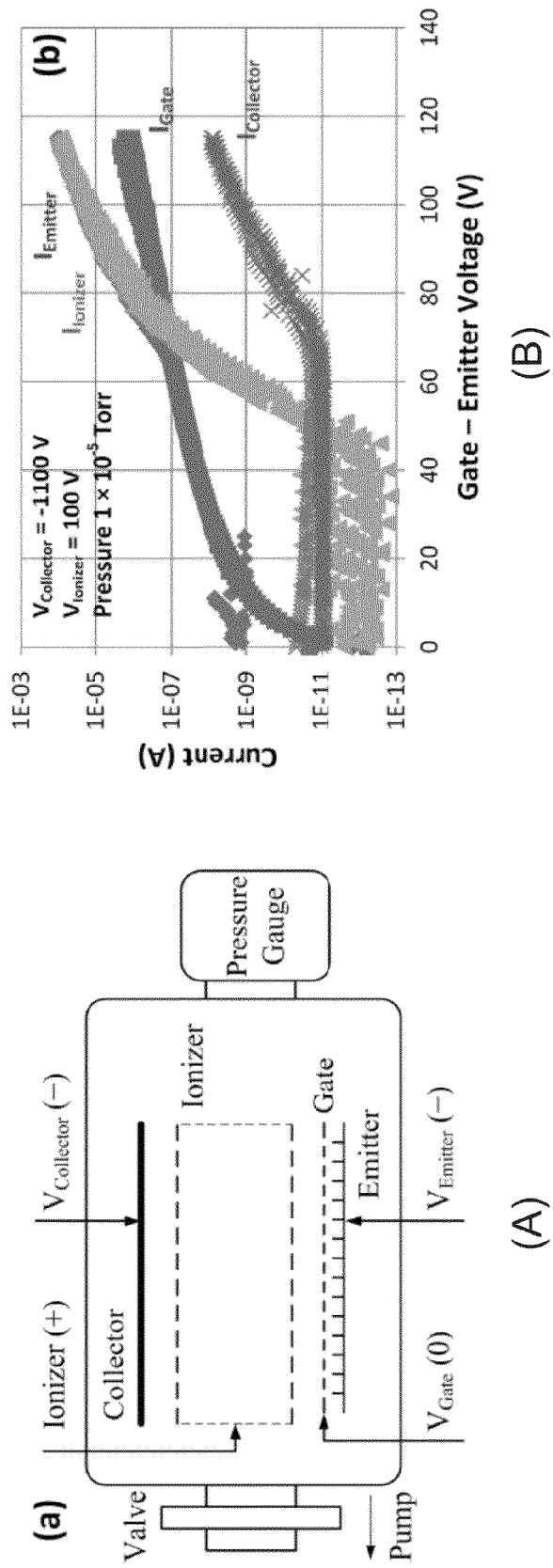
FIGS. 15A-15D show (A) an example measurement setup used for electron impact ionization measurements, and example plots of (B) terminal characteristics versus the gate-emitter voltage, (C) collector current as a function of transmitted electrons, and (D) the ionization efficiency at different pressures, according to principles of the present disclosure.
Figure 15:
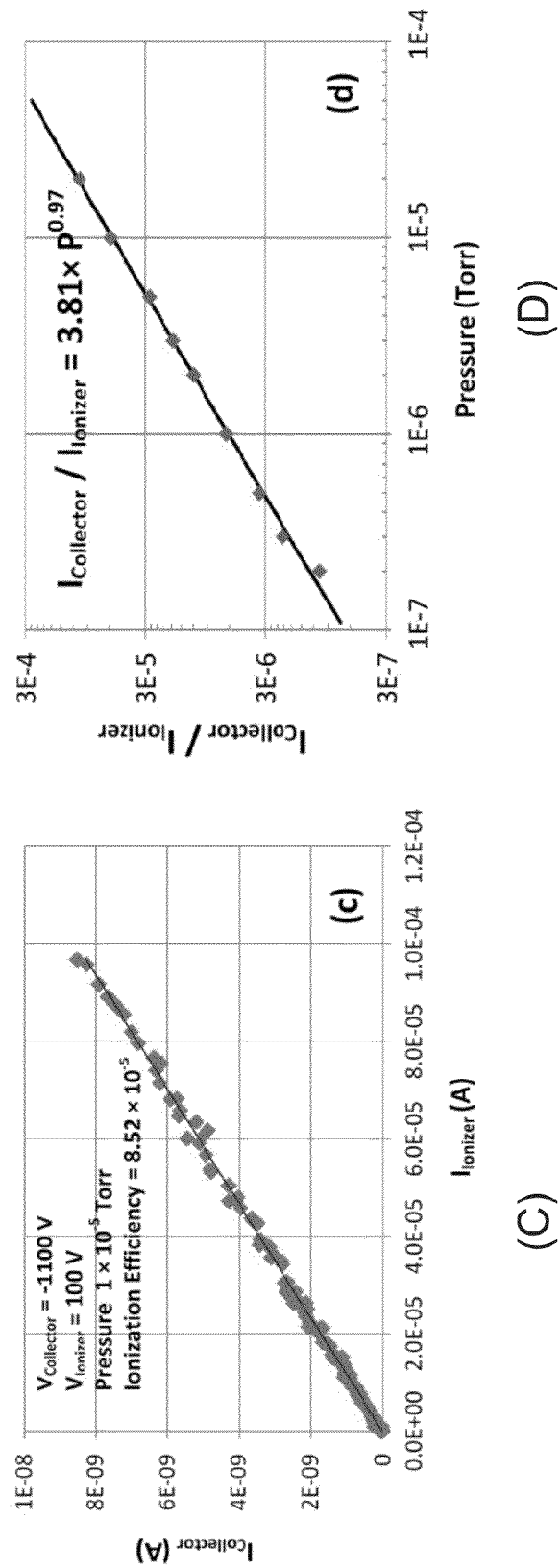

Electron impact ionization is performed at different pressures using field emitters based on the example self-aligned gated tip arrays fabricated according to the systems, methods and apparatus described herein. The setup for electron impact ionization measurements is shown in FIG. 15A. In this measurement, the collector is biased at a high negative voltage (about −1100V) to capture the positive ions and repel the emitted electrons. An additional electrode (ionizer) biased at a positive voltage is placed between the device and collector to extract the emitted electrons for impact ionization. Two parallel meshes are used as ionizers to improve the ionization efficiency by defining a constant-potential region. Nitrogen and helium gases are used to pressurize the measurement chamber. FIG. 15B shows a plot of the terminal characteristics vs. the gate-emitter voltage. FIG. 15C summarizes the experimental results in nitrogen (values of collector current as a function of transmitted electrons). A linear relationship is observed between the ion current collected at the collector and the emitted current captured by ionizer electrode (FIG. 15C), corresponding to the linear dependence between the electron and ion currents for a given pressure in the electron impact ionization model. FIG. 15D shows the ionization efficiency at different pressures. It is observed that the ionization efficiency, i.e., the ratio between the generated ions and the emitted electrons, has a linear dependence on chamber pressure (FIG. 15D). Ion currents as high as about 10 nA are produced using field-emitter arrays biased at about 100 μA emission current, and the device can be used for long-term ion generation at pressures as high as about $10^{-5}$ Torr.

Certain advantages and improvements of systems, methods and apparatus according to the principles described herein over existing methods, devices or materials are described. Large arrays of nano scale Pt-coated gated tips (320k tips in 036 cm$^2$ with radii <5 nm) fabricated as described herein are capable of efficient ionization of gases including helium (with highest ionization potential of 24.6 eV) at voltages as low as about 200V. The ionization voltage is substantially lower than previously achieved in ionizers (which require ionization voltages of above 500V). The reduction in ionization voltage is due to a field factor higher than about $10^6$ cm$^{-1}$ offered by the gated tips with gate aperture radius of about 1.5 μm and estimated tip radius less than about 5 nm. Example devices including the self-aligned gated tip arrays according to the principles described herein can be also used as efficient field emitters and electron impact gas ionizers with emission voltages as low as about 50 V despite the large work function of the platinum coating of the tips ($\phi_{Pt}$~6 eV). The example fabrication processes described herein facilitate large area and low cost fabrication of gated tip arrays. The example fabrication processes provide excellent control over device geometry and can employ thick gate dielectric stacks to improve the reliability and stability of the example devices.

The example devices according to the principles described herein exhibit high reliability and high field factor. The example devices employ thick gate dielectric stacks while the radius of gate aperture can be defined in the 1-micrometer range or smaller using lithography. This results in the example devices having stable gate dielectric properties as the electric field in the insulator layer is reduced, while the emission voltage remains unchanged as the gate aperture and height of the tip are constant. For example, silicon oxide/silicon nitride stacks can be used to enhance the reliability of the example device. Other dielectric stacks also can be employed as the gate dielectric to minimize degradation of gate insulator. The fabrication processes described herein can be implemented to create gated tips with radii below about 5 nm, providing field factor in $10^6$ cm$^{-1}$ for a large array (about 320000 tips in an area of about 0.32 cm$^2$) with gate aperture radii of about 1.5 μm. This allows field ionization at voltages below about 200 V with generated ion current in the nano-Ampere (nA) range. Small extracted average tip radius can be result when the tips are produced and sharpened just before deposition of the coating and are not exposed to any harsh processes such as CMP. In any of the example herein, the tips of the example gated tip arrays can be sharpened using but not limited to an oxidation sharpening process. The uniformity of the tips in an array can be improved based on the self-limiting rate of the oxidation sharpening process, where the geometry of the sharpened tip can be defined by the changes in stress as the dimensions of the tip change throughout the sharpening. Therefore, density of sharper tips among created tips is increased using the example methods of fabrication according to the principles described herein. Moreover, even higher field factors may be obtained by further scaling of the gate aperture. The example devices herein can be coated with a thin coating of a conductive material (such as Pt) to improve the resistance against corrosion or sputtering. To improve the durability of the field ionizer/field emitter arrays, a coating that includes a refractory metal, such as but not limited to Ir, or a refractory metal carbide, such as but not limited to HfC, or ZrC, can be used instead of the Pt.

The example fabrication methods according to the principles described herein provide simplicity and high yield of fabrication. The example process flows described herein for fabricating the gated tip arrays includes processing steps that can be performed industrially over large-area substrates. By comparison, a process such as the Spindt method may require specialized processes, such as rotating the wafer and highly directional deposition with a grazing angle of incidence. Such a process may not be desirable for large area arrays, as it can result in non-uniform deposition. The example fabrication methods according to the principles described herein also exhibit some advantages over the CMP-based approach, since the example fabrication methods can accommodate a wide variation in the CMP step that planarizes the substrate. Also, the possibility of damaging the tips and gate electrode can be eliminated as the gate is defined by lithography and the emitter tips using etching and oxidation sharpening.

Moreover, in an example fabrication methods according to the principles described herein, a single CMP step can be used for defining a gate insulator with a thickness independent of the gate aperture size. By contrast, existing CMP-based approaches may require at least two such CMP stages (where the gate aperture is defined by CMP-based processes). Furthermore, the formation of a post in the cavity as well as multiple depositions of sacrificial and emitter material may be necessary if a Spindt method is used for fabrication. The simplicity of the example fabrication methods according to the principles described herein, large area compatibility of the example processes employed, and the large tolerance against processing conditions, provides a high yield fabrication approach that is suitable for producing large arrays of field emitters and field ionizers. More than 30 example devices fabricated over a 6-inch wafer tiled 15 mm center to center are characterized, each device being an array of 320000 gated tips in an area of about 0.32 cm$^2$ (of a 6 mm×6 mm active area).

Example fabrication methods according to the principles described herein facilitate enhanced control over device structure. An advantage of the example fabrication methods is the ability to control the tip position with respect to the gate plane while the thickness of the gate dielectric is increased and the gate aperture radius is kept constant. This can be difficult to achieve with other existing methods, particularly for large arrays. In the example fabrication methods herein, the height of the tip can be simply controlled and even raised above the gate plane by selective etching of the oxide after deposition and planarization of the oxide layer.

The example fabrication methods according to the principles described herein are applicable to many commercial applications. The following are examples of commercial applications for the example devices that include the self-aligned gated tip arrays, either as gas ionizers or as cathodes. For gas ionization, the example devices can be implemented as portable neutron generators for oil well logging or detection of shielded nuclear materials, for ion guns, in mass spectrometers, in gas sensors, for helium (He) ion-beam microscopy and metrology systems, and/or for space propulsion (including ion thrusters and micro-thrusters). For electron emission, the example devices can be implemented in electron microscopes, microwave power amplifiers, terahertz generators, electron-beam lithography systems, X-ray generators, high-energy accelerators, field emission displays, vacuum electronics for high temperature and high-energy radiation environments, and/or neutralizers for electric space propulsion.

A non-limiting example implementation, the example devices including the self-aligned gated tip arrays can be used to generate field emission at amp-levels. As a non-limiting example, the example devices including the self-aligned gated tip arrays can be formed as large-area arrays of self-aligned gated nano-scale tips. In an example, the self-aligned gated nano-scale tips can be coated with a conductive material, such as but not limited to platinum. The example devices including the self-aligned gated tip arrays can be used for field emission in the terahertz regime.

The terahertz regime offers unique opportunities for wide range of applications including broadband communication, chemical sensing, and imaging. A compact, high-power (1-100 mW) source in the frequency range from about 1 THz to about 10 THz would be beneficial for these applications. Existing electronic sources can be limited by velocity saturation and breakdown. Optical sources based on population inversion can require cryogenic temperatures. The sources utilizing free electron lasers are generally not compact. By contrast, micro-electro-mechanical system (MEMS) versions of vacuum electronic devices, such as but not limited to klystrons and travelling wave tubes, could produce mW-level coherent THz radiation. They are based on velocity modulation of electrons, which may not be constrained by scattering or breakdown phenomena. Reliable low-voltage electron sources that can produce long-term continuous emission currents of 0.1-10 A at 1-10 A/cm$^2$ current densities would be beneficial to produce these devices.

Electron sources based on field emission can demonstrate emission at low voltages (<100 V) with current densities >10 A/cm$^2$. However, simultaneous high-current, high-current-density, long-term, and continuous emission has not been demonstrated previously. Existing field emission arrays (FEAs) generally have not produced currents >180 mA (for arrays with 10000 tips). Existing fabrication processes can exhibit low fabrication yield, and the fabricated tip arrays can exhibit non-uniform emission, resulting in severe tip sub-utilization. The failure of devices fabricated using existing techniques can occur due to gate dielectric breakdown, tip burn-out, or back ion bombardment.

The example methods described herein for manufacturing the example devices including the self-aligned gated tip arrays can be used as a high-yield fabrication process for large-area self-aligned gated tip arrays. The example methods described herein for fabricating the gated tip arrays exhibit low process sensitivity. That is, various parameters of the example methods can be varied with little change in the quality and uniformity of the fabricated gated tip arrays or example devices that include the self-aligned gated tip arrays.

In this example, the self-aligned gated tip arrays can be generated to have thick gate insulators. The example devices including the self-aligned gated tip arrays produced according to the methods described herein can be configured to exhibit high current emission and improved reliability.

In an example implementation, the example methods described herein can be used to generate large arrays, e.g., arrays with about 320000 tips. The example devices including the self-aligned gated tip arrays can be configured to emit currents as high as about 0.35 A. This value is about twice that achievable with existing devices. The example methods can be readily scaled-up to generate gated tip arrays that are greater in dimensions, such as by a factor of 10 or more, at the same densities.

Figure 16:
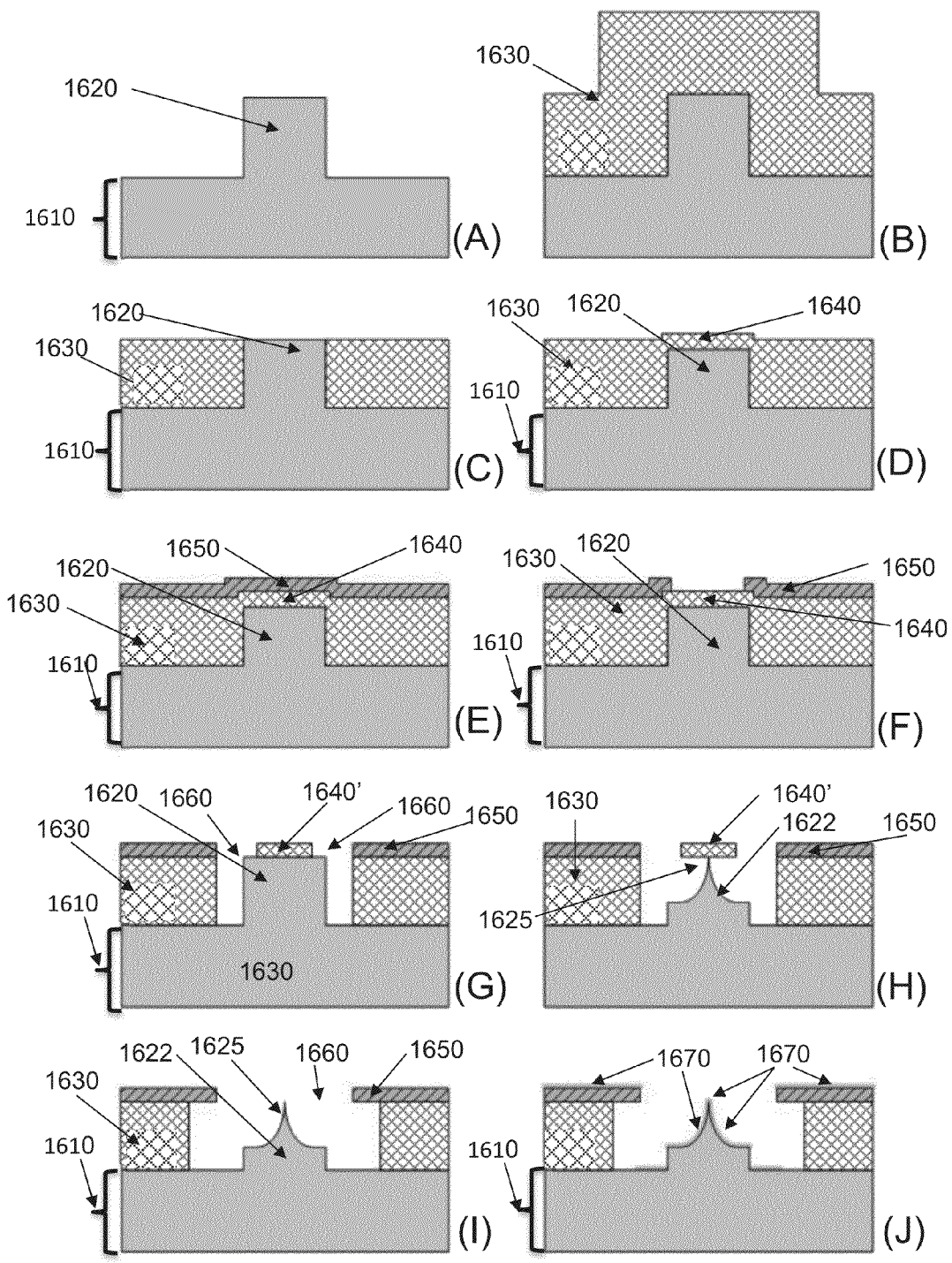
FIGS. 16A-16J show an example fabrication process, according to principles of the present disclosure.

Another non-limiting example implementation of a fabrication process according to the principles described herein is illustrated in FIGS. 16A-16J. In this example, the process performed using a Si substrate. However, as described hereinabove, the process can be performed using many other types of semiconductor, dielectric or conductive materials. In this example, the dielectric layer 1630 is formed from SiO. However, in other examples, the dielectric layer can be formed from other types of dielectric materials. The fabrication process of FIGS. 16A-16J is shown for a single gate electrode. However, the device can be fabricated with multiple self-aligned gates. In the example of FIG. 16A, the fabrication process begins with a Si substrate 1610, with a portion that is etched to form a Si pillar 1620 (an example of a post structure). Formation of the pillar 1620 allows for deposition of a thick gate dielectric stack while the gate aperture is defined independently in a later step. As shown in FIG. 16B, the gate dielectric 1630 is deposited and the system can be planarized (see FIG. 16C) to expose the Si pillars 1620 using a planarization process, such as but not limited to a chemical mechanical polishing (CMP) process or lapping. In FIG. 16D, a thin layer of a dielectric material 1640 (such as but not limited to an oxide of Si) is grown or deposited over the exposed Si pillars 1620. This dielectric material layer 1640 serves as the etching barrier during the anisotropic etching of Si carried out to form the tips. In FIG. 16E, a layer 1650 of SiN is deposited. The SiN of layer 1650 is disposed over the dielectric material 1640 and the dielectric layer 1630. As shown in FIG. 16F, the dielectric layer 1650 over the region of the Si pillars 1620 is etched. For example, using a lithography step, an oxide cap (serving as an etch barrier) can be defined over the Si pillar 1620 and the dielectric layer 1650 can be simultaneously etched. In this example, the layer 1650 is described as a SiN layer. In another example, the dielectric layer 1650 can be formed from other materials with similar electrical properties.

In the example of FIG. 16G, a mask is disposed over the structure and it is etched to define a gate opening (gate aperture 1660). The gate opening in the mask used for etching the stack layer 1650 in FIG. 16G can be configured to have a larger opening than the opening etched in the dielectric layer 1650 during the second lithography step (in FIG. 16F). As a result, the oxide cap 1640' that defines the tip is placed exactly at the center of the gate aperture 1660. This ensures a self-aligned structure for the field ionizers/emitter devices. In FIG. 16H, an isotropic dry etching process is performed to generate the emitter 1622 and an oxidation sharpening process is performed to form the emitter tips 1625. In FIG. 16I, the oxide cap 1640' is etched through the gate aperture 1660 to release the emitter tips 1625. As shown in FIG. 16J, a thin layer of an electrically conductive material 1670 (such as but not limited to platinum (Pt), can be deposited over the gate dielectric 1650, the emitter tip 1625, and portions of the emitter 1622 to improve the gate conduction and also protect the emitter tip 1625. In this example, the conductive material 1670 serves as the gate electrode.

Figure 17:
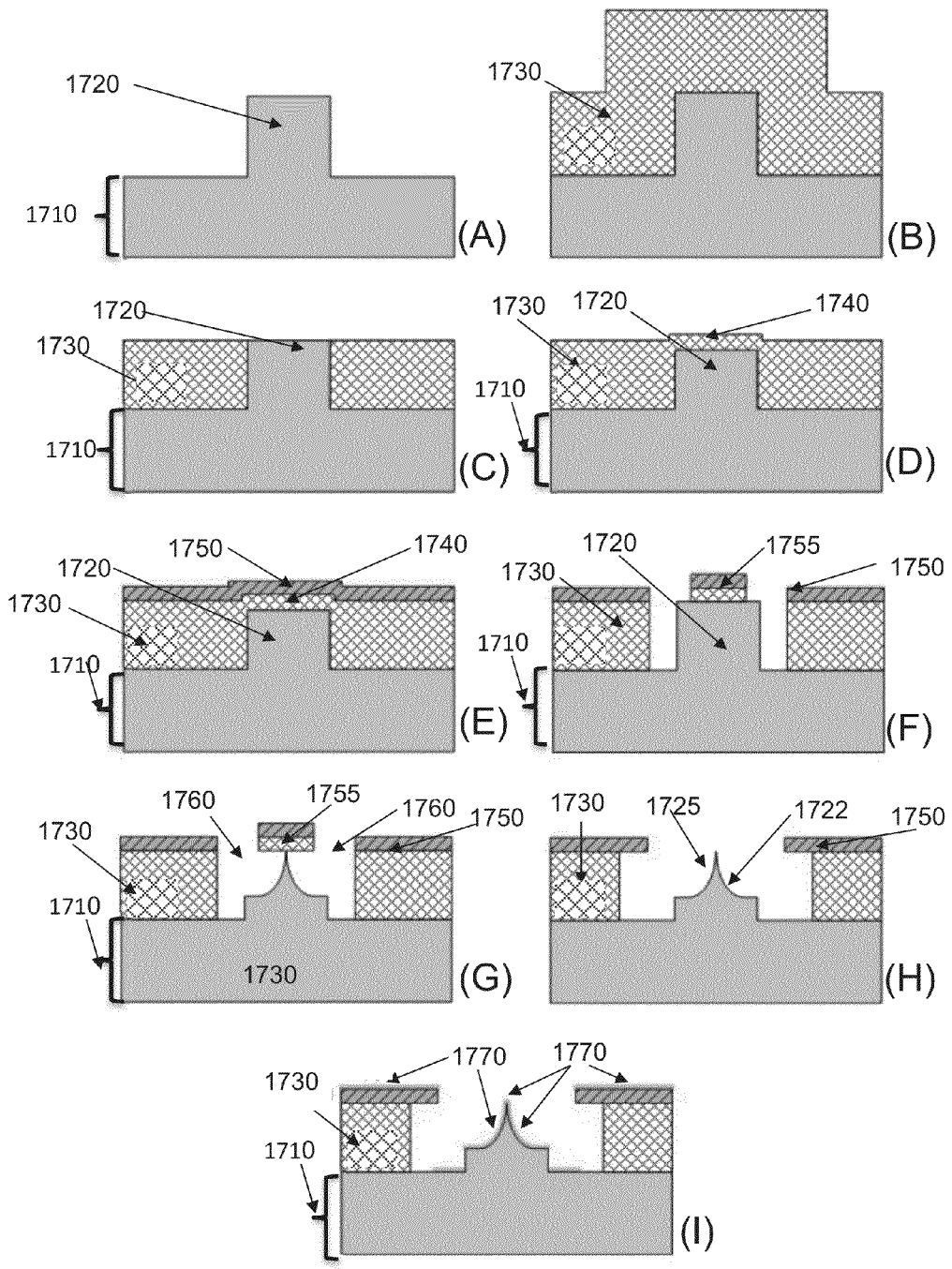
FIGS. 17A-17I show an example implementation of a fabrication process, according to principles of the present disclosure.

Yet another non-limiting example implementation of a fabrication process according to the principles described herein is illustrated in FIGS. 17A-17I. In this example, the process performed using a Si substrate. However, as described hereinabove, the process can be performed using many other types of semiconductor, dielectric or conductive materials. In this example, the dielectric layer 1730 is formed from SiO. However, in other examples, the dielectric layer can be formed from other types of dielectric materials. The fabrication process of FIGS. 17A-17I is shown for a single gate electrode. However, the device can be fabricated with multiple self-aligned gates. In the example of FIG. 17A, the fabrication process begins with a Si substrate 1710, with a portion that is etched to form a Si pillar 1720 (an example of a post structure). Formation of the pillar 1720 allows for deposition of a thick gate dielectric stack while the gate aperture is defined independently in a later step. As shown in FIG. 17B, the gate dielectric 1730 is deposited and the system can be planarized (see FIG. 17C) to expose the Si pillars 1720 using a planarization process, such as but not limited to a chemical mechanical polishing (CMP) process or lapping. In FIG. 17D, a thin layer of a dielectric material 1740 (such as but not limited to an oxide of Si) is grown or deposited over the exposed Si pillars 1720. This dielectric material layer 1740 serves as the etching barrier during the anisotropic etching of Si carried out to form the tips. In FIG. 17E, a layer 1750 of SiN is deposited. The SiN of layer 1750 is disposed over the dielectric material 1740 and the dielectric layer 1730. As shown in FIG. 17F, the dielectric layer 1750 and the dielectric material 1740 over the region of the Si pillars 1720 are etched to provide a cap 1755. For example, using a lithography step, the cap 1755 (serving as an etch barrier) can be defined over the Si pillar 1720, and the dielectric layer 1750 and the dielectric material 1740 can be simultaneously etched. In this example, the layer 1750 is described as a SiN layer. In another example, the dielectric layer 1750 can be formed from other materials with similar electrical properties. The gate opening in the mask used for etching the dielectric layer 1750 and the dielectric material 1740 in FIG. 17F can be configured to have a larger opening than the lateral dimension of the post structure, pillar 1720. As a result, the etching barrier (cap 1755) that defines the tip is placed exactly at the center of the resultant gate aperture 1760. This ensures a self-aligned structure for the field ionizers/emitter devices.

In FIG. 17G, an isotropic dry etching process is performed to generate the emitter 1722 and an oxidation sharpening process is performed to form the emitter tips 1725. In FIG. 17H, the oxide cap 1755 is etched through the gate aperture 1760 to release the emitter tips 1725. As shown in FIG. 17I, a thin layer of an electrically conductive material 1770, such as but not limited to platinum (Pt), can be deposited over the gate dielectric 1750, the emitter tip 1725, and portions of the emitter 1722 to improve the gate conduction and also protect the emitter tip 1725. In this example, the conductive material 1770 serves as the gate electrode.

Figure 18:
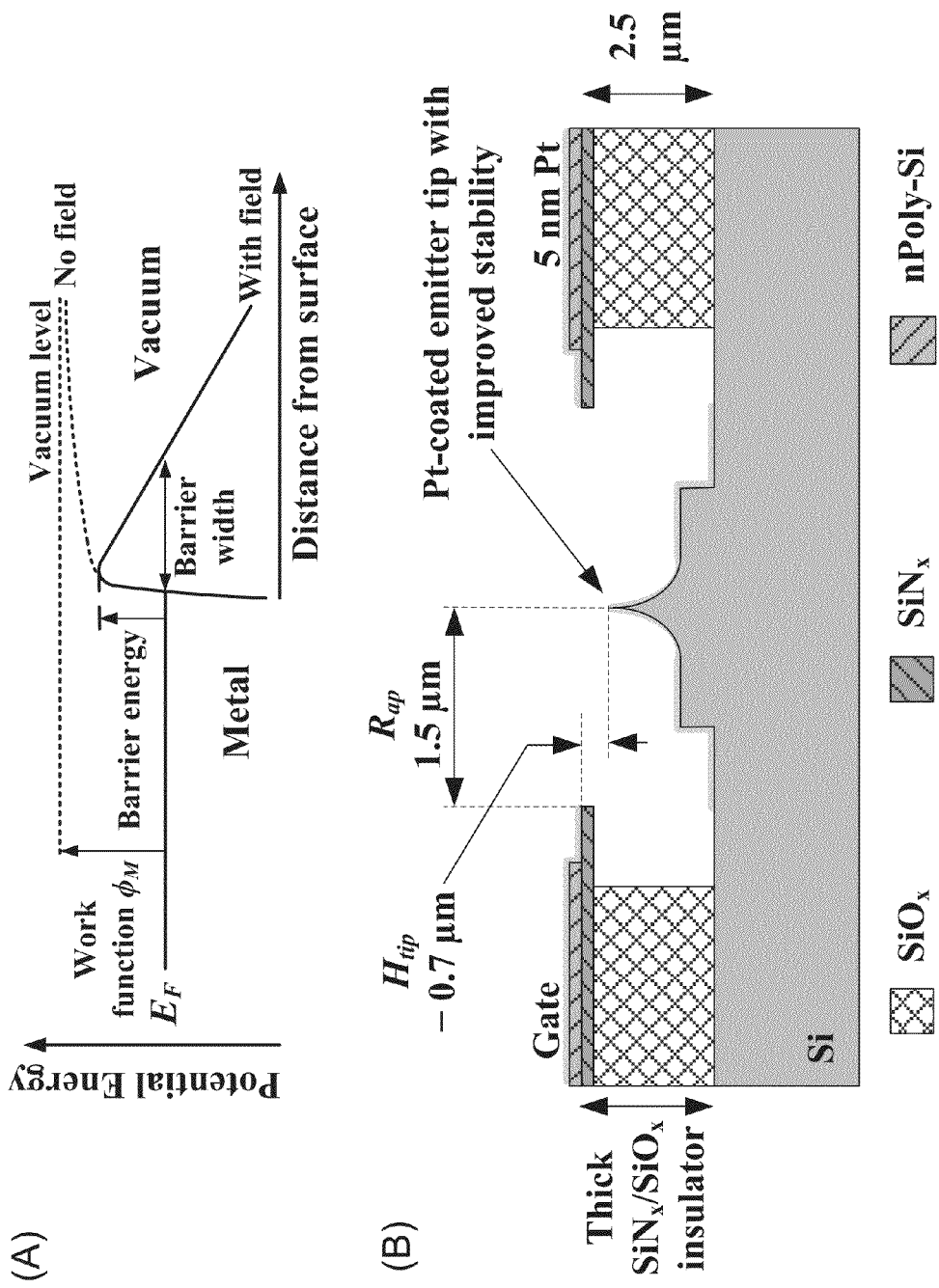
FIG. 18A shows an example potential energy diagram.
FIG. 18B shows an example cross-section schematic of an example self-aligned gated tip, according to principles of the present disclosure.

As a non-limiting example, example self-aligned gated tip field-emitter arrays are described that can be operated at high currents. FIG. 18A shows an example potential energy diagram of electrons at the vicinity of a metal surface with and without application of a normal electrostatic incident field. FIG. 18B shows a cross-section schematic of an example self-aligned gated tip fabricated according to the example methods described herein. The example devices including the self-aligned gated tip arrays can be configured with a thick gate dielectric, such as but not limited to a gate dielectric having a thickness greater than about 2.5 μm. In an example, the self-aligned gated tips can be configured with a thick gate dielectric stack (such as but not limited to a $SiO_x/SiN_x$ gate dielectric stack), with thickness of greater than about 2.5 μm. An example self-aligned gated tip array with thicker gate dielectrics can facilitate reliable operation, as the field in the dielectric can be a fraction of the breakdown field ($E_C\sim1000$ V/μm).

An example self-aligned gated tip array according to the principles described herein can be fabricated with tips that are coated with an electrically conductive coating to improve resistance of the tips to corrosive gases and/or ions. For example, an example self-aligned gated tip array according to the principles described herein fabricated with a platinum coating can exhibit such improved resistance of the tips to corrosive gases and/or ions. Computations of field emission properties project that an example self-aligned gated tip array, fabricated according to the principles described herein, with a tip coating of an electrically conductive material at a thickness of about 5 nm (such as a Pt-coated tip) can be operated to emit currents greater than about 1 μA when exposed to fields of about 20 V/m to about 30 V/nm. As a result, current densities of greater than about 1 A/cm² can be achieved for a self-aligned gated tip array at a 10 μm tip-to-tip spacing.

Figure 19:
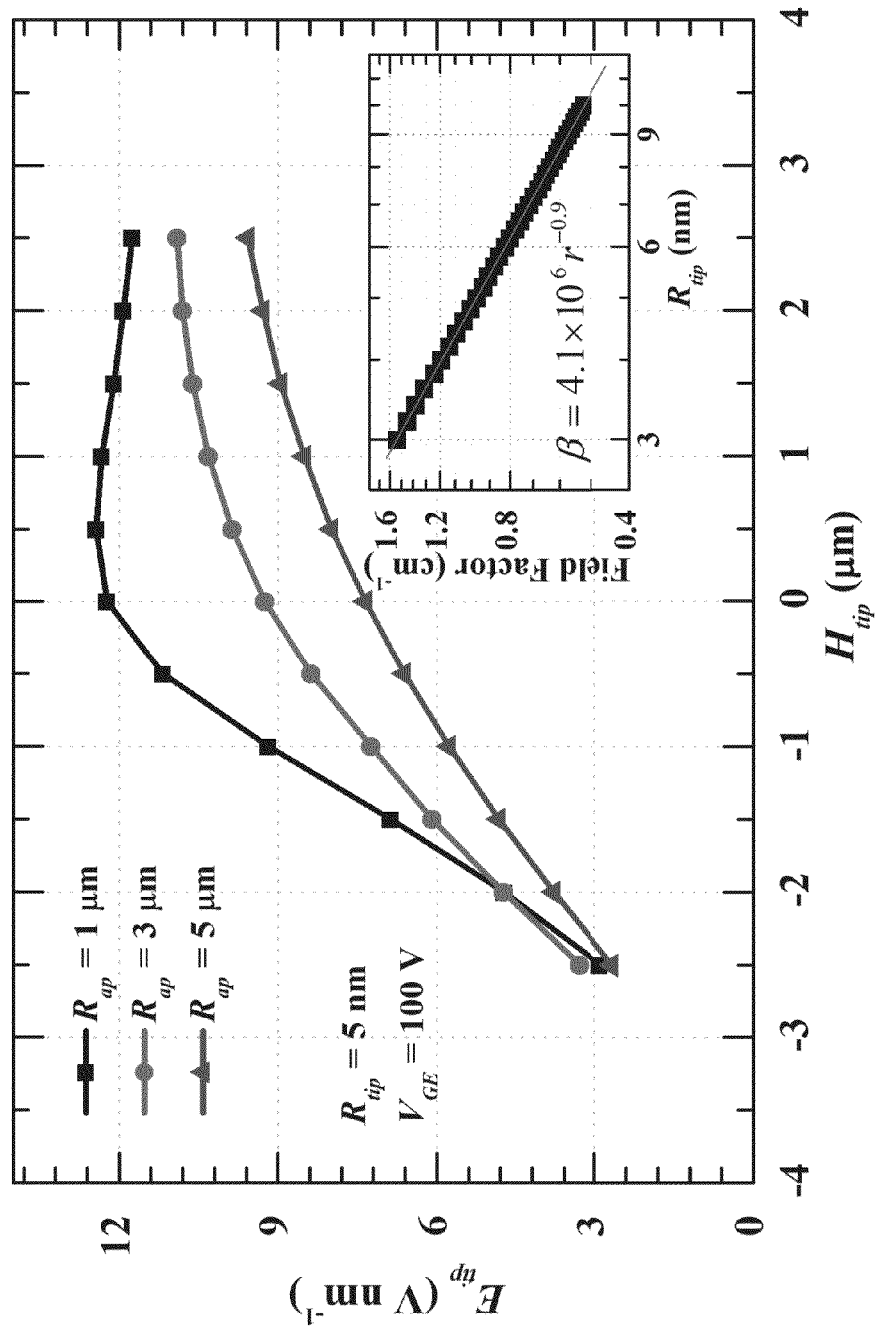
FIG. 19 shows an example simulation from a computation of an electric field at the tip of a self-aligned gated tip, according to principles of the present disclosure.

FIG. 19 shows an example simulation from a computation of an electric field at the tip of a self-aligned gated tip fabricated according to the principles described herein, as a function of tip height, $H_{tip}$, for different gate aperture radii, $R_{ap}$ (i.e., $R_{ap}$ of about 1 μm, about 3 μm or about 5 μm). Based on the computations of FIG. 19, fields ($E_{tip}$) that are desirable for high-current field emitters can be achieved using an example self-aligned gated tip array at gate-to-emitter voltages ($V_{GE}$) of less than about 300 V, using a gate aperture of radius ($R_{ap}$) less than about 4 μm, and a tip of about 5 nm, that is disposed below the gate plane at about 1 μm or less ($H_{tip}$). In FIG. 19, negative values of $H_{tip}$ correspond to example self-aligned gated tip array structures with tips disposed below the gate plate. The inset to FIG. 19 shows a plot of the extracted field factor versus the tip radius, $R_{tip}$. In an example device including self-aligned gated tip arrays fabricated according to the principles described herein, a gate dielectric stack thicker than 2.5 μm can be employed to maintain the field ($E_{tip}$) at less than about 150 V/μm at a $V_{GE}$ less than about 300 V. The emitter tips can be fabricated from 3 μm-tall pillars embedded in dielectric matrix (such as but not limited to a $SiO_x$ matrix), to facilitate definition of a thick gate dielectric. The example device including self-aligned gated tip arrays with thicker gate dielectric can exhibit greater reliability than existing devices.

Figure 20:
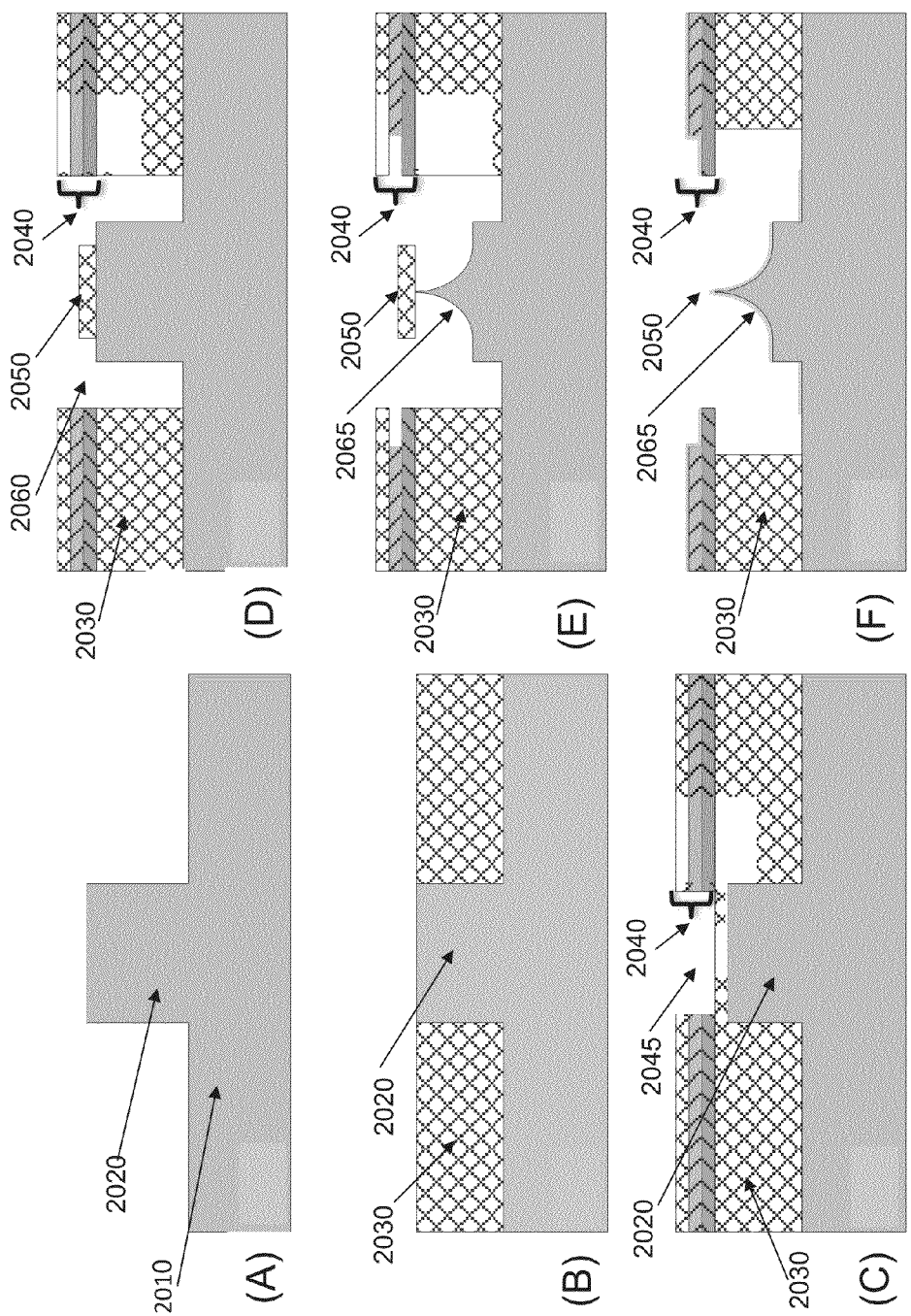
FIGS. 20A-20F show an example fabrication process flow, according to principles of the present disclosure.

FIGS. 20A-20F show an example fabrication process flow according to the principles described herein, including the methods, for fabricating a self-aligned gated tip array. As shown in FIG. 20A, a Si pillar 2020 is formed on a substrate 2010, e.g., using an etching process. In FIG. 20B, a dielectric material 2030 is deposited (e.g., SiOx) to substantially surround a Si pillar 2020, thereby forming the intermediate layer. The system can be planarized. As shown in FIG. 20C, a gate stack 2040, including at least one dielectric layer and at least one conductive layer, can be deposited. A via 2045 can be etched through the gate stack 2040 to expose on portion of dielectric material that can be used to serve as an etching barrier. As shown in FIG. 20D, the gate aperture 2060 and the oxide cap 2050 are defined, e.g., using an etching process. In FIG. 20E, a Si isotropic etching process is performed to generate the tip 2065. Other processing, including oxidation sharpening and oxide etching are performed and a layer of electrically conductive material is deposited (e.g., Pt deposition) to generate the self-aligned gated tip of FIG. 20F. In this non-limiting example, the self-aligned gate is formed by a single etching step that simultaneously defines the oxide cap 2050 and generates the tips 2065. For example, a combination of isotropic Si etching and dry oxidation is employed to produce the tips. The dry oxidation step can be performed at low temperatures (900-950° C.), where the tip radius is defined by stress retarded oxidation. The fabrication processes described herein can be used to generate highly uniform tips with thick gate dielectric stacks across large-area arrays.

Figure 21:
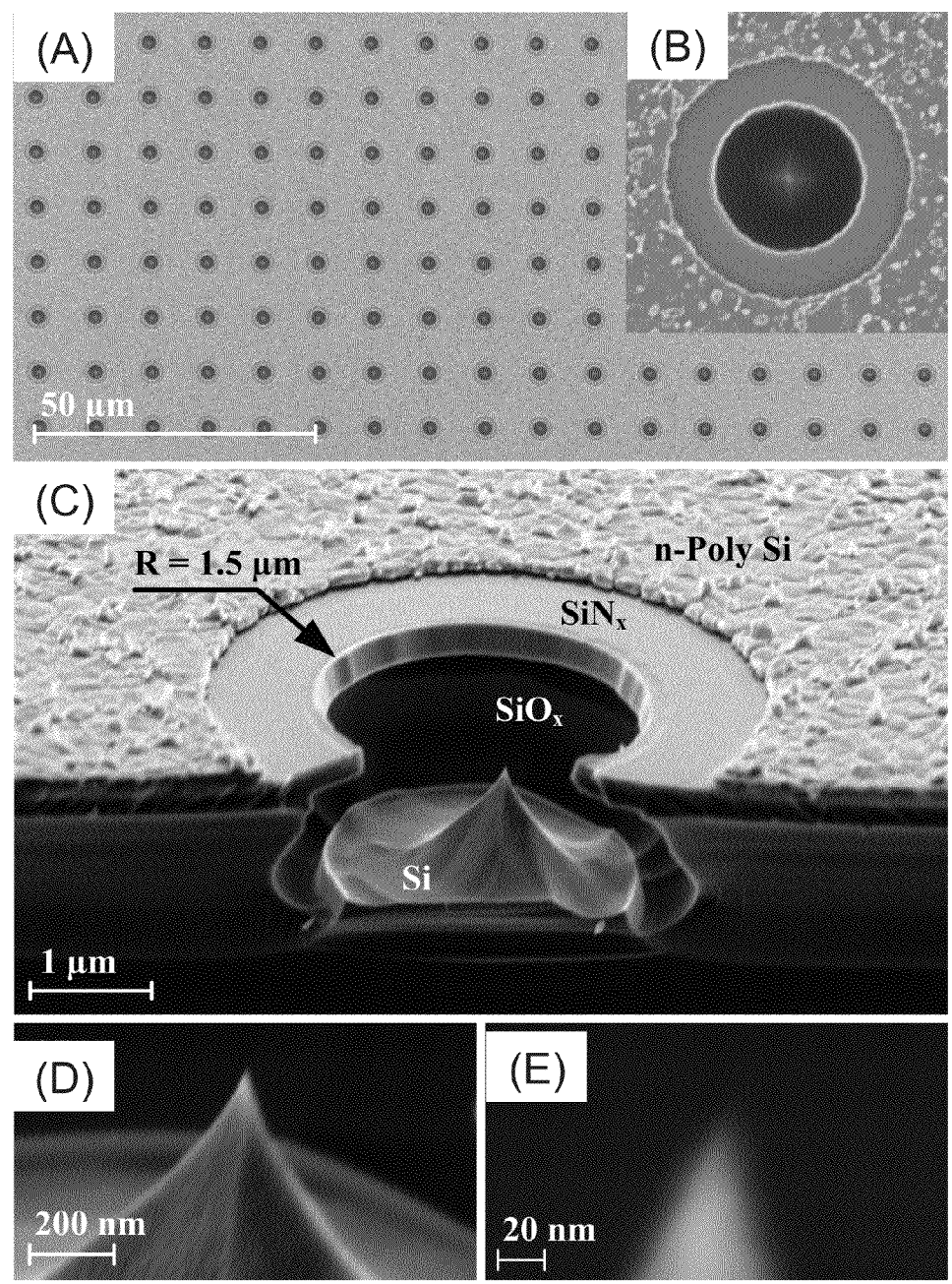
FIGS. 21A-21E show scanning electron microscope (SEM) images of a non-limiting example implementation to fabricate example self-aligned gated tip arrays, according to principles of the present disclosure.

FIGS. 21A-21E show scanning electron microscope (SEM) images of a non-limiting example implementation to fabricate example arrays composed of 320000 tips in about 0.32 cm² area, with approximately 2.5-μm-thick gate dielectric, about 3 μm gate apertures, and tips about 5 nm tip radii. FIG. 21A shows an SEM image of top view of the fabricated array. FIG. 21B shows a single gated tip cell. FIG. 21C shows a portion of a cross-section of a single gated tip cell. FIG. 21E shows a close-up images of a gated tip with about 2.5 μm-thick gate dielectric and about 1.5 μm gate radius of aperture. The SEM images demonstrate that the fabrication processes described herein can be used to generate substantially uniform self-aligned gated tip structure of a device with tip radii of less than about 5 nm.

Figure 22:
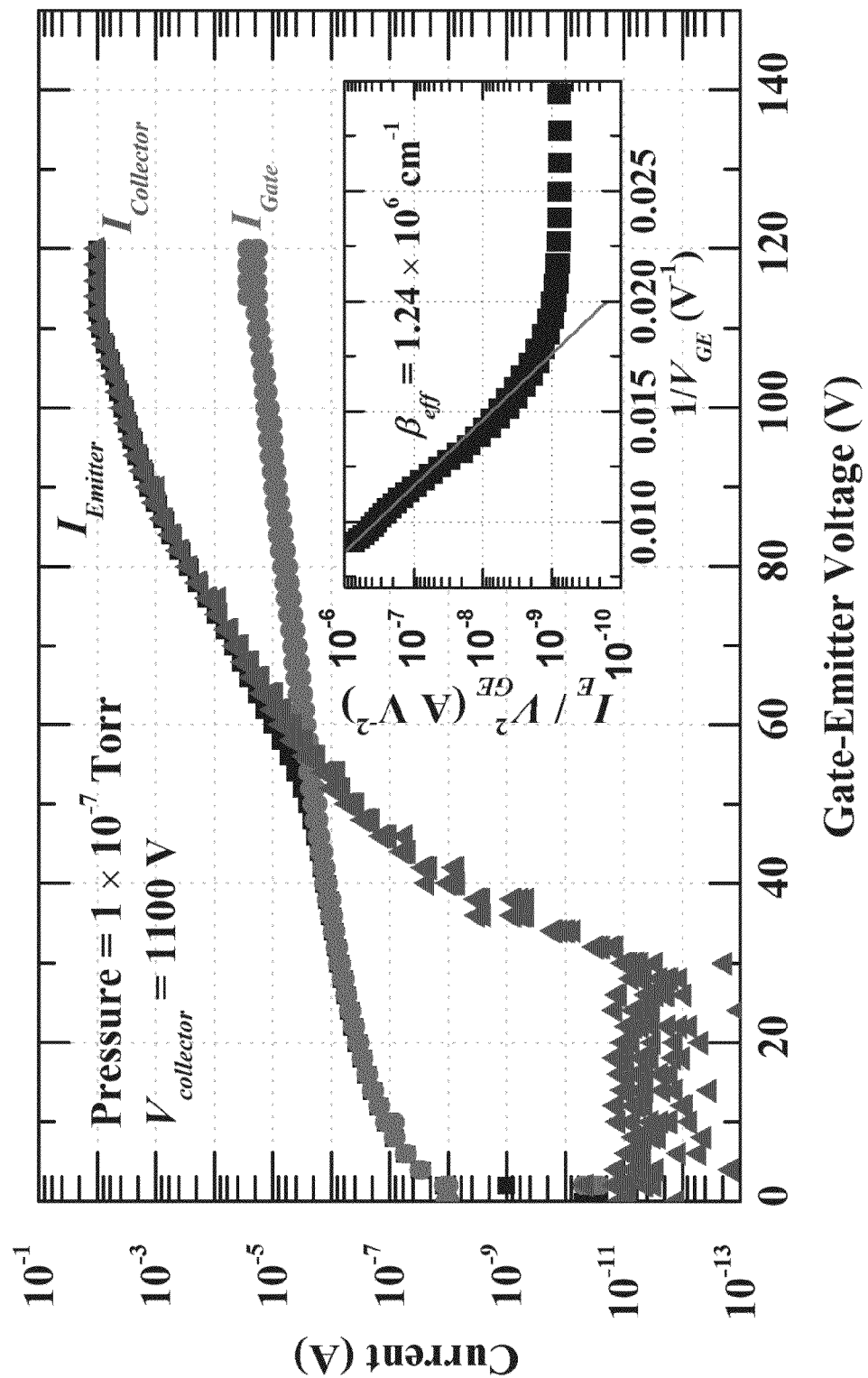
FIG. 22 shows an example of a transfer characteristics of an example 320000-tip array with 5 nm Pt-coating, according to principles of the present disclosure.

FIG. 22 shows the transfer characteristics of an example 320000-tip array with 5 nm Pt-coating. The measurements are limited to 10 mA by the measurement system. FIG. 22 shows the field emission characteristics of a fabricated array with 5 nm Pt-coating. The inset to FIG. 22 shows the Fowler-Nordheim (FN) plot of emission current, indicating an average field factor of $1.24\times10^6$ cm$^{-1}$ and tip radii below 5 nm estimated from simulation results (see FIG. 19). The FN plot of the inset of FIG. 22 indicates an effective field factor $(\beta)>10^6$ cm$^{-1}$, in good agreement with simulations. The emission characterization at high currents (up to 0.35 A) is conducted with 100 μs pulses on emitter with collector biased at 1-3 kV.

Figure 23:
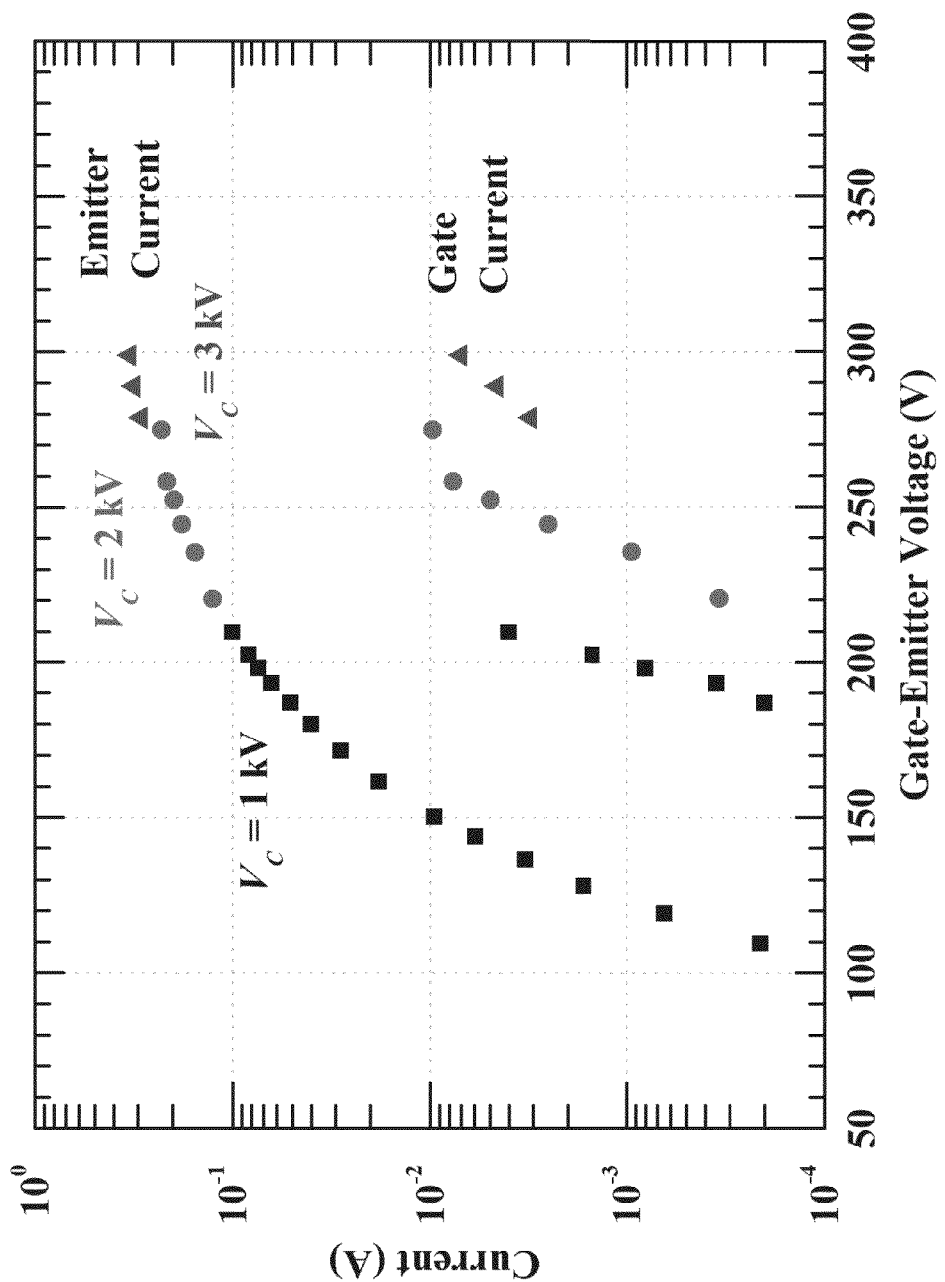
FIG. 23 shows example measures of gate and emitter currents as a function of $V_{GE}$ for an example self-aligned gated tip array, according to principles of the present disclosure.

FIG. 23 shows example measures of gate and emitter currents as a function of $V_{GE}$ for an example self-aligned gated tip array that is coated with a Ti/Pt coating. This for an example self-aligned gated tip array produce currents as high as 0.35 A (i.e., about 1.1 μA/tip~1.1 A/cm²) emitted at gate-emitter voltage ($V_{GE}$) of about 300 V. The average emitted current per tip increased from about 250 nA for a Si tip to about 1.1 to for Ti/Pt-coated tip.

Figure 24:
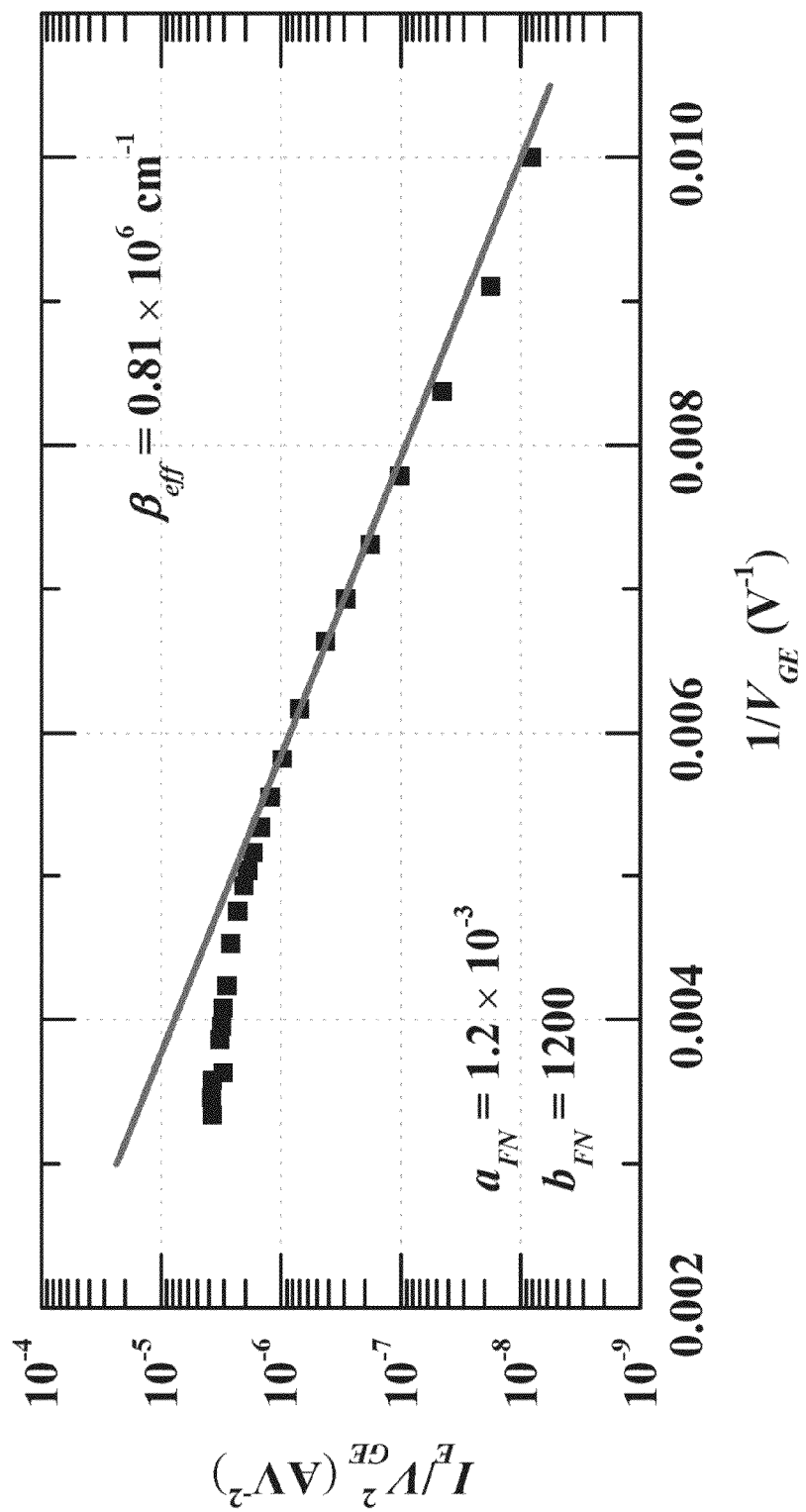
FIG. 24 shows example plots of emission current for an example Ti/Pt-coated self-aligned gated tip array, according to principles of the present disclosure.

FIG. 24 shows example plots of emission current for an example Ti/Pt-coated self-aligned gated tip array. The FN plot of the current (FIG. 24) is linear at voltages less than about 200 V, confirming a $\beta>0.8\times10^6$ cm$^{-1}$ slightly lower than that for Pt-coated devices ($1.24\times10^6$ cm$^{-1}$). A field factor of about $0.81\times10^6$ cm$^{-1}$ is obtained for the tips with a 40 nm-thick coating. Deviation of emission characteristics from FN behavior at high current is associated with limitation in supply of the electrons from the substrate. The deviation from FN characteristics at higher voltages (>200 V) can be due to electron supply limitation.

Figure 25:
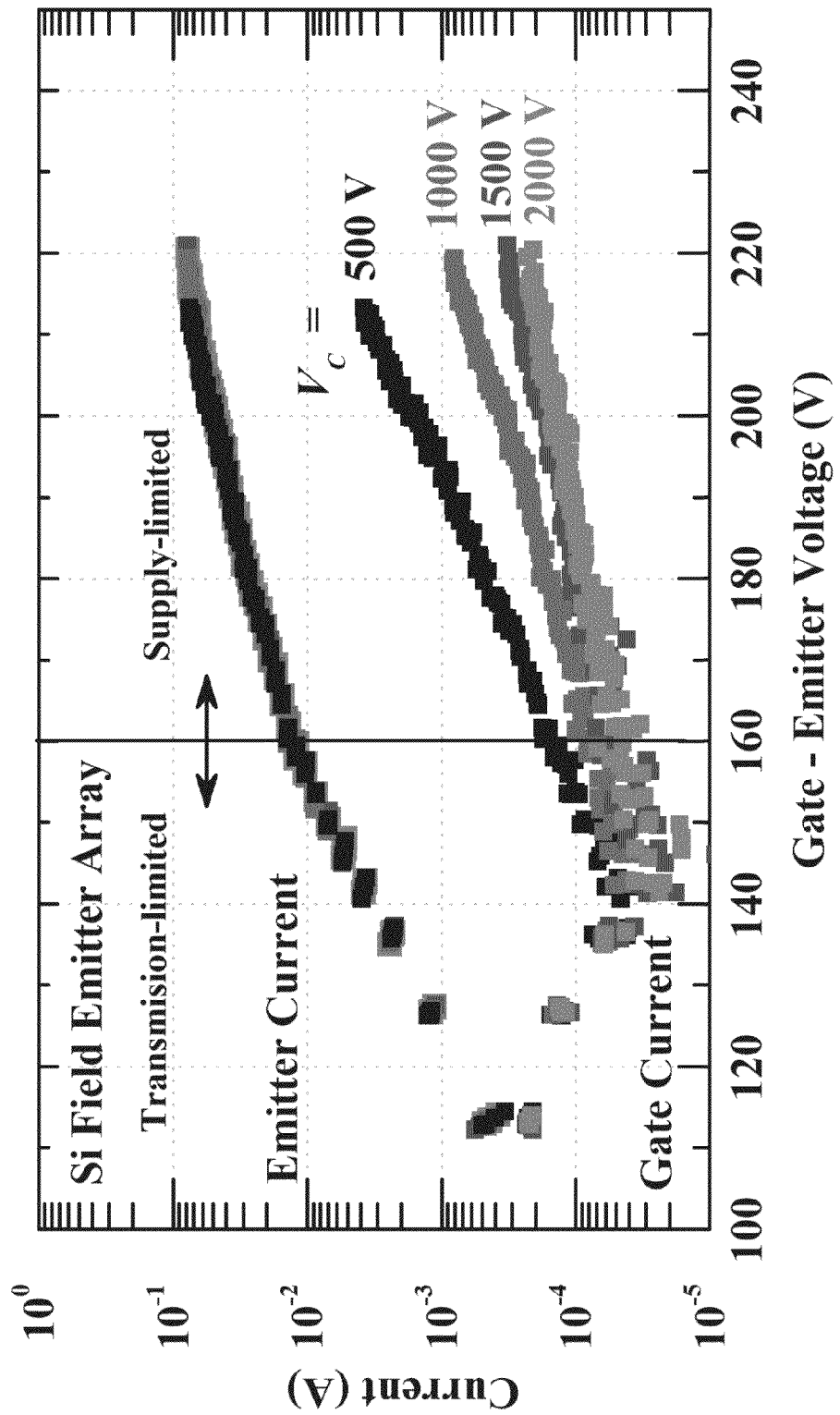
FIG. 25 shows emission characteristics of an example self-aligned gated tip array of Si tips, at different collector voltages, according to principles of the present disclosure.

FIG. 25 shows emission characteristics of an example self-aligned gated tip array of Si tips, at different collector voltages. For an uncoated Si array, current saturation is observed at lower currents of less than about 80 mA, corresponding to about 250 nA per tip. The emission current saturates at currents of about 250 nA/tip, potentially due to limitation in electron supply. Emitter current is shown to be independent of collector voltage, while gate current is reduced at higher collector voltages (potentially due to stronger extraction fields). Increasing the collector voltage does not change emission current. It caused a reduction in the gate current, due to stronger extraction fields. Field emission at voltages greater than about 200 V for the Si array and greater than about 250 V for Ti/Pt coated tip arrays can be accompanied with sporadic plasma strike events (large positive gate voltages and ampere-level emission currents) that may short the gate to emitter.

Figure 26:
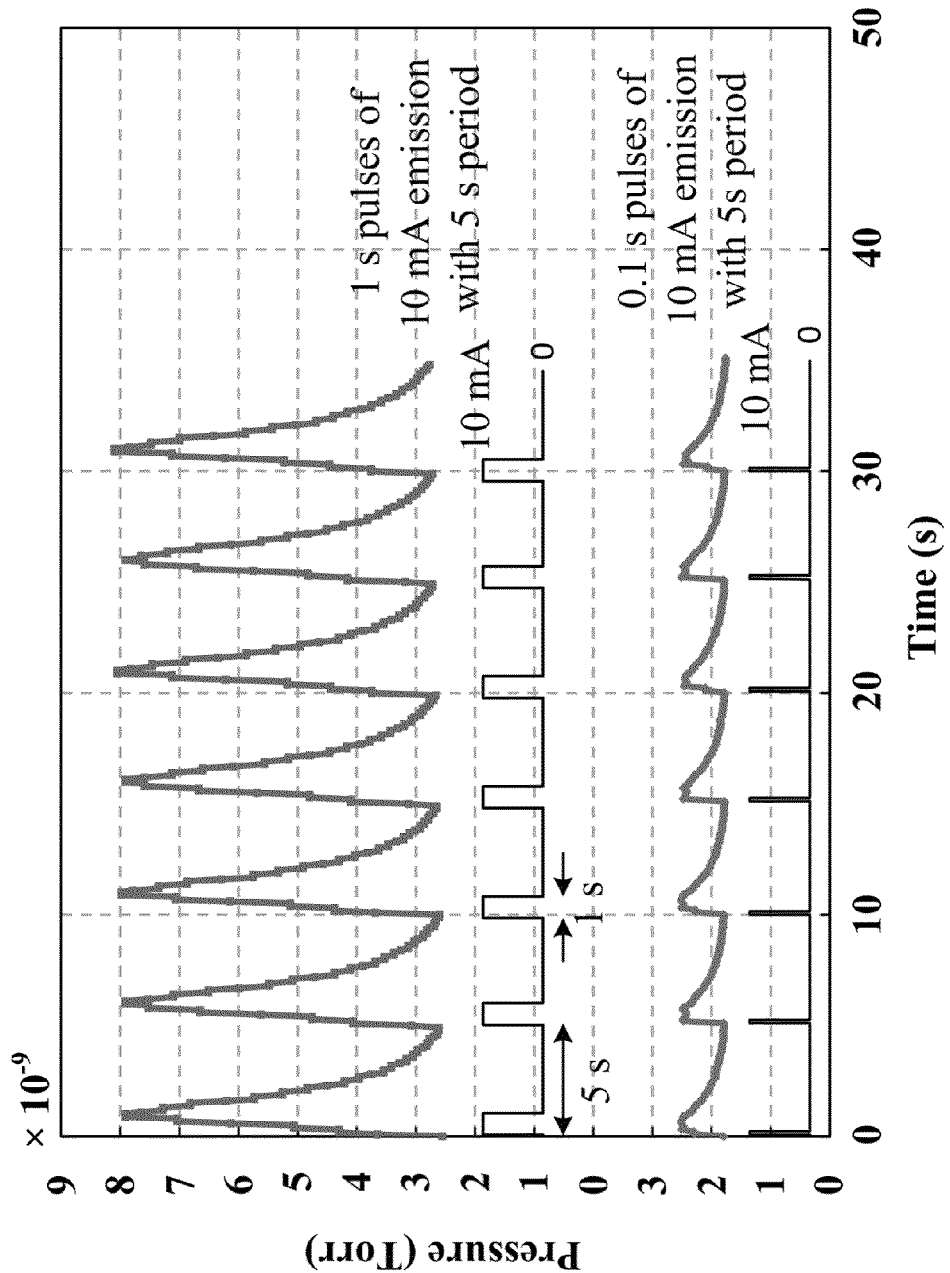
FIG. 26 shows examples of the pressure rise of the measurement chamber due to 10 mA electron emission pulses with different pulse widths, according to principles of the present disclosure.

FIG. 26 shows examples of the pressure rise of the measurement chamber due to 10 mA electron emission pulses with different pulse widths. The plasma events may be initiated by extensive outgassing of the collector, as evidenced by a rise of the chamber pressure even at low emission currents. Extensive outgassing of the anode surfaces occurs at higher emission currents, which can result in plasma strike and can prevent current emission higher than 0.35 A. At low pressures (les than about $10^{-8}$ Torr), long-term operation (greater than about 10 hrs) can improve the emission characteristics and reduce the gate current. Long-term field emission, i.e., greater than about $10^4$ s, in poor vacuum (about $10^{-5}$ Torr in $N_2$) is demonstrated for a constant emission current of 50 μA.

Figure 27:
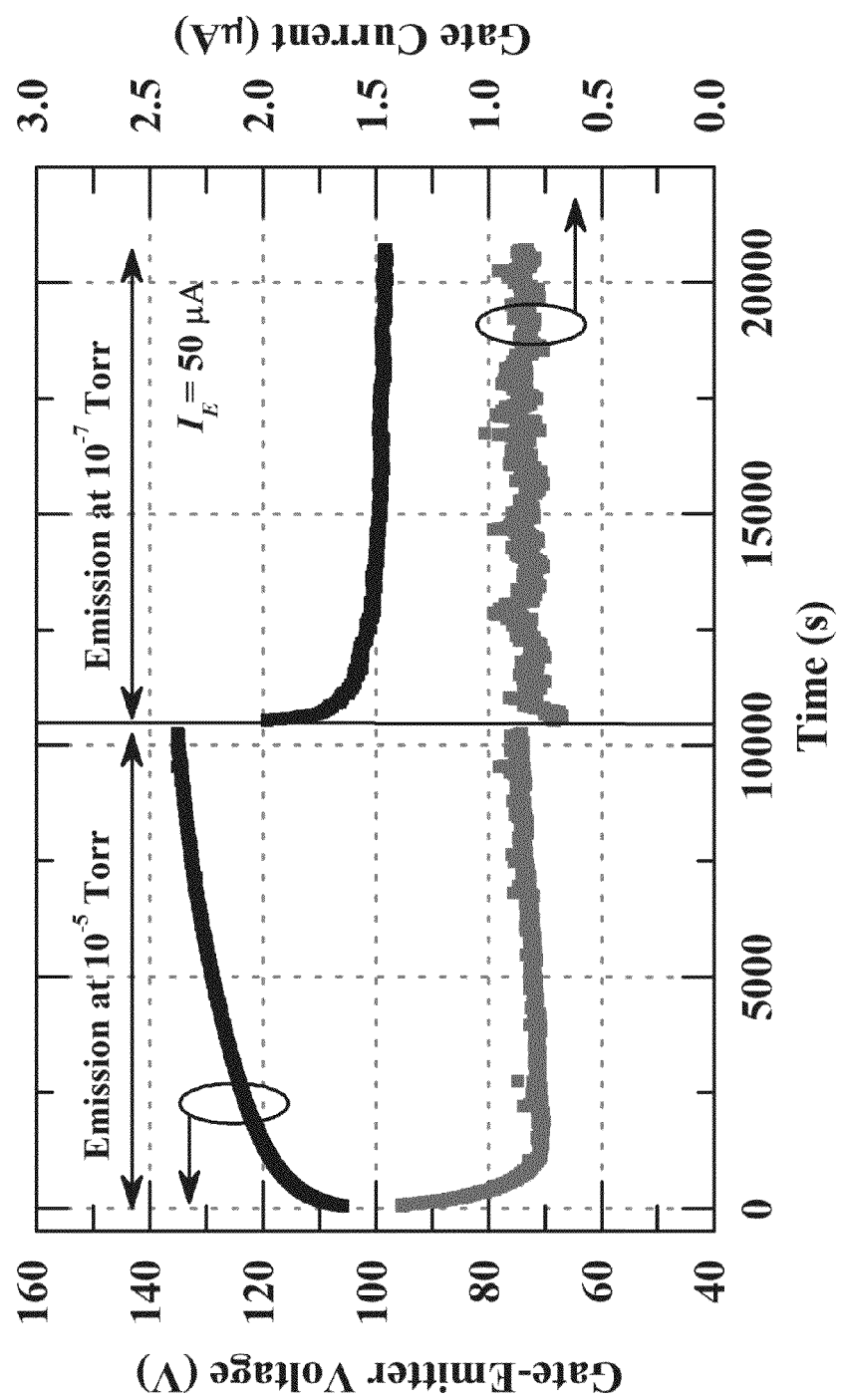
FIG. 27 shows examples of field emission at about $10^{-5}$ Torr pressures, including gate-emitter voltage ($V_{GE}$) and gate current over time for an example device biased at constant emitter current of about 50 µA, according to principles of the present disclosure.

FIG. 27 shows examples of field emission at about $10^{-5}$ Torr pressures, including gate-emitter voltage ($V_{GE}$) and gate current over time for a device biased at constant emitter current of 50 μA. Although the $V_{GE}$ drifts to higher values to maintain a constant current, the original field emission characteristics is restored after operation in high vacuums (~$10^{-7}$ Torr). The $V_{GE}$ quickly returns to initial value after operating the device at about $10^{-7}$ Torr. Variation in field emission characteristics points to reversible adsorption and desorption of particles over the Pt surface. This can be due to reversible adsorption and desorption of particles at the surface of Pt verifying its role in protecting the tips.

Using a non-limiting example implementations of self-aligned gated tip arrays according to the principles described herein, fabricated as an array of 320000 tips in 0.32 cm², emission currents as high as about 0.35 A at current densities of about 1.1 A/cm² are produced at $V_{GE}$ of about 300 V. These emission currents are about double the highest current value. The gate dielectric field is maintained below 150 V/μm to facilitate long-term reliability. Higher emission currents can be possible if the chamber pressure is maintained below about $10^{-8}$ Torr to prevent plasma ignition. At low pressures ($I_E$ of 1 mA), long-term operation (e.g., for greater than about 10 hrs) is possible, with lowered emission voltage and gate current. Further increase in gate dielectric thickness (3-10 μm) can improve device reliability at the higher voltages used for electron emission (about 400V) at current densities above about 10 A/cm². Furthermore, the fabrication methods according to the principles herein can be scaled to generate larger areas, form larger area, high-density arrays, with continuous emission currents, i.e., greater than about 1 A.

As a non-limiting example, the example self-aligned gated tip arrays described herein can be used to form resilient nanostructured high-current low-voltage neutralizers for electric propulsion of small spacecrafts in low Earth orbit. The example self-aligned gated tip arrays can be used to produce propellantless neutralizers that are resilient to oxygen and low vacuum environments. The example devices including the example self-aligned gated tip arrays are formed as Pt-coated field emission arrays (FEAs) that steadily deliver greater than about 1 mA at less than about 120 V and that are capable of continuous operation at pressures of about $5 \times 10^{-6}$ Torr. Such FEAs can be adequate for neutralizing a small-satellite plume in low earth orbit (LEO). The example devices including the example self-aligned gated tip arrays also can be used to produce similar currents at five-fold less voltage and emitting area than existing devices.

Many space propulsion schemes operate based on the conservation of linear momentum. That is, mass is ejected from a portion of the spacecraft to propel the spacecraft in the opposite direction. Electric thrusters are attractive for small satellites since they can achieve higher specific impulse than chemical rockets. Most electric thrusters emit positive ions. Hence, electron sources, i.e., neutralizers, are needed to prevent spacecraft charging, which can greatly reduce fuel efficiency. Field emission neutralizers (FENs) are better suited for small satellites than traditional thermionic and hollow cathodes because of their low power consumption, small size, and not requiring propellant consumption. For operation in LEO, a desirable neutralizer should be able to withstand long-term operation in oxygen environments. Carbon nanotube-based FENs are proposed to satisfy these requirements, however, they can require greater than 600V for 1 mA current emission. Operation at ~100V is demonstrated using AlN-coated FEAs. However, these devices can quickly degrade when exposed to oxygen (~$7 \times 10^{-7}$ Torr), similarly to HfC-coated Si FEAs.

According to an example implementation, the example devices including the example self-aligned gated tip arrays can be used to form nanometer-sharp (e.g., about 10 nm radius) self-aligned gated Pt-coated FEAs that can be operated as FENs for continuous emission of 1 mA at less than about 200 V and long-term operation in low vacuum with oxygen partial pressures as high as about $1 \times 10^{-6}$ Torr.

Figure 28A:
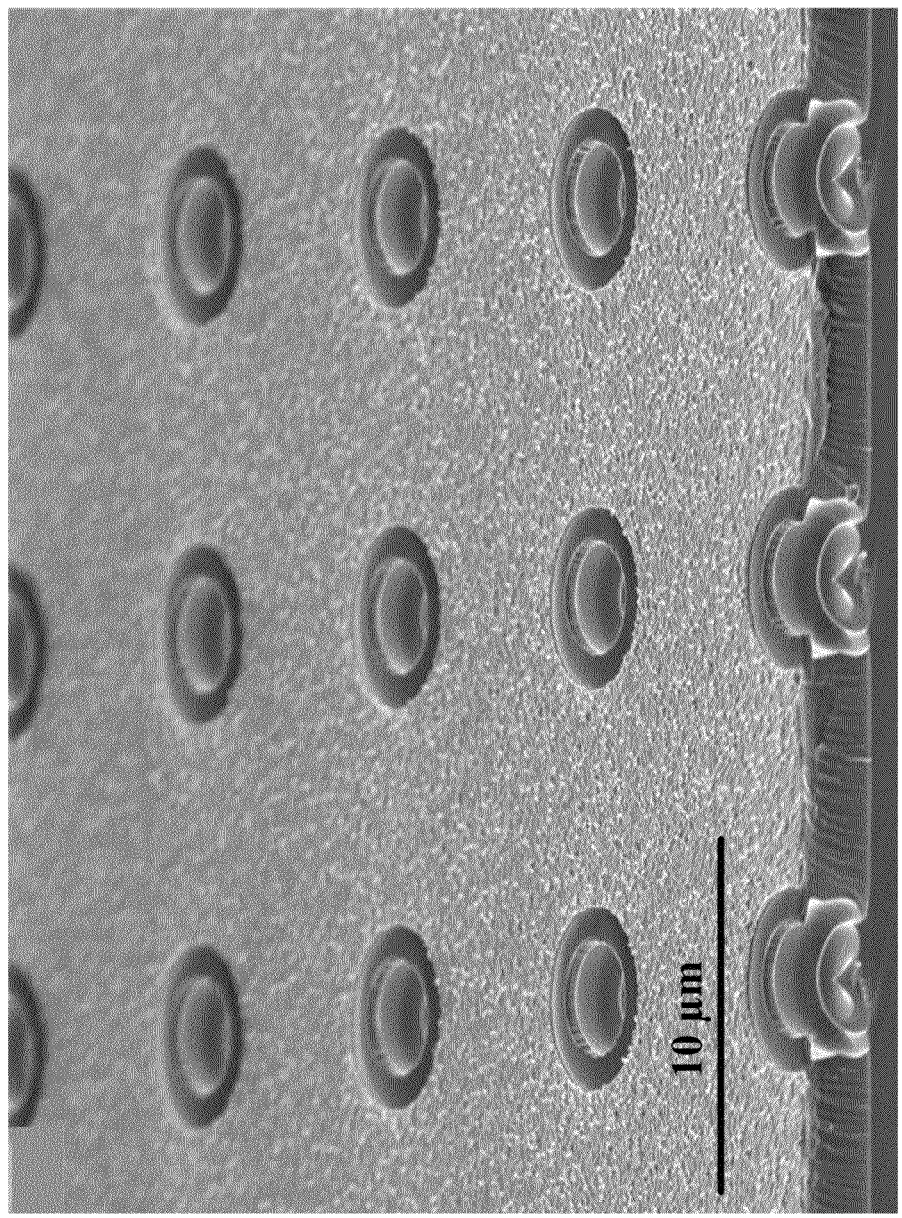
FIG. 28A shows an example SEM image of an example self-aligned gated tip array, according to principles of the present disclosure.

The example systems, methods and apparatus described herein can be used as high-yield fabrication processes to produce massive FEAs for operation as FENs. For example, the example devices including the example self-aligned gated tip arrays can be configured with about 2.5-μm-thick gate dielectrics and about 3 μm gate apertures, to facilitate reliable operation as FENs. FIG. 28A shows a SEM image of an example self-aligned gated tip array according to the principles herein.

Figure 28B:
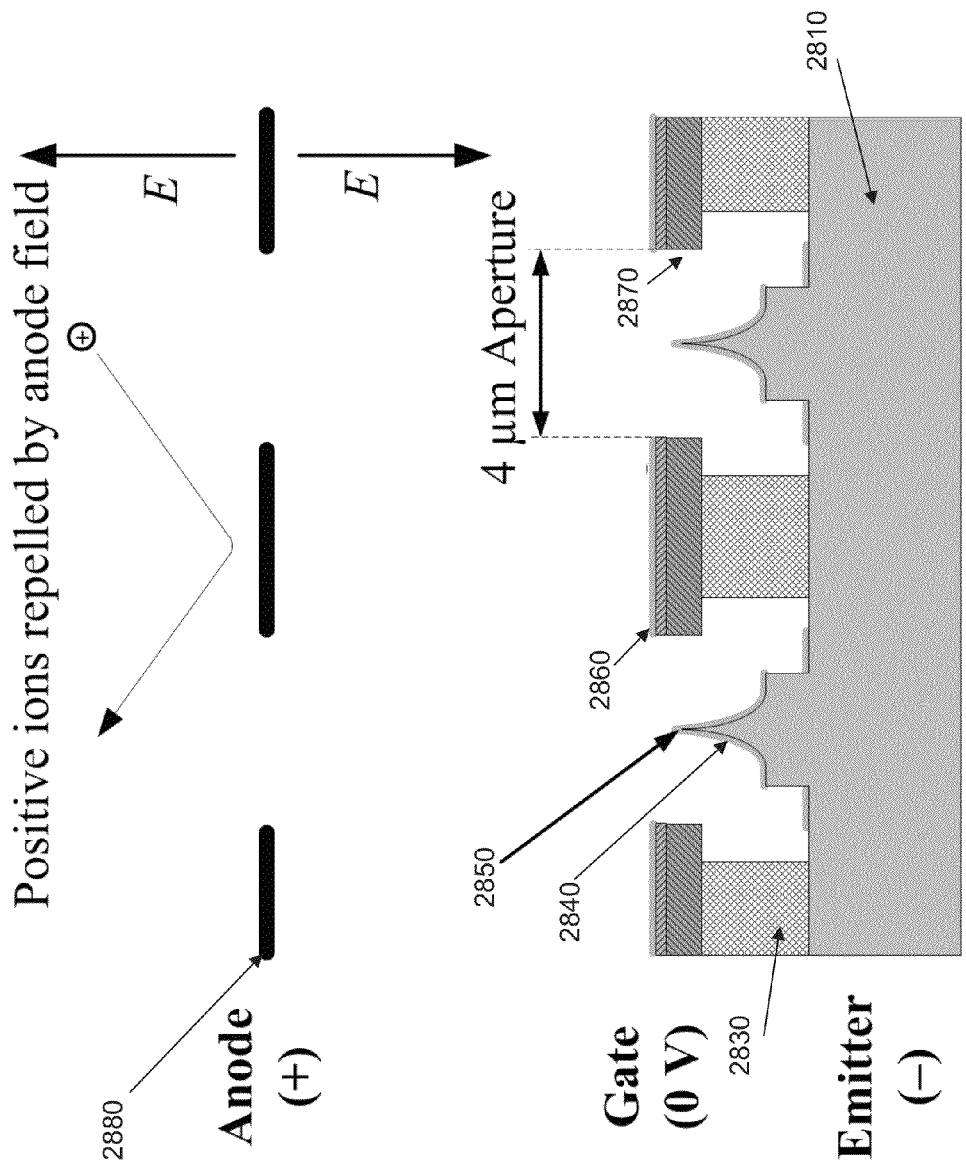
FIG. 28B shows a schematic of an example field emission neutralizer (FEN) formed using the example self-aligned gated tip arrays, according to principles of the present disclosure.

FIG. 28B shows a schematic of an example field emission neutralizer (FEN) formed using the example self-aligned gated tip arrays according to the principles described herein. The example field emission neutralizer includes a base (substrate) 2810, intermediate dielectric layer 2830, emitters 2840 that include tips 2850, a gate electrode 2860 disposed over a gate dielectric 2870, and an anode 2880 disposed opposite the gate electrode 2860. In an example, the base 2810 can be formed from Si, the intermediate dielectric layer 2830 can be formed from $SiO_x$, the gate dielectric 2870 can be formed from $SiN_x$, and the gate electrode can include a coating of an electrically conductive material (such as Pt). In operation, the base 2810 can be maintained at a negative potential, the gate electrode 2860 is maintained at substantially zero potential, and the anode 2880 is maintained at a positive potential. As depicted in FIG. 28B, the positive ione are repelled by the anode field, thereby causing the device to operate as a FEN.

Figure 28C:
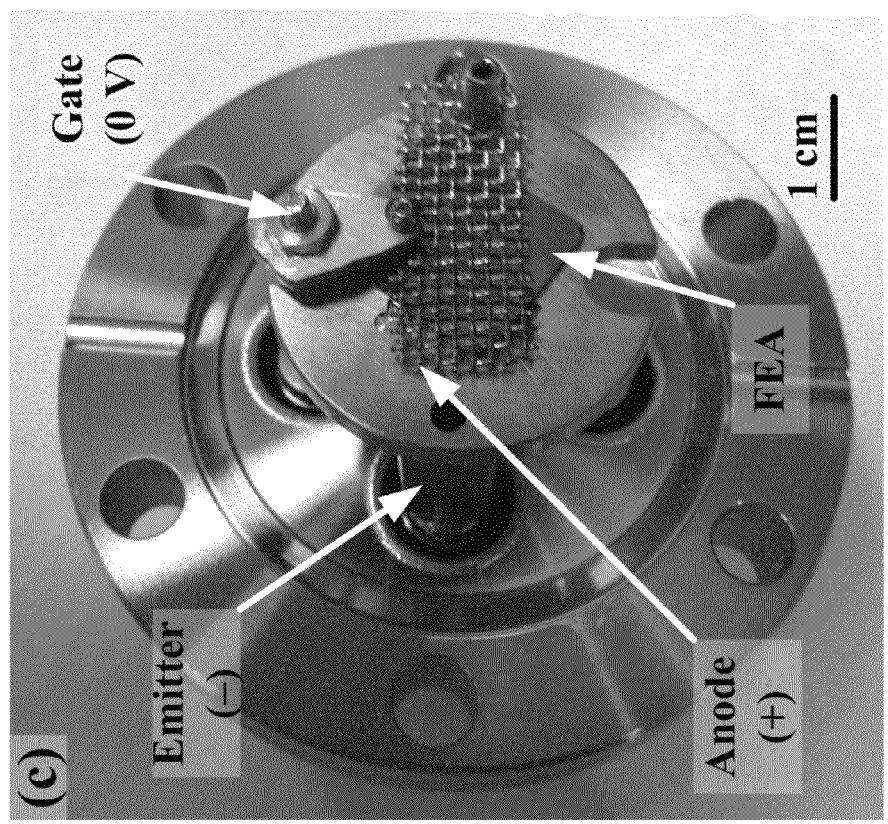
FIG. 28C shows an example measurement setup for a field emission array (FEA) formed using the example self-aligned gated tip arrays, according to principles of the present disclosure.

FIG. 28C shows an example measurement setup for a field emission array (FEA) formed using the example self-aligned gated tip arrays according to the principles described herein. The thick gate dielectric can limit the electric field intensity inside the insulator to about 100 V/μm, facilitating device reliability. Moreover, about a 10-nm-thick Pt film is deposited over the tips to increase their resistance against oxygen and back-streaming ions. The example self-aligned gated tip arrays are operated as FENs in controlled vacuum using an anode metal mesh disposed about 2 mm separation from the gate electrode plane.

Figure 29:
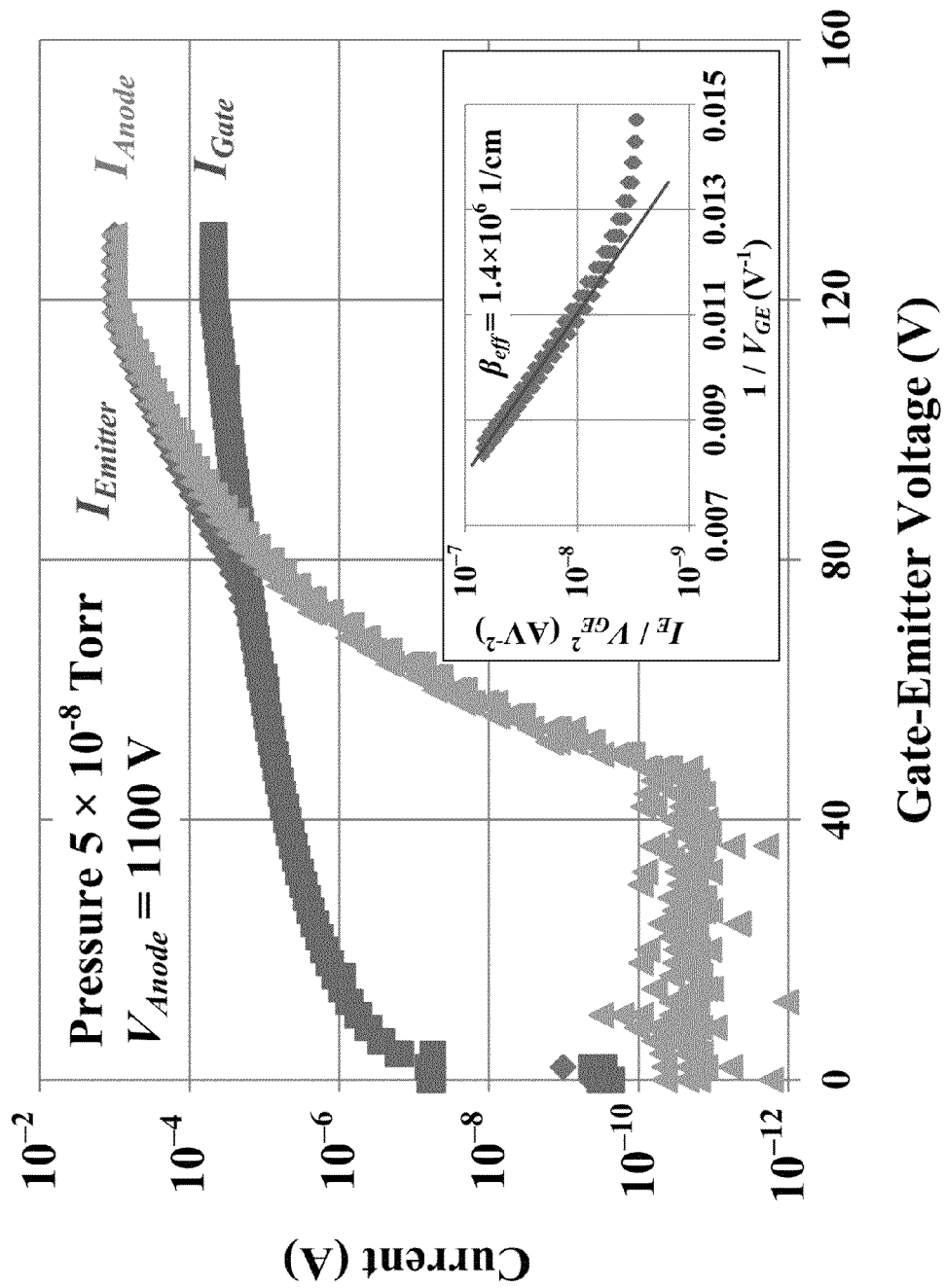
FIG. 29 shows example transfer characteristics of example FENs formed from the example self-aligned gated tip arrays, according to principles of the present disclosure.

FIG. 29 shows example transfer characteristics of example FENs formed from the example self-aligned gated tip arrays. Currents as high as about 1 mA at less than about 120 V are obtained. The inset to FIG. 29 shows the linear Fowler-Nordheim emission behavior, with field factor $\beta > 10^6$. The example FENs operated with less than about 5% gate interception.

Figure 30:
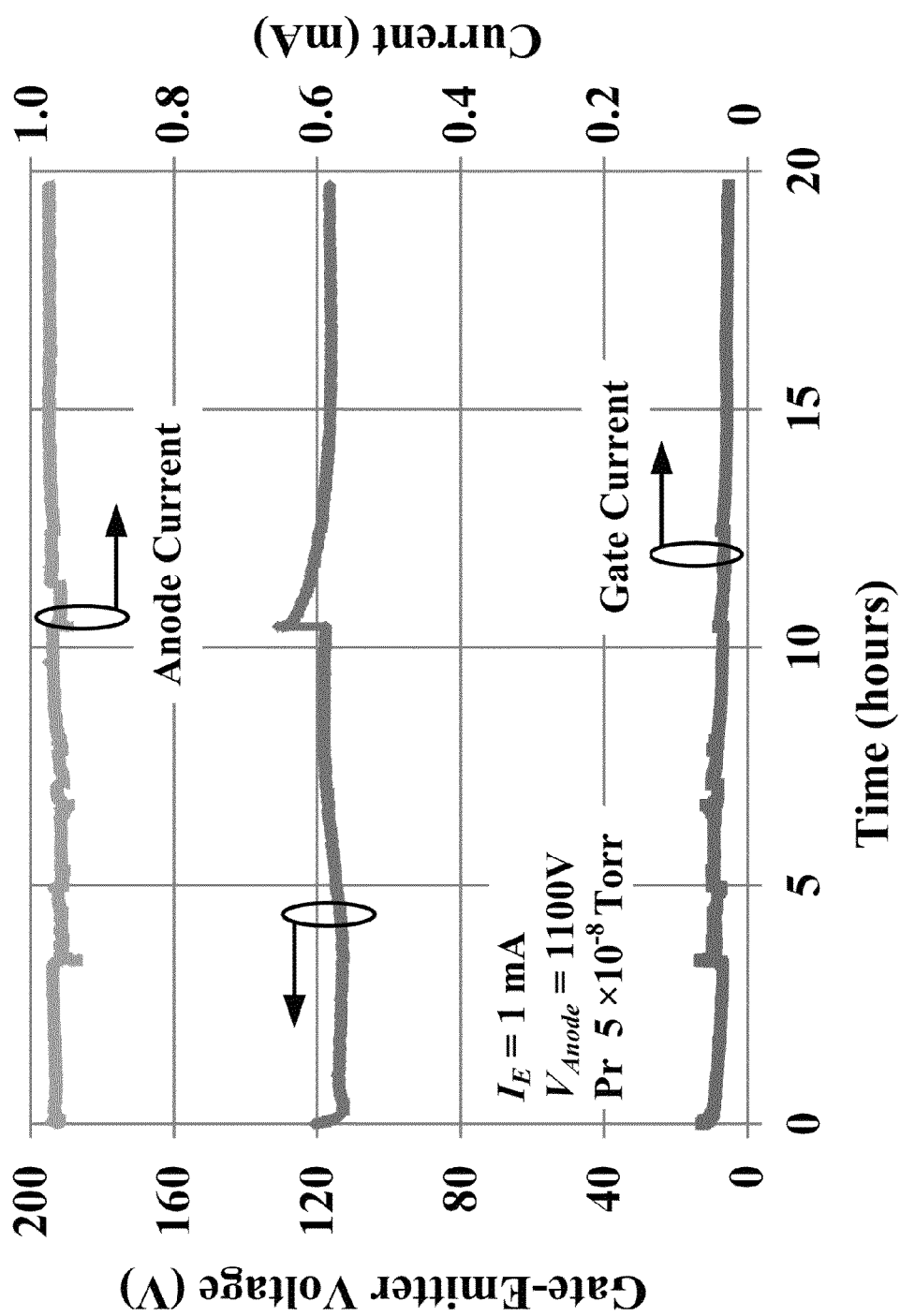
FIG. 30 shows example measurements of long-term FEA characteristics, gate-emitter voltage, anode current, and gate current vs. time for an example device biased at about 1 mA, according to principles of the present disclosure.

FIG. 30 shows example measurements of long-term FEA characteristics, gate-emitter voltage, anode current, and gate current vs. time for an example device biased at about 1 mA. Stable device operation at about 1 mA was demonstrated at about $5 \times 10^{-8}$ Torr for 20 hours. The gate current is generally a very small fraction of the emitted current.

Figure 31:
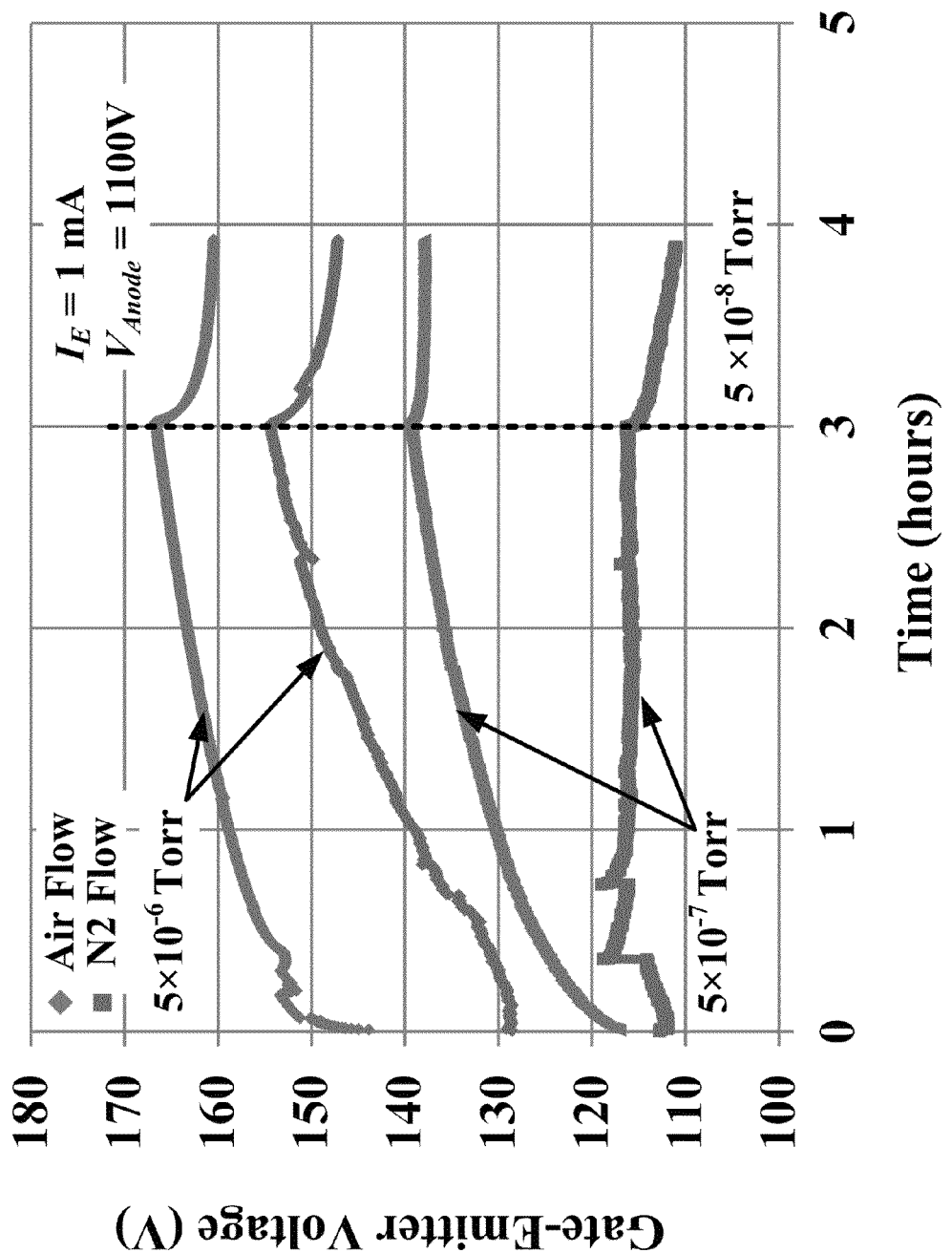
FIG. 31 shows example measurements of field emission at about $5 \times 10^{-6}$ and about $5 \times 10^{-7}$ Torr in both $N_2$ and air atmospheres, according to principles of the present disclosure.

FIG. 31 shows example measurements of field emission at about $5 \times 10^{-6}$ and about $5 \times 10^{-7}$ Torr in both $N_2$ and air atmospheres. The gate-emitter voltage ($V_{GE}$) variation over time is measured for devices operated at about $5 \times 10^{-7}$ and $5 \times 10^{-6}$ Torr in both $N_2$ and air atmospheres (FIG. 4). The device degradation is reversible after operation in $N_2$ at about $5 \times 10^{-7}$ Torr. Less than about 10 V increase in $V_{GE}$ is sufficient to maintain about 1 mA current for about 3 hours in $N_2$ at about $5 \times 10^{-7}$ Torr. The initial device characteristics are restored by operation of the device in high vacuum. Degradation in air or at higher pressures in $N_2$ may be faster and may not be fully reversible. This could be due to tip damage by ion bombardment and could be mitigated by reducing the mesh voltage.

Figure 32:
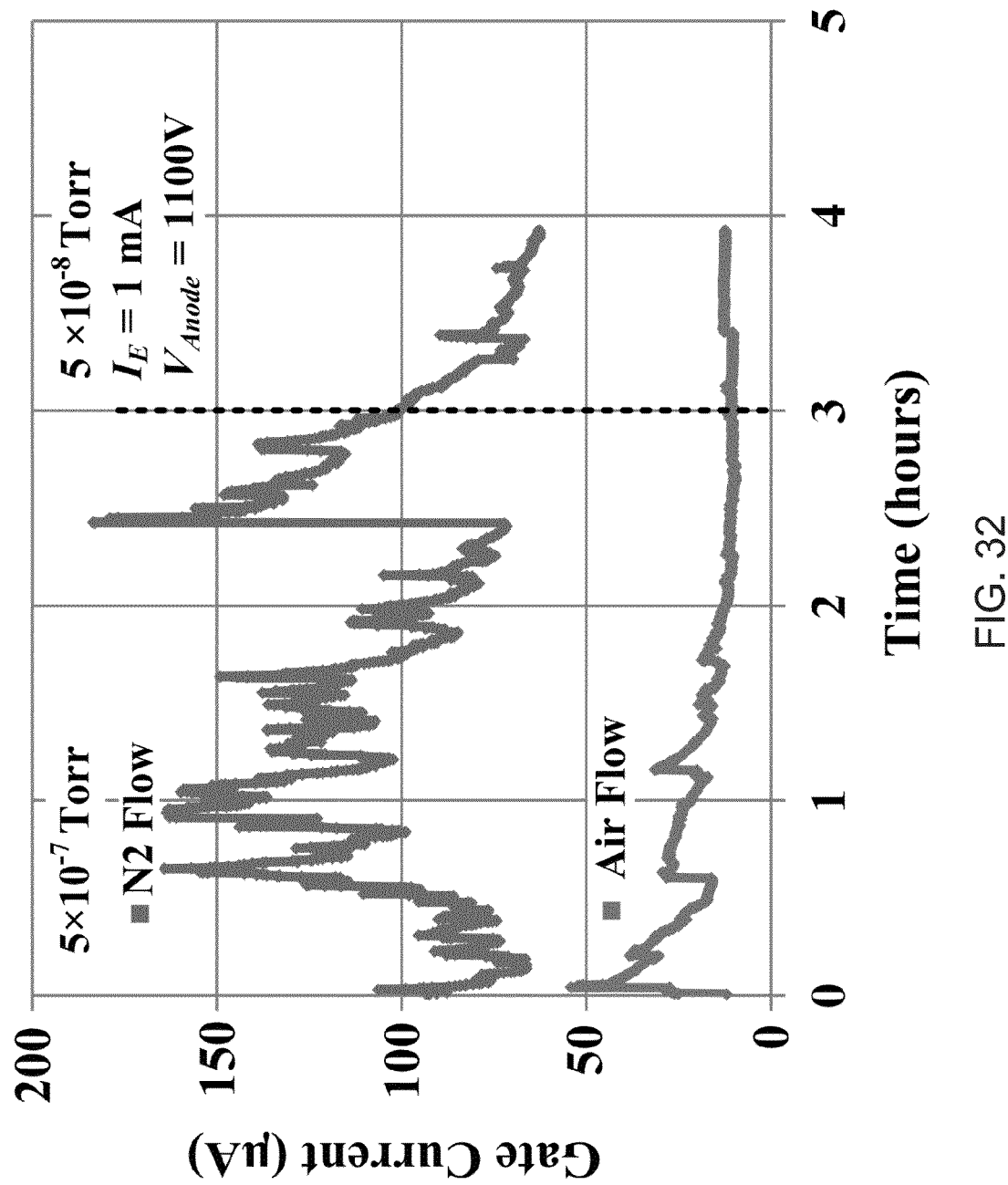
FIG. 32 shows example measurements of the variation of gate current vs. time during operation of an example FEN in $N_2$ and air at about $5 \times 10^{-6}$ Torr, according to principles of the present disclosure.

FIG. 32 shows example measurements of variation of gate current vs. time during operation of an example FEN in $N_2$ and air at about $5 \times 10^{-6}$ Torr. As shown in FIG. 32, the gate current has higher fluctuation in $N_2$, which can be explained by passivation of gate dielectric sidewalls by $O_2$. The gate current is lower and more stable in air, possibly due to gate sidewall passivation by $O_2$. Degradation rates appear to saturate, suggesting that example FENs formed from the example self-aligned gated tip arrays can be configured for long-term operation at less than about 250V.

Conclusion

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments of the invention can be implemented in any of numerous ways. For example, some embodiments may be implemented using hardware, software or a combination thereof. When any aspect of an embodiment is implemented at least in part in software, the software code can be executed on any suitable processor or collection of processors, whether provided in a single computer or distributed among multiple computers.

In this respect, various aspects of the invention may be embodied at least in part as a computer readable storage medium (or multiple computer readable storage media) (e.g., a computer memory, one or more floppy disks, compact disks, optical disks, magnetic tapes, flash memories, circuit configurations in Field Programmable Gate Arrays or other semiconductor devices, or other tangible computer storage medium or non-transitory medium) encoded with one or more programs that, when executed on one or more computers or other processors, perform methods that implement the various embodiments of the technology discussed above. The computer readable medium or media can be transportable, such that the program or programs stored thereon can be loaded onto one or more different computers or other processors to implement various aspects of the present technology as discussed above.

The terms "program" or "software" are used herein in a generic sense to refer to any type of computer code or set of computer-executable instructions that can be employed to program a computer or other processor to implement various aspects of the present technology as discussed above. Additionally, it should be appreciated that according to one aspect of this embodiment, one or more computer programs that when executed perform methods of the present technology need not reside on a single computer or processor, but may be distributed in a modular fashion amongst a number of different computers or processors to implement various aspects of the present technology.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, the technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A method for forming a self-aligned gated emitter cell, comprising:
   providing a multilayer structure, comprising:
     a substrate;
     an intermediate layer comprising a dielectric material disposed over at least a portion of the substrate; and
     at least one gate electrode layer disposed over at least a portion of the intermediate layer;
   using a first lithography process to define a via at a portion of the at least one gate electrode layer;
   forming the via through the at least one gate electrode layer, the via having a first lateral dimension in a plane of the gate electrode layer;
   using at least a second lithography process to define:
     a gate aperture at a portion of the at least one gate electrode layer, such that the gate aperture encompasses the via and has a second lateral dimension that is larger than the first lateral dimension; and
     an etch barrier that is concentric with the gate aperture and has a third lateral dimension that is smaller than the first lateral dimension; and
   using at least one etching process to etch at least a portion of the gate electrode layer to form the gate aperture and the etch barrier, and to etch at least a portion of the intermediate layer to form an emitter structure. at least partially surrounded by a trench, the multilayer structure, such that a tip of the emitter structure is formed proximate to a center of the etch barrier.

2. The method of claim 1, wherein the substrate comprises a semiconductor, a III-V compound, a metal, or a dielectric material.

3. The method of claim 1, wherein the substrate comprises silicon, germanium, gallium arsenide, gallium nitride, silicon carbide, an oxide of silicon, or a transition metal oxide.

4. The method of claim 1, wherein the intermediate layer comprises at least one post structure at least partially surrounded by the dielectric material, and wherein the at least the second lithography process defines the etch barrier at a portion of the intermediate layer proximate to the at least one post structure.

5. The method of claim 4, wherein the at least one etching process to etch the at least the portion of the intermediate layer comprises etching at least a portion of the at least one post structure, wherein the etched at least one post structure forms the emitter structure having a tip positioned proximate to the center of the etch barrier.

6. The method of claim 4, wherein the post structure has a fourth lateral dimension in the plane of the gate electrode layer that is larger than the third lateral dimension, and wherein the at least the second lithography process defines the etch barrier such that the etch barrier at least partially overlaps with the post structure.

7. The method of claim 4, wherein the at least one post structure and the substrate are formed from a same material.

8. The method of claim 1, further comprising, prior to using the at least one etching process to etch the at least the portion of the intermediate layer proximate to the gate aperture, disposing a mask proximate to the gate electrode layer, wherein the mask includes an opening of a size that approximates the second lateral dimension, and wherein the mask is maintained in position during the etch of the at least the portion of the intermediate layer.

9. The method of claim 8, wherein the intermediate layer comprises at least one post structure at least partially surrounded by the dielectric material, wherein the at least one post structure has a principal dimension in the plane of the gate electrode layer that is larger than the third lateral dimension and smaller than the second lateral dimension, and wherein the mask is positioned such that the opening encompasses the at least one post structure.

10. The method of claim 1, wherein the gate electrode layer is electrically conductive and comprises at least one layer of an electrically conductive material, and wherein the electrically conductive material comprises carbon, aluminum, silicon, germanium, gallium, indium, tin, a transition metal, a conductive metal oxide, or any combination thereof.

11. The method of claim 10, wherein the transition metal is gold, platinum copper, tantalum, tungsten, titanium, cobalt, chromium, silver, or nickel, or a binary or ternary combination thereof.

12. The method of claim 1, wherein the gate electrode layer is electrically non-conductive and comprises at least one dielectric layer disposed over the intermediate layer.

13. The method of claim 12, wherein the at least one dielectric layer comprises silicon nitride.

14. The method of claim 1, wherein the dielectric material comprises an oxide or a nitride of aluminum, silicon, germanium, gallium, indium, tin, antimony, tellurium, bismuth, titanium, vanadium, chromium, manganese, cobalt, nickel, copper, zinc, zirconium, niobium, molybdenum, palladium, cadmium, hafnium, tantalum, or tungsten, or any combination thereof.

15. The method of claim 1, further comprising depositing an electrically conductive coating over portions of the gate electrode layer and/or over portions of the emitter structure.

16. At least one self-aligned gated emitter cell fabricated according to the method of any of claims 1-15.

17. A self-aligned gated emitter array comprising a plurality of the self-aligned gated emitter cells of claim 16.

18. A method for forming a self-aligned gated emitter cell, comprising:
providing a multilayer structure, comprising:
a substrate;
an intermediate layer comprising:
a dielectric material disposed over at least a portion of the substrate; and
at least one post structure at least partially surrounded by the dielectric material; and
at least one gate electrode layer disposed over at least a portion of the intermediate layer,
wherein the at least one post structure has a principal dimension in a plane of the gate electrode layer;
using a first lithography process to define a via at a portion of the at least one gate electrode layer that overlaps a portion of the at least one post structure;
forming a via through the at least one gate electrode layer, the via having a first lateral dimension that approximates the principal dimension;
using at least a second lithography process to define:
a gate aperture at a portion of the at least one gate electrode layer, such that the gate aperture encompasses the via and has a second lateral dimension that is larger than the principal dimension; and
an etch barrier that overlaps the at least one post structure, such that the etch barrier is concentric with the gate aperture and has a third lateral dimension that is smaller than the principal dimension; and
using at least one etching process to etch at least a portion of the gate electrode layer to form the gate aperture and the etch barrier, and to etch at least a portion of the intermediate layer to form an emitter structure, at least partially surrounded by a trench, in the multilayer structure, such that a tip of the emitter structure is formed proximate to a center of the etch barrier.

19. The method of claim 18, wherein the gate electrode layer is electrically conductive or electrically non-conductive.

20. The method of claim 18, wherein the gate electrode layer comprises at least one dielectric layer, and wherein the at least one dielectric layer comprises an oxide or a nitride of aluminum, silicon, germanium, gallium, indium, tin, antimony, tellurium, bismuth, titanium, vanadium, chromium, manganese, cobalt, nickel, copper, zinc, zirconium, niobium, molybdenum, palladium, cadmium, hafnium, tantalum, or tungsten, or any combination thereof.

21. The method of claim 18, wherein the gate electrode layer comprises at least one layer of an electrically conductive material, and wherein the electrically conductive material comprises carbon, aluminum, silicon, germanium, gallium, indium, tin, a transition metal, a conductive metal oxide, or any combination thereof.

22. A method for forming a self-aligned gated emitter cell, comprising:
providing a multilayer structure, comprising:
a substrate;
an intermediate layer comprising:
a dielectric material disposed over at least a portion of the substrate; and
at least one post structure at least partially surrounded by the dielectric material; and
at least one gate electrode layer disposed over at least a portion of the intermediate layer,
wherein the at least one post structure has a principal dimension in a plane of the gate electrode layer;
using at least one lithography process to define:
a gate aperture at a portion of the at least one gate electrode layer that overlaps a portion of the at least one post structure, such that the gate aperture has a first lateral dimension that is larger than the principal dimension; and
an etch barrier that overlaps the at least one post structure, such that the etch barrier is concentric with the gate aperture and has a second lateral dimension that is smaller than the principal dimension; and
using at least one etching process to etch at least a portion of the gate electrode layer to form the gate aperture and the etch barrier, and to etch at least a portion of the intermediate layer to form an emitter structure, at least partially surrounded by a trench, in the multilayer structure, such that a tip of the emitter structure is formed proximate to a center of the etch barrier.

23. The method of claim 22, wherein the gate electrode layer is electrically conductive or electrically non-conductive.

24. The method of claim 22, wherein the gate electrode layer comprises at least one dielectric layer, and wherein the at least one dielectric layer comprises an oxide or a nitride of aluminum, silicon, germanium, gallium, indium, tin, antimony, tellurium, bismuth, titanium, vanadium, chromium, manganese, cobalt, nickel, copper, zinc, zirconium, niobium, molybdenum, palladium, cadmium, hafnium, tantalum, or tungsten, or any combination thereof.

25. The method of claim 22, wherein the gate electrode layer comprises at least one layer of an electrically conductive material, and wherein the electrically conductive material comprises carbon, aluminum, silicon, germanium, gallium, indium, tin, a transition metal, a conductive metal oxide, or any combination thereof.

26. The method of claim 22, wherein the emitter structure and the substrate are formed from a same material, and wherein the substrate comprises a semiconductor, a III-V compound, a metal, or a dielectric material.

27. At least one self-aligned gated emitter cell fabricated according to the method of claim 22.

* * * * *